(12) United States Patent
Lin et al.

(10) Patent No.: US 8,749,021 B2
(45) Date of Patent: Jun. 10, 2014

(54) VOLTAGE REGULATOR INTEGRATED WITH SEMICONDUCTOR CHIP

(75) Inventors: Mou-Shiung Lin, Hsin-Chu (TW);
Gu-Yeon Wei, Cambridge, MA (US)

(73) Assignee: Megit Acquisition Corp., San Diego, CA (US)

( * ) Notice: Subject to any disclaimer, the term of this patent is extended or adjusted under 35 U.S.C. 154(b) by 1163 days.

(21) Appl. No.: 11/964,015

(22) Filed: Dec. 25, 2007

(65) Prior Publication Data
US 2008/0150623 A1   Jun. 26, 2008

Related U.S. Application Data

(60) Provisional application No. 60/871,837, filed on Dec. 26, 2006.

(51) Int. Cl.
| | | |
|---|---|---|
| H01L 27/08 | (2006.01) | |
| H01L 27/11 | (2006.01) | |
| H01L 29/00 | (2006.01) | |
| H01L 23/58 | (2006.01) | |
| H01L 23/48 | (2006.01) | |
| H01L 23/52 | (2006.01) | |
| H01L 29/40 | (2006.01) | |

(52) U.S. Cl.
USPC ........... 257/531; 257/379; 257/516; 257/528; 257/649; 257/738; 257/E27.033

(58) Field of Classification Search
None
See application file for complete search history.

(56) References Cited

U.S. PATENT DOCUMENTS

| | | | |
|---|---|---|---|
| 4,021,838 A | 5/1977 | Warwick | |
| 4,685,998 A | 8/1987 | Quinn et al. | |
| 5,055,907 A | 10/1991 | Jacobs | |
| 5,095,357 A | 3/1992 | Andoh et al. | |
| 5,095,402 A | 3/1992 | Hernandez et al. | |

(Continued)

FOREIGN PATENT DOCUMENTS

| | | |
|---|---|---|
| EP | 0986106 | 3/2000 |
| EP | 0986106 A1 | 3/2000 |

(Continued)

OTHER PUBLICATIONS

Chiou et al. Electromigration in Sputtered Copper Interconnection with Polyimide as Interlevel Dielectric or Passivation. May 21, 2000. Electronic Components and Technology Conference, 2000. 2000 Proceedings. 50th. pp. 1686-1689.*

(Continued)

*Primary Examiner* — Hoang-Quan Ho
(74) *Attorney, Agent, or Firm* — Seyfarth Shaw LLP

(57) ABSTRACT

The present invention reveals a semiconductor chip structure and its application circuit network, wherein the switching voltage regulator or converter is integrated with a semiconductor chip by chip fabrication methods, so that the semiconductor chip has the ability to regulate voltage within a specific voltage range. Therefore, when many electrical devices of different working voltages are placed on a Printed Circuit Board (PCB), only a certain number of semiconductor chips need to be constructed. Originally, in order to account for the different demands in voltage, power supply units of different output voltages, or a variety of voltage regulators need to be added. However, using the built-in voltage regulator or converter, the voltage range can be immediately adjusted to that which is needed. This improvement allows for easier control of electrical devices of different working voltages and decreases response time of electrical devices.

20 Claims, 76 Drawing Sheets

(56) References Cited

U.S. PATENT DOCUMENTS

| | | | |
|---|---|---|---|
| 5,106,461 A | 4/1992 | Volfson et al. | |
| 5,108,950 A | 4/1992 | Wakabayashi et al. | |
| 5,212,403 A | 5/1993 | Nakanishi et al. | |
| 5,226,232 A | 7/1993 | Boyd | |
| 5,227,012 A | 7/1993 | Brandli et al. | |
| 5,346,858 A | 9/1994 | Thomas et al. | |
| 5,370,766 A | 12/1994 | Desaigoudar et al. | |
| 5,372,967 A | 12/1994 | Sundaram et al. | |
| 5,384,274 A | 1/1995 | Kanehachi | |
| 5,416,356 A | 5/1995 | Staudinger et al. | |
| 5,465,879 A | 11/1995 | La et al. | |
| 5,478,773 A | 12/1995 | Dow et al. | |
| 5,501,006 A | 3/1996 | Gehman, Jr. et al. | |
| 5,576,680 A | 11/1996 | Ling | |
| 5,629,240 A * | 5/1997 | Malladi et al. | 438/106 |
| 5,635,767 A | 6/1997 | Wenzel et al. | |
| 5,656,849 A | 8/1997 | Burghartz et al. | |
| 5,686,764 A | 11/1997 | Fulcher | |
| 5,763,108 A | 6/1998 | Chang et al. | |
| 5,789,303 A | 8/1998 | Leung et al. | |
| 5,874,770 A | 2/1999 | Saia et al. | |
| 5,883,422 A | 3/1999 | Anand et al. | |
| 5,884,990 A | 3/1999 | Burghartz et al. | |
| 5,929,508 A | 7/1999 | Delgado et al. | |
| 6,002,161 A | 12/1999 | Yamazaki | |
| 6,008,102 A | 12/1999 | Alford et al. | |
| 6,025,261 A | 2/2000 | Farrar et al. | |
| 6,030,877 A | 2/2000 | Lee et al. | |
| 6,031,445 A | 2/2000 | Marty et al. | |
| 6,040,226 A | 3/2000 | Wojnarowski et al. | |
| 6,051,489 A | 4/2000 | Young et al. | |
| 6,133,079 A | 10/2000 | Zhu et al. | |
| 6,146,958 A | 11/2000 | Zhao et al. | |
| 6,180,445 B1 | 1/2001 | Tsai | |
| 6,184,143 B1 | 2/2001 | Ohashi et al. | |
| 6,184,574 B1 | 2/2001 | Bissey | |
| 6,191,468 B1 | 2/2001 | Forbes et al. | |
| 6,221,727 B1 | 4/2001 | Chan et al. | |
| 6,236,101 B1 | 5/2001 | Erdeljac et al. | |
| 6,255,714 B1 | 7/2001 | Kossives et al. | |
| 6,267,290 B1 | 7/2001 | Murdeshwar | |
| 6,272,736 B1 | 8/2001 | Lee | |
| 6,278,264 B1 | 8/2001 | Burstein et al. | |
| 6,287,931 B1 | 9/2001 | Chen | |
| 6,288,447 B1 | 9/2001 | Amishiro et al. | |
| 6,291,980 B1 | 9/2001 | Aliahmad et al. | |
| 6,303,423 B1 | 10/2001 | Lin | |
| 6,365,498 B1 | 4/2002 | Chu et al. | |
| 6,383,916 B1 | 5/2002 | Lin | |
| 6,420,773 B1 | 7/2002 | Liou | |
| 6,424,034 B1 | 7/2002 | Ahn et al. | |
| 6,429,764 B1 | 8/2002 | Karam et al. | |
| 6,440,750 B1 | 8/2002 | Feygenson et al. | |
| 6,441,715 B1 | 8/2002 | Johnson | |
| 6,451,681 B1 | 9/2002 | Greer | |
| 6,455,885 B1 | 9/2002 | Lin | |
| 6,456,183 B1 | 9/2002 | Basteres et al. | |
| 6,459,135 B1 | 10/2002 | Basteres et al. | |
| 6,461,895 B1 | 10/2002 | Liang et al. | |
| 6,478,773 B1 | 11/2002 | Gandhi et al. | |
| 6,495,442 B1 | 12/2002 | Lin et al. | |
| 6,501,169 B1 | 12/2002 | Aoki et al. | |
| 6,504,227 B1 | 1/2003 | Matsuo et al. | |
| 6,504,236 B2 | 1/2003 | Bissey | |
| 6,515,369 B1 | 2/2003 | Lin | |
| 6,518,165 B1 | 2/2003 | Yoon et al. | |
| 6,544,880 B1 | 4/2003 | Akram | |
| 6,545,354 B1 | 4/2003 | Aoki et al. | |
| 6,559,409 B1 | 5/2003 | Cadet | |
| 6,559,528 B2 | 5/2003 | Watase et al. | |
| 6,566,731 B2 | 5/2003 | Ahn et al. | |
| 6,573,818 B1 | 6/2003 | Klemmer et al. | |
| 6,624,498 B2 | 9/2003 | Filas et al. | |
| 6,636,139 B2 | 10/2003 | Tsai et al. | |
| 6,638,844 B1 | 10/2003 | Verma et al. | |
| 6,674,131 B2 | 1/2004 | Yokogawa et al. | |
| 6,696,744 B2 | 2/2004 | Feygenson et al. | |
| 6,716,693 B1 | 4/2004 | Chan et al. | |
| 6,734,563 B2 | 5/2004 | Lin et al. | |
| 6,746,898 B2 | 6/2004 | Lin et al. | |
| 6,756,664 B2 | 6/2004 | Yang | |
| 6,759,275 B1 | 7/2004 | Lee et al. | |
| 6,800,534 B2 | 10/2004 | Hsieh | |
| 6,847,066 B2 | 1/2005 | Tahara et al. | |
| 6,852,616 B2 | 2/2005 | Sahara et al. | |
| 6,869,870 B2 | 3/2005 | Lin | |
| 6,903,459 B2 | 6/2005 | Nakatani | |
| 6,914,331 B2 | 7/2005 | Shimoishizaka et al. | |
| 6,921,980 B2 | 7/2005 | Nakanishi et al. | |
| 7,012,339 B2 | 3/2006 | Terui | |
| 7,268,410 B1 * | 9/2007 | Hopper et al. | 257/531 |
| 7,468,545 B2 * | 12/2008 | Lin et al. | 257/622 |
| 8,368,150 B2 * | 2/2013 | Lin | 257/379 |
| 2001/0019168 A1 | 9/2001 | Willer et al. | |
| 2001/0028098 A1 | 10/2001 | Liou | |
| 2002/0008301 A1 | 1/2002 | Liou et al. | |
| 2002/0017730 A1 | 2/2002 | Tahara et al. | |
| 2002/0050626 A1 | 5/2002 | Onuma et al. | |
| 2003/0038331 A1 | 2/2003 | Aoki et al. | |
| 2003/0076209 A1 | 4/2003 | Tsai et al. | |
| 2003/0102551 A1 | 6/2003 | Kikuchi | |
| 2003/0119299 A1 * | 6/2003 | Jiang et al. | 438/612 |
| 2003/0124835 A1 | 7/2003 | Lin et al. | |
| 2003/0222295 A1 | 12/2003 | Lin | |
| 2003/0224613 A1 | 12/2003 | Ramanathan et al. | |
| 2004/0094841 A1 | 5/2004 | Matsuzaki et al. | |
| 2004/0104456 A1 * | 6/2004 | Duffy et al. | 257/666 |
| 2004/0159894 A1 | 8/2004 | Blisson et al. | |
| 2004/0245580 A1 | 12/2004 | Lin | |
| 2005/0017361 A1 | 1/2005 | Lin et al. | |
| 2006/0049524 A1 | 3/2006 | Lin et al. | |
| 2006/0049525 A1 | 3/2006 | Lin et al. | |
| 2006/0291029 A1 * | 12/2006 | Lin et al. | 359/224 |
| 2007/0069347 A1 | 3/2007 | Lin et al. | |
| 2007/0108584 A1 * | 5/2007 | Fluhr et al. | 257/690 |
| 2007/0114651 A1 * | 5/2007 | Marimuthu et al. | 257/690 |
| 2008/0081458 A1 | 4/2008 | Lin et al. | |
| 2008/0266922 A1 | 10/2008 | Mumtaz et al. | |

FOREIGN PATENT DOCUMENTS

| | | |
|---|---|---|
| EP | 0999580 | 5/2000 |
| EP | 0999580 A2 | 5/2000 |
| EP | 1039544 | 9/2000 |
| EP | 1039544 A1 | 9/2000 |
| JP | 403019358 | 1/1991 |
| JP | 2000-022085 | 2/2000 |

OTHER PUBLICATIONS

Co-pending US Patent MEF 02-014, filed May 27, 2004, U.S. Appl. No. 10/855,086, assigned to the same assignee.

Spiral Inductors and Transmission Lines in Silicon Technology using Copper-Damoscene Inter connects and Low-Loss Substrates, by Joachim N. Burghartz et al., XP-000104848 IEEE 1997, Theary and Techniques, vol. 45, No. 10, Oct. 1997, pp. 1961-1968.

The Effects of a Ground Shield on Spiral Inductors Fabricated in a Silicon Bipolar Technology, IEEE Berm 9.1 by seang—moyiun et al., pp. 157-160, 2000IEEE.

Spiral Inductors and Transmission Lines in Silicon Technology using Copper-Damoscene Inter connects and Low-Loss Substrates, bu Joachim N. Burghartz et al., XP-000/04848 IEEE 1997, Therapy and Technigues, vol. 45, No. 10, Oct. 1997, pp. 1961-1968.

Burghartz J N et al. "Spiral Inductors and Transmission Lines in Silicon Technology Using Copper-Damascene Interconnects and Low-Loss Substrates" IEEE Inc. New York, US, vol. 45, No. 10, Part 2, Oct. 1997, pp. 1961-1968, XP000704848 ISSN: 0018-9480.

Patent Abstracts of Japan vol. 2000, No. 04, Aug. 31, 2000 & JP 2000 022085 A (Toshiba Corp), Jan. 21, 2000.

Soong-Mo Yim et al. "The effects of a ground shield on spiral inductors fabricated in a silicon bipolar technology" Bipolar/Bicmos Circuits and Technology Meeting, 2000. Proceedings of the 2000 Sep.

(56) References Cited

OTHER PUBLICATIONS 24-26, 2000, Piscataway, NJ, USA,IEEE, Sep. 24, 2000, pp. 157-160, XP010524195 ISBN: 24-26, 0-7803-6384-1.
Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.
Edelstein, D.C., "Advantages of Copper Interconnects," Proceedings of the 12th International IEEE VLSI Multilevel Interconnection Conference (1995) pp. 301-307.
Theng, C. et al. "An Automated Tool Deployment for ESD (Electro-StaticDischarge) Correct-by-Construction Strategy in 90 nm Process," IEEE International Conference on Semiconductor Electronics (2004) pp. 61-67.
Gao, X. et al. "An improved electrostatic discharge protection structure for reducing triggering voltage and parasitic capacitance," Solid-State Electronics, 27 (2003), pp. 1105-1110.
Yeoh, A. et al. "Copper Die Bumps (First Level Interconnect) and Low-K Dielectrics in 65nm High Volume Manufacturing," Electronic Components and Technology Conference (2006) pp. 1611-1615.
Hu, C-K. et al. "Copper-Polyimide Wiring Technology for VLSI Circuits," Materials Research Society Symposium Proceedings VLSI V (1990) pp. 369-373.
Roesch, W. et al. "Cycling copper flip chip interconnects," Microelectronics Reliability, 44 (2004) pp. 1047-1054.
Lee, Y-H. et al. "Effect of Esd Layout on the Assembly Yield and Reliability," International Electron Devices Meeting (2006) pp. 1-4.
Yeoh, T-S. "ESD Effects on Power Supply Clamps," Proceedings of the 6th International Sympoisum on Physical & Failure Analysis of Integrated Circuits (1997) pp. 121-124.
Edelstein, D. et al. "Full Copper Wiring in a Sub-0.25 pm CMOS ULSI Technology," Technical Digest IEEE International Electron Devices Meeting (1997) pp. 773-776.
Venkatesan, S. et al. "A High Performance 1.8V, 0.20 pm CMOS Technology with Copper Metallization," Technical Digest IEEE International Electron Devices Meeting (1997) pp. 769-772.
Jenei, S. et al. "High Q Inductor Add-on Module in Thick Cu/SiLK™ single damascene," Proceedings from the IEEE International Interconnect Technology ConferenCe (2001) pp. 107-109.
Groves, R. et al. "High Q Inductors in a SiGe BiCMOS Process Utilizing a Thick Metal Process Add-on Module," Proceedings of the Bipolar/BiCMOS Technology Meeting (1999) pp. 149-152.
Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.
Kumar, R. et al. "A Family of 45nm IA Processors," IEEE International Solid-State Circuits Conference, Session 3, Microprocessor Technologies, 3.2 (2009) pp. 58-59.
Bohr, M. "The New Era of Scaling in an SoC World," International Solid-State Circuits Conference (2009) Presentation Slides 1-66.
Bohr, M. "The New Era of Scaling in an SoC World," International Solid-State Circuits Conference (2009) pp. 23-28.
Ingerly, D. et al. "Low-K Interconnect Stack with Thick Metal 9 Redistribution Layer and Cu Die Bump for 45nm High Volume Manufacturing," International Interconnect Technology Conference (2008) pp. 216-218.
Kurd, N. et al. "Next Generation Intel® Micro-architecture (Nehalem) Clocking Architecture," Symposium on VLSI Circuits Digest of Technical Papers (2008) pp. 62-63.
Maloney, T. et al. "Novel Clamp Circuits for IC Power Supply Protection," IEEE Transactions on Components, Packaging, and Manufacturing Technology, Part C, vol. 19, No. 3 (Jul. 1996) pp. 150-161.
Geffken, R. M. "An Overview of Polyimide Use in Integrated Circuits and Packaging," Proceedings of the Third International Symposium on Ultra Large Scale Integration Science and Technology (1991) pp. 667-677.
Luther, B. et al. "Planar Copper-Polymide Back End of the Line Interconnections for ULSI Devices," Proceedings of the 10th International IEEE VLSI Multilevel Interconnection Conference (1993) pp. 15-21.
Master, R. et al. "Ceramic Mini-Ball Grid Array Package for High Speed Device," Proceedings from the 45th Electronic Components and Technology Conference (1995) pp. 46-50.
Maloney, T. et al. "Stacked PMOS Clamps for High Voltage Power Supply Protection," Electrical Overstress/Electrostatic Discharge Symposium Proceedings (1999) pp. 70-77.
Lin, M.S. et al. "A New System-on-a-Chip (SOC) Technology—High Q Post Passivation Inductors," Proceedings from the 53rd Electronic Components and Technology Conference (May 30, 2003) pp. 1503-1509.
Megic Corp. "MEGIC way to system solutions through bumping and redistribution," (Brochure) (Feb. 6, 2004) pp. 1-3.
Lin, M.S. "Post Passivation Technology™—MEGIC® Way to System Solutions," Presentation given at TSMC Technology Symposium, Japan (Oct. 1, 2003) pp. 1-32.
Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.
PCT International Search Report for Application No. PCT/US2009/069303 mailed Mar. 9, 2010.
PCT Written Opinion of the International Searching Authority for Application No. PCT/US2009/069303 mailed Mar. 9, 2010.
Taiwan Search Report—TW096149614—TIPO—Apr. 10, 2013.

\* cited by examiner

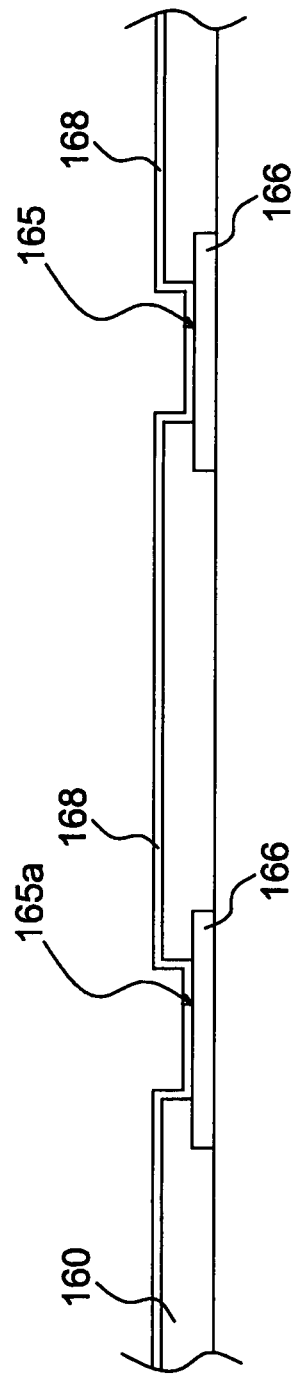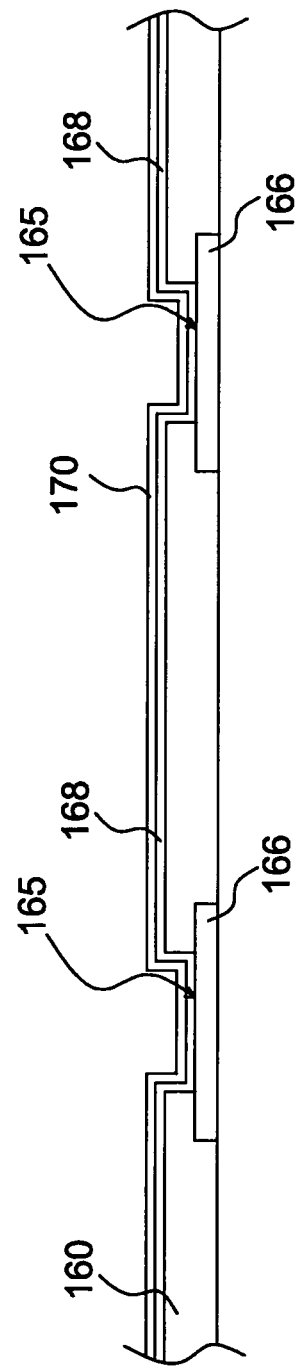

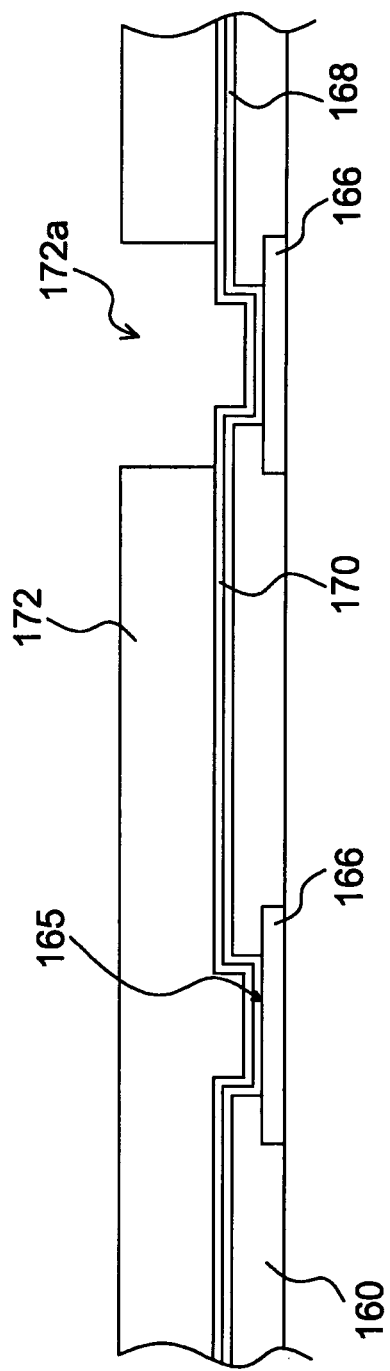
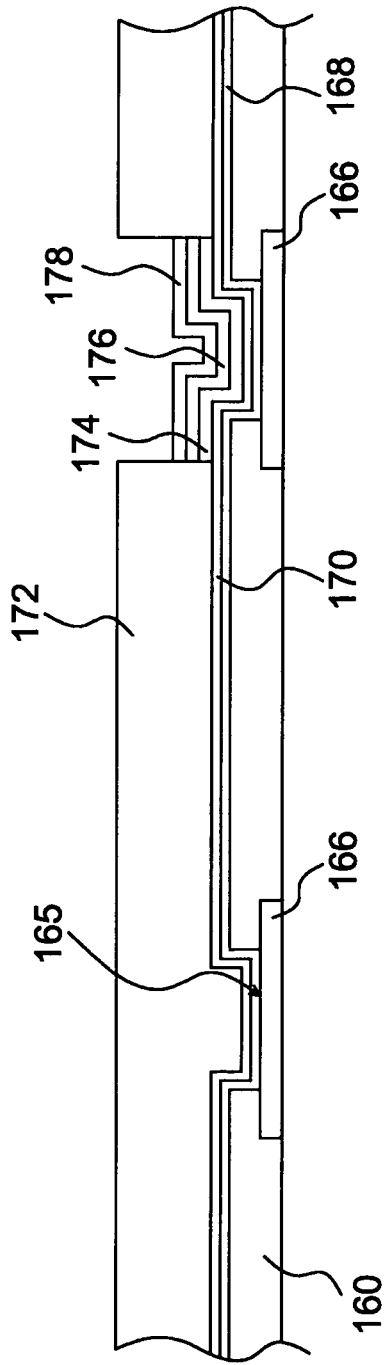

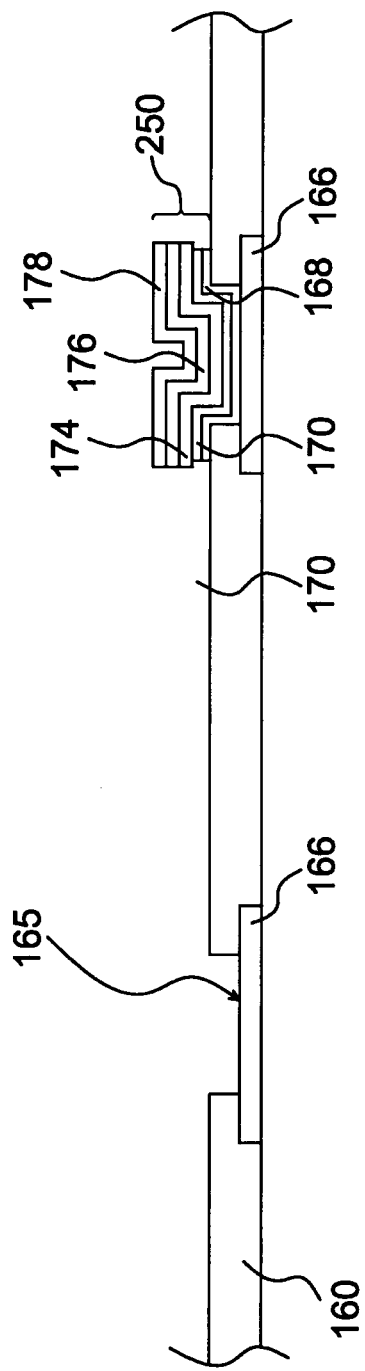

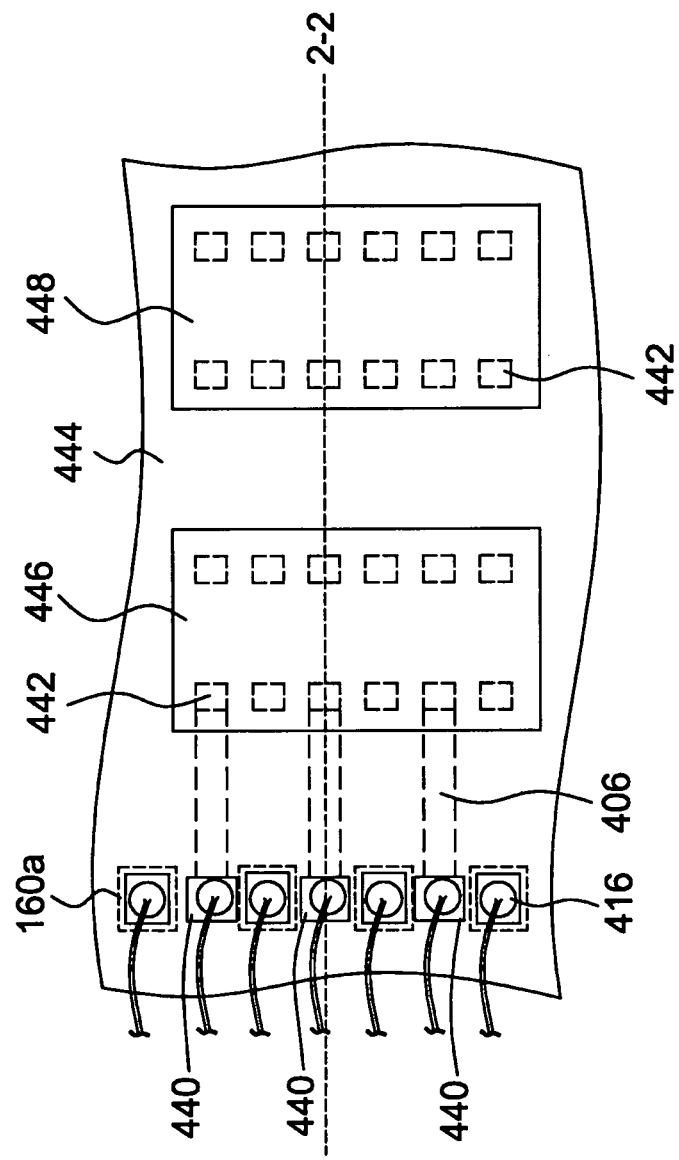

US 8,749,021 B2

VOLTAGE REGULATOR INTEGRATED WITH SEMICONDUCTOR CHIP

This application claims priority to U.S. provisional application No. 60/871,837, filed on Dec. 26, 2006, which is herein incorporated by reference in its entirety.

BACKGROUND OF THE INVENTION

1. Field of the Invention

The present invention relates to a type of semiconductor chip and its applications or, more specifically, it relates to a type of semiconductor chip and its application circuits.

2. Description of the Related Art

In common power regulator devices, goals behind the design not only include lowering total circuit costs, but also accelerating response speeds of signals and increasing the efficiency of regulating power supplies. Currently, in order to achieve the goal of mediating many different voltage ranges, the size of voltage regulators are rather large and on-chip regulators are not a reality. For a PCB with multiple electrical devices, because different electrical devices have different voltage demands, power supplies of different output voltages are used to correspond to general voltage ranges that are used by the electrical devices. However, this method consumes a rather large amount of energy, increases the difficulty of designing circuits, and also has a rather high cost.

Therefore, to decrease the amount of energy needed, a common method is to use multiple voltage regulators or converters to modify the voltage from a single power supply unit, in accordance to needs of the electrical devices. These voltage regulators or converters allow the voltage that enters each electrical device to correspond to the device's working voltage. For example, FIG. 1 shows a common diagram of an equivalent circuit structure. On the circuit structure, there is a power supply unit 10, and on one side of the power supply unit 10, a voltage regulator or converter 12 is connected. On the other side of the voltage regulator 12, multiple parasitic elements 14 are connected, and the electrical devices 16 (such as chips) that are to be controlled are also connected to the parasitic elements. Voltage regulator 12 can vary the voltage from power supply unit 10 to a specific range that corresponds to the characteristics of electrical devices 16.

More specifically, voltage regulator 12 can take a steady input voltage and regulate the voltage within a specific range according to the needs of different devices (such as chips), and then input the voltage into the devices. With current circuit technology, this method must be carried out by voltage regulators or converters, resistors, capacitors, and inductors constructed on the PCB. Referring to the electrical devices 16 and voltage regulator 12 disclosed in FIG. 1, there are multiple parasitic capacitors, inductors, and resistors in serial or parallel. Therefore, after a power supply voltage is regulated by voltage regulator 12, the power supply voltage still needs to pass through multiple parasitic elements for enabling electrical devices 16. These multiple parasitic elements are spread out over the PCB and within the package of the chip, and therefore cause a decrease in the efficiency at which the voltage is regulated.

Referring to FIG. 2, an example result of circuits of FIG. 1, a graph is shown where output impedance is plotted against load current frequency. As shown on the graph, when the usage frequency of electrical devices 16 is $10^7$ Hz, the corresponding output impedance is 0.025 ohms. However, when the usage frequency of electrical devices is $10^{8.5}$ Hz, the output impedance quickly increases to 0.3 ohms, showing an obvious disadvantage to this method of voltage regulation.

The circuit diagram shown in FIG. 3 is commonly used in the design of voltage regulator 12, wherein voltage regulator 12 includes a semiconductor chip 1115, and also an inductor 1320' and a capacitor 1310' constructed off-chip. Semiconductor chip 1115 includes MOS 1114b', diode 1114c', switch controller 1114a', and voltage feedback device 1112'. Then a power supply inputs into voltage regulator 12, voltage feedback device 1112' takes a voltage signal and transfers it to switch controller 1114a'. Switch controller 1114a' then uses this voltage signal to control when MOS 1114b' is switched on or off, which therefore controls the output voltage.

Another circuit diagram is shown in FIG. 4. This circuit diagram is similar to that of FIG. 3, except that the diode 1114c' in FIG. 3 is replaced by MOS 1114d' in FIG. 4. In this circuit, the voltage feedback device 1112' also takes a voltage signal and transfers it to switch controller 1114a', which controls when MOS 1114b' is switched on or off, therefore controlling the output voltage.

Therefore, the greater the number of different types of electrical devices 16 on the PCB, the greater the number of corresponding voltage regulating devices, so that the supply voltages entering the electrical devices 16 will fall in the correct voltage range. However, such circuit design utilizes a large quantity of high cost voltage regulator devices, and the electrical wiring between different voltage regulators 12 must be separated, causing the need for more metal lines and therefore increasing total manufacturing costs. Needless to say, such circuit design is not suitable for use in micro-scale electronic products. In addition, although the use of multiple voltage regulators 12 in place of multiple power supply units 10 can effectively reduce the amount of resources wasted, the large number of voltage regulators 12 used to account for different electrical devices 16 causes circuits on the PCB to become rather complicated. Because signals pass through a complicated arrangement of wiring, the signal response time is naturally longer and cannot be immediate, simultaneously lowering efficiency of power management. Also, the circuit design takes up a large portion of the PCB, which is an inefficient use of circuit routing.

The present invention proposes a semiconductor chip and its application circuit to lessen above mentioned problems.

SUMMARY OF THE INVENTION

The primary objective of the present invention is to provide a semiconductor chip structure and its application circuit, wherein the switching voltage regulator or voltage converter is integrated within the semiconductor chip using chip fabrication methods, so that the switching voltage regulator or voltage converter and semiconductor chip are combined as one structure.

Another objective is to provide a semiconductor chip structure and its application circuit, with the ability to adapt immediately to supply-voltage variation, efficiently decreasing the transient response time.

Still another objective is to provide a semiconductor chip structure and its application circuit, so that the use of such semiconductor chip with the integrated voltage regulator or converter will reduce the overall difficulty of circuit designs on the PCB or Motherboard, both satisfying the demand to lower manufacturing costs and miniaturize electronic products.

In order to achieve the above mentioned objectives, the present invention provides a semiconductor chip structure, which includes a silicon substrate with multiple devices, and a set of external components. On this silicon substrate there is a thin circuit structure with a passivation layer. This passivation layer has multiple passivation layer openings for electrically connection from external components or circuits to the thin circuit structure. The above mentioned devices are active devices. Examples of active devices include diodes, P-Type MOS devices, N-type MOS devices and complementary metal oxide semiconductor (CMOS) devices. Voltage feedback devices and switch controller are composed of the mentioned active devices in the semiconductor chip. On the other hand, external components are passive components, such as the resistors, capacitors, and inductors. From bottom to top, the circuit structure includes at least the first dielectric layer, first metal layer, second dielectric layer, and second metal layer. The first dielectric layer lies above the substrate, and within the first dielectric layer there is a contact window. The first metal layer is above the first dielectric layer, and every point on the first metal layer can be electrically connected to corresponding devices using corresponding contact windows. The second dielectric layer is above the first metal layer and contains multiple vias [Do we need to define via?]. The second metal layer is above the second dielectric layer, and every point on the second metal layer can be electrically connected to corresponding first metal layer through corresponding vias. Also, on the passivation layer there is a polymer layer. This polymer layer has an opening above the opening of the passivation layer, and an under bump metal structure or post passivation metal layer is constructed on top of the passivation layer opening. Also, according to different semiconductor chips, there are a solder layer, or a solder wetting layer, or a wire bondable layer, a barrier layer, a metal layer and an adhesion/barrier layer comprised in the under bump metal structure. The thickness of the solder layer can vary depending on the different thicknesses of and materials used in the packaging structure of semiconductor chips. The post passivation metal layer may has the same composition as the under bump metal structure or comprises with an adhesion/barrier layer and a metal layer that is a copper or gold. Lastly, on the post passivation metal layer there is a second polymer layer, and this second polymer layer contains an opening that allows the post passivation metal layer to be revealed. Also, the semiconductor chip in the present invention uses methods used in the Thin Small Outline Package (TSOP), Small Outline J-Lead (SOJ), Quad Flat Package (QFP), Think Quad Flat Package (TQFP), or Ball Grid Array (BGA) as packaging methods. In addition, using wire-bonding or flip chip techniques, the semiconductor chip in the present invention is electrically connected to the outside.

The present invention also provides the application circuit of a semiconductor chip, which includes an internal electrical circuit and an external electrical circuit. The internal and external circuits are electrically connected using a metal circuit. The devices of the internal circuit are chosen from, but not limited to, P-Type MOS devices, N-type MOS devices, CMOS devices, voltage feedback devices and switch controller. On the other hand, components of the external electrical circuit are chosen from, but not limited to, resistors, capacitors and inductors. The internal electrical circuit is in or over a silicon substrate, while the metal circuit and external circuit are over said substrate with the metal circuit in between the internal circuit and external circuit. Similarly, all semiconductor chips in the present invention use methods used in the Thin Small Outline Package (TSOP), Small Outline J-Lead (SOJ), Quad Flat Package (QFP), Think Quad Flat Package (TQFP), or Ball Grid Array (BGA) as packaging methods. In addition, using wire-bonding or flip chip techniques, the semiconductor chip in the present invention is electrically connected to the outside.

Therefore, the present invention provides a semiconductor chip with switching voltage regulation and the ability to adapt to varying voltages demanded by various chip designs, which decreases transient response time, circuit routing area used on the PCB, and the complexity of circuit connection. These improvements lead to a decrease in the overall cost of manufacturing semiconductor devices.

To enable the objectives, technical contents, characteristics, and accomplishments of the present invention and the embodiments of the present invention are to be described in detail in reference to the attached drawings below.

BRIEF DESCRIPTION OF THE DRAWINGS

FIGS. 7a to 7e show the processes of the semiconductor chip of Embodiment 1.

FIG. 21a to 21l shows the manufacturing of the structure of Embodiment 7.

FIG. 25a to 25k shows the manufacturing of the structure of Embodiment 11.

DESCRIPTION OF THE PREFERRED EMBODIMENTS

The present invention discloses a semiconductor chip structure and its application circuit, wherein multiple passive devices are integrated on a semiconductor chip. By using active devices from semiconductor chips of different functions to match the passive components integrated on the semiconductor chip, immediate voltage adaptation can be achieved within a specific voltage range.

Figure 1:
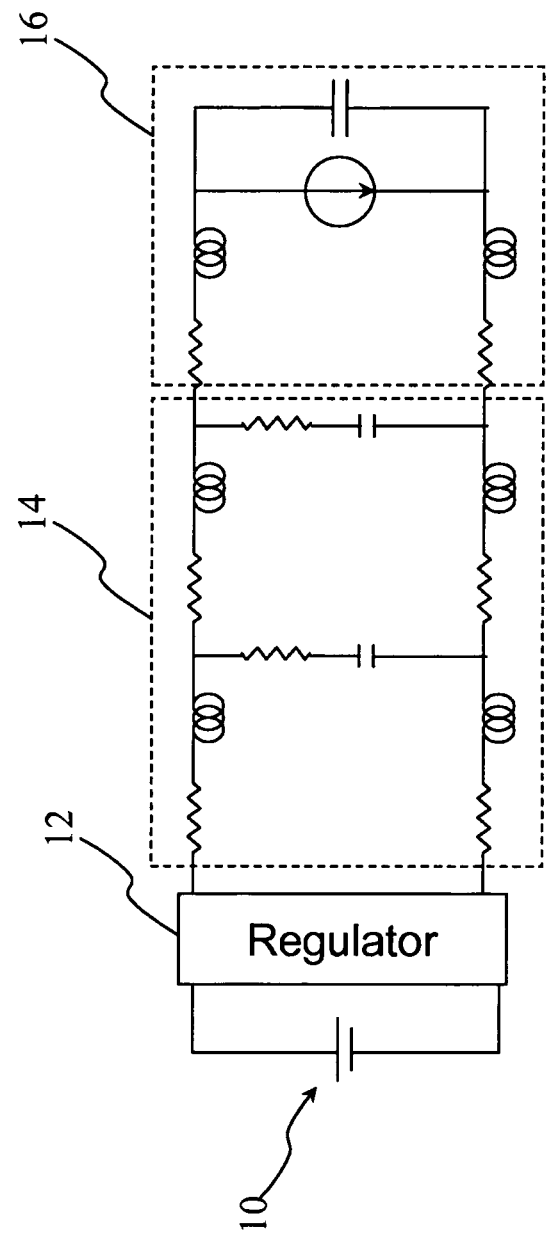
FIG. 1 shows the structure of prior voltage regulating circuits.
Figure 2:
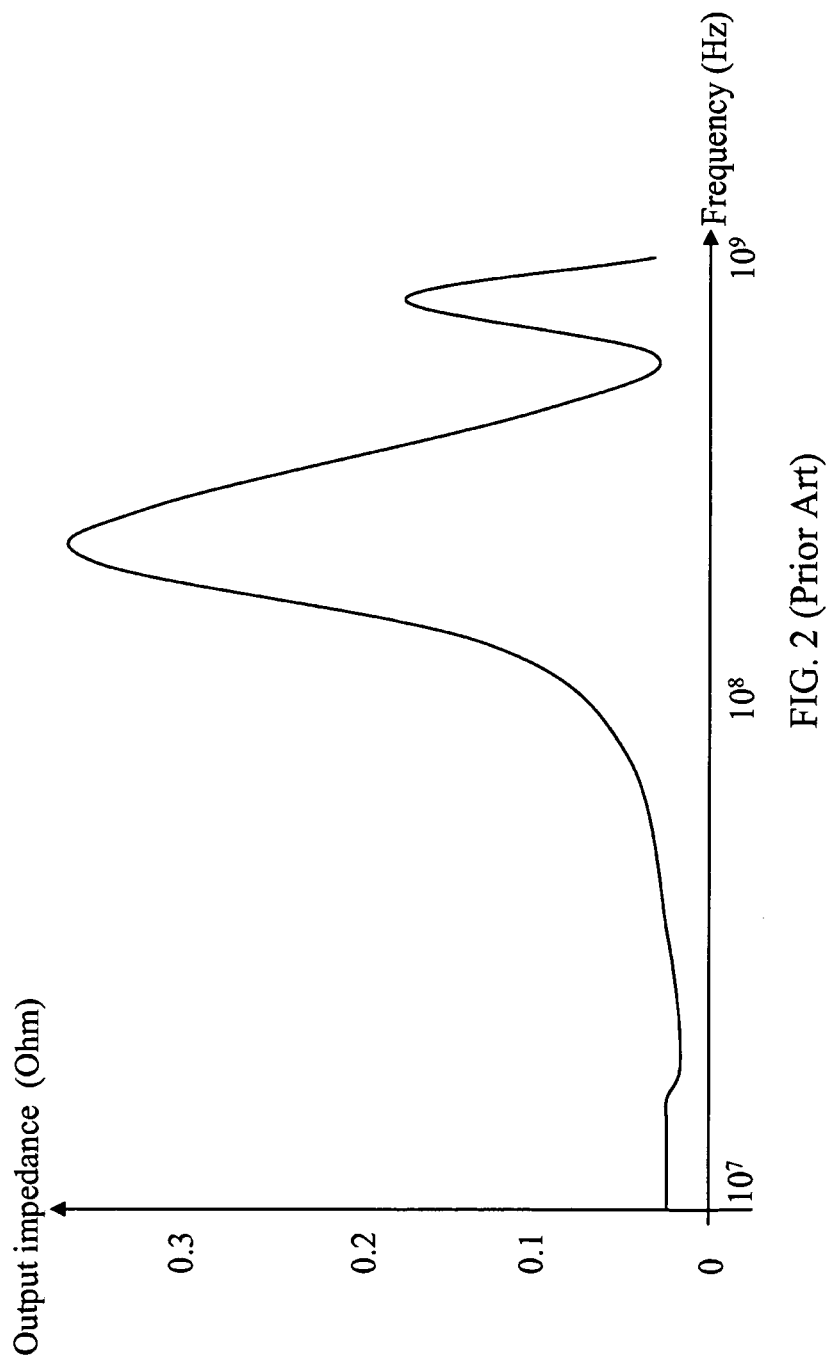
FIG. 2 is a graph showing the relationship between the load current frequency of the circuit structure and output impedance.
Figure 3:
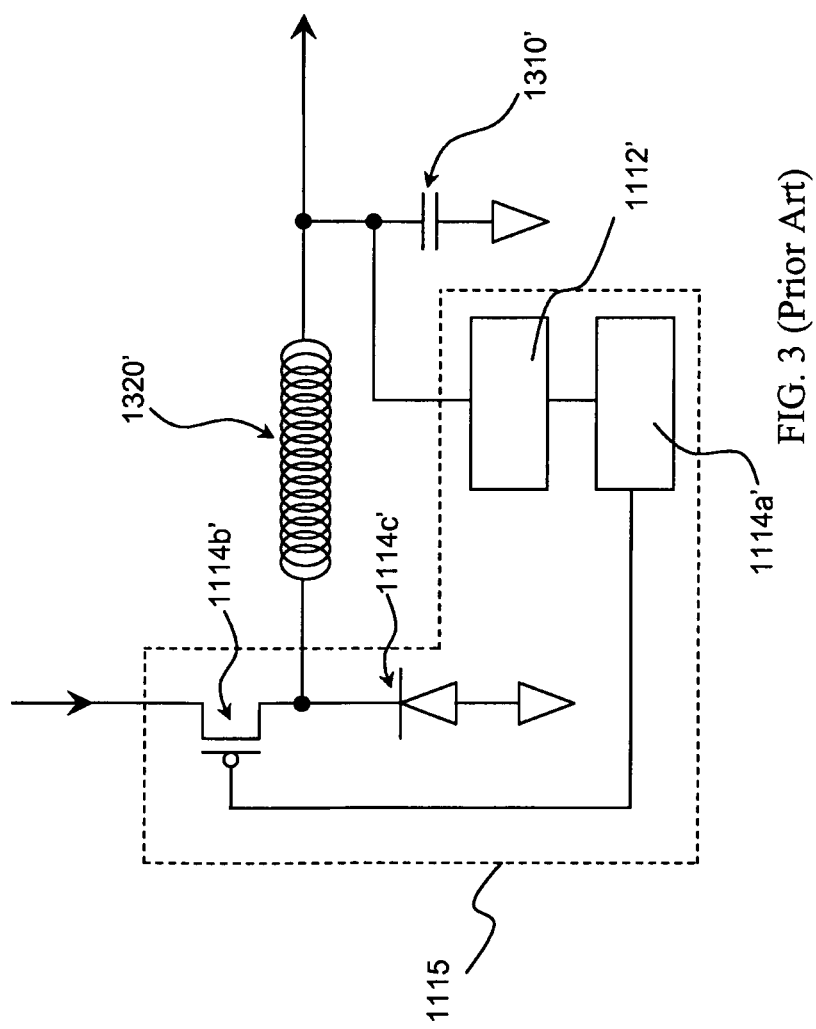
FIG. 3 shows Embodiment 1 of the circuit of a prior step-down voltage regulator.
Figure 4:
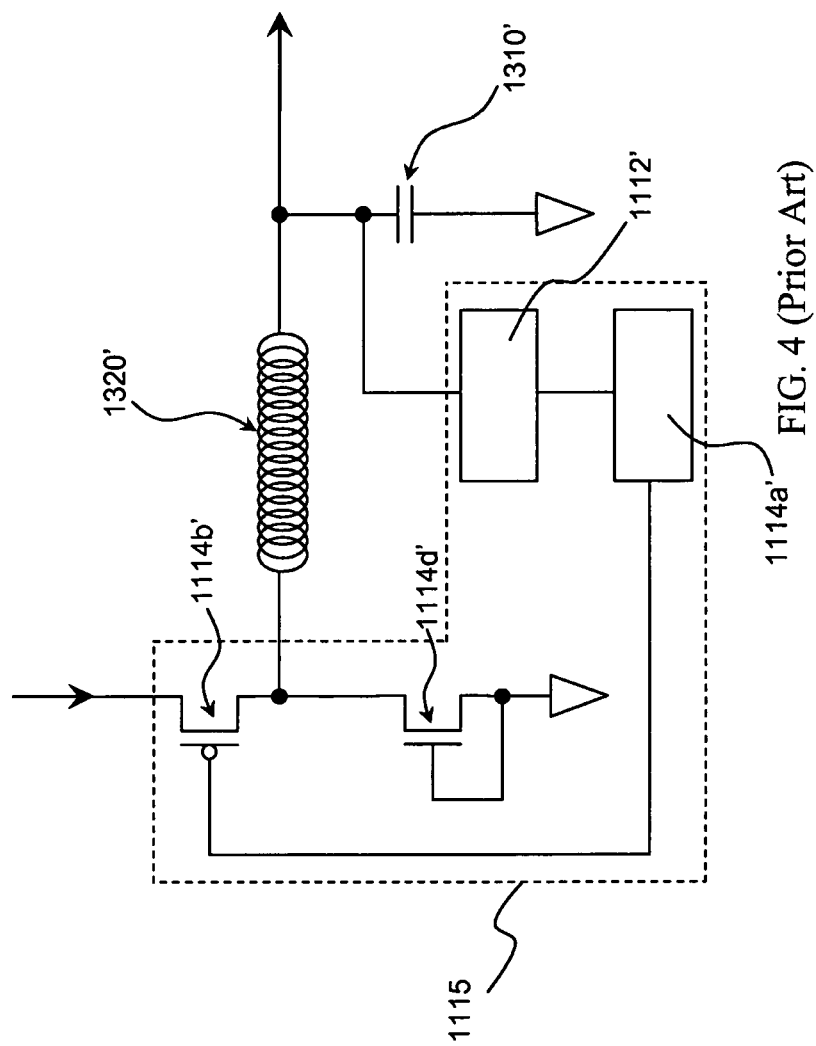
FIG. 4 shows Embodiment 2 of the circuit of a prior step-down voltage regulator.
Figure 5:
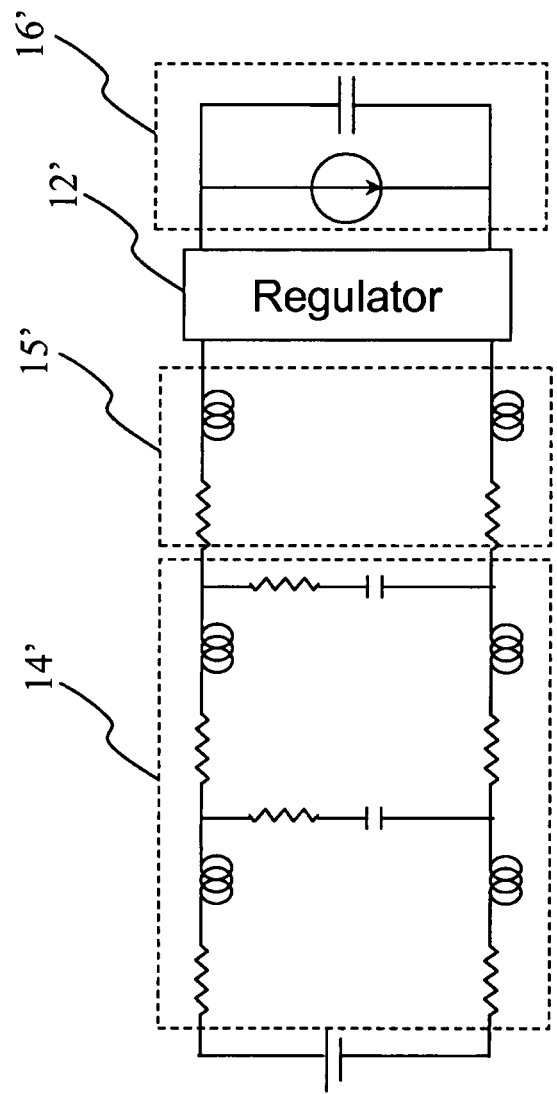
FIG. 5 shows the corresponding circuit diagram of the present invention.
Figure 6:
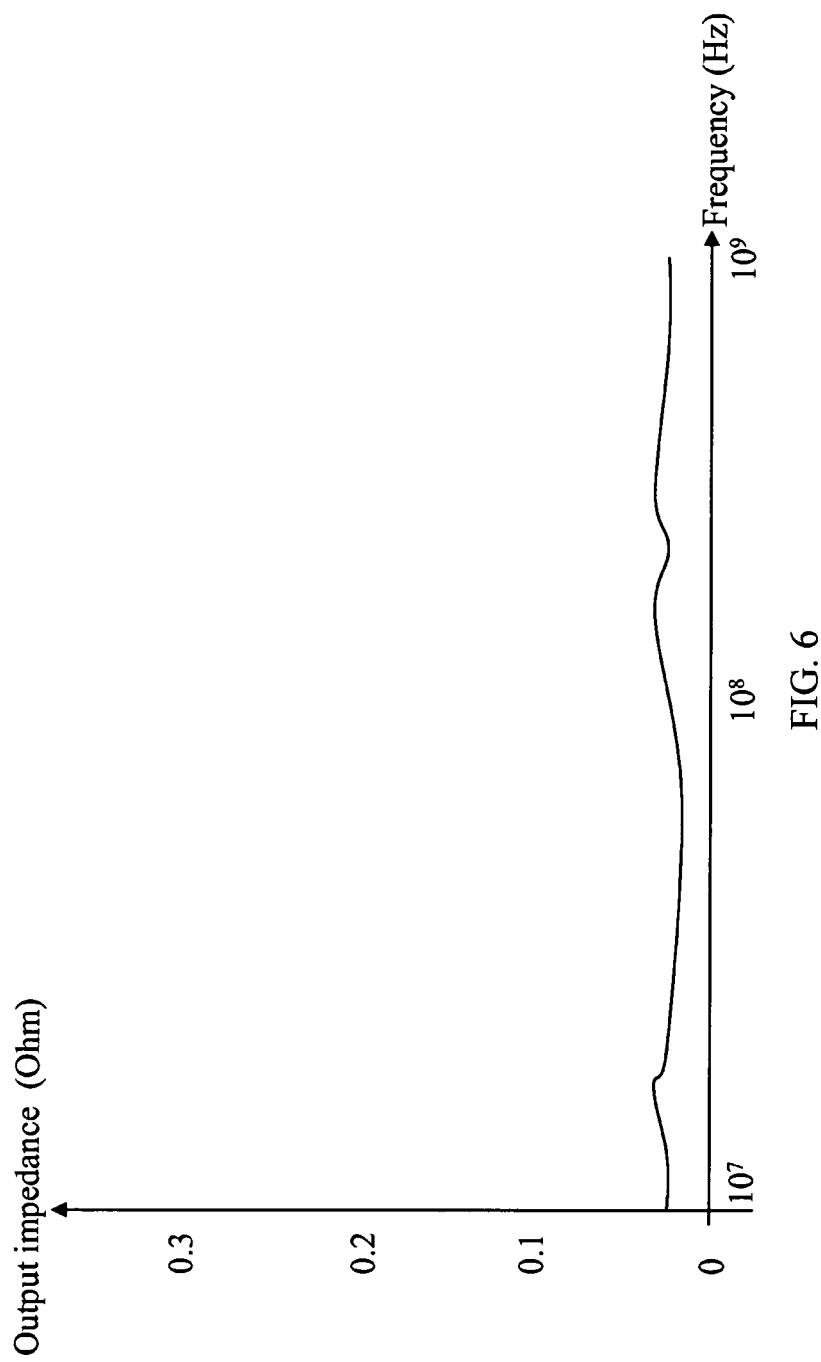
FIG. 6 is a graph showing the relationship between usage frequency and output impedance.

As opposed to the circuit structure disclosed in FIG. 1, the present invention provides a semiconductor chip structure with the equivalent circuit structure shown in FIG. 5. The most defining characteristic of the circuit structure used in the present invention is that the circuit structure contains the voltage regulator or called converter 12' constructed after parasitic elements 14' of PC board and parasitic elements 15' of chip package, as opposed to circuit structures of FIG. 1 with voltage regulator 12' before parasitic elements 14' of PC board as in prior art. Therefore, because voltage regulator 12' does not need to bear the burden of parasisitc elements 14' and 15', the voltage regulator or converter integrated with a single chip allows circuit operation under higher frequency. [Also, this circuit structure design can lower manufacturing costs and simplify the routing design on the PCB because the distance between voltage regulator 12' and corresponding electrical devices 16' is shortened. The simplified routing design increases the speed and efficiency at which signals are delivered and solves the problem of large voltage fluctuations under high frequency usage. An example relationship between load current frequency and impedance resistance values are shown in FIG. 6.

Following, the preferred embodiments of the each structure in the semiconductor chip structure will first be proposed. Then, in reference to specific embodiments, application circuits will be proposed.

Embodiment 1

Figure 7:
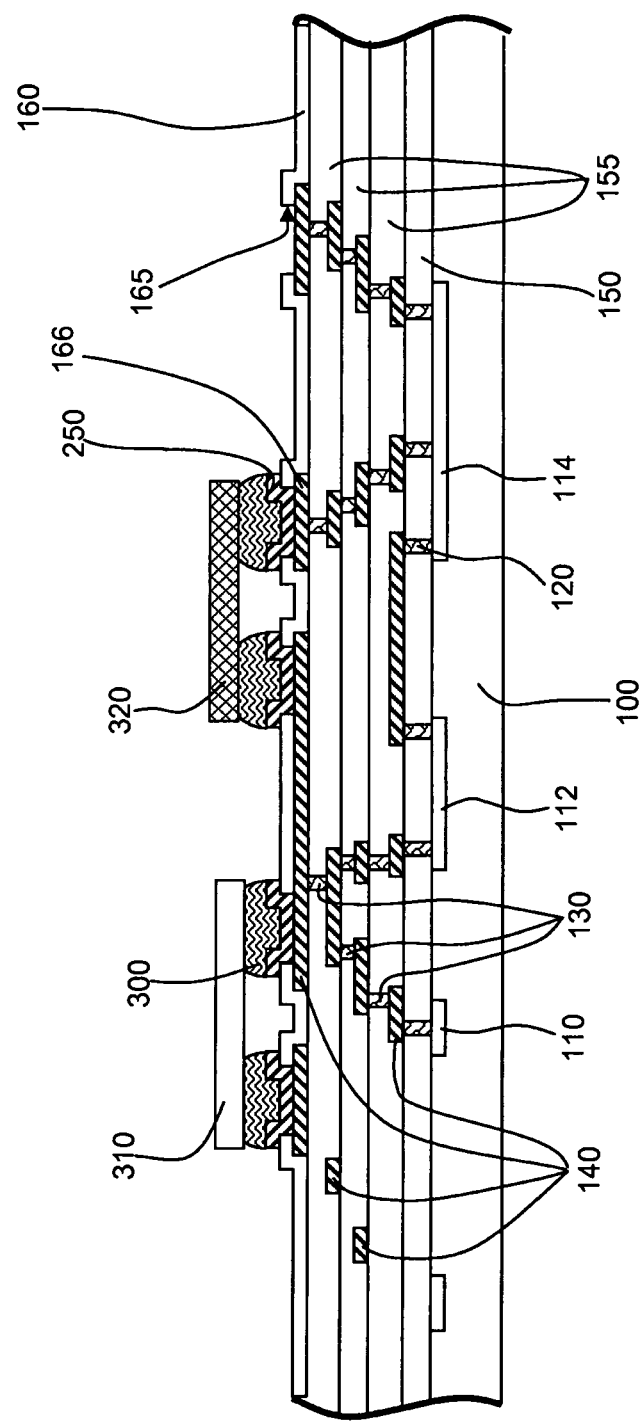
FIG. 7 shows the semiconductor chip of Embodiment 1.

In reference to FIG. 7, substrate 100 is a type of semiconductor base. This substrate can be silicon based, gallium arsenide (GaAs) based, or silicon germanium (SiGe) based, and many of the devices, such as devices 110, 112, and 114, are located in or over substrate 100. These devices 110, 112, and 114 are all active devices mainly. Active devices include voltage feedback devices, switch controller, or MOS devices, such as p-channel MOS devices, n-channel MOS devices, BiCMOS devices, Bipolar Junction Transistor (BJT), or CMOS.

There is a thin circuit structure located on substrate 100. This circuit structure includes a first dielectric layer 150, multiple metal layers 140, at least one second dielectric layer 155. The thicknesses of the first dielectric layer 150 and second dielectric layer 155 are between 0.3 micrometers and 2.5 micrometers, and the materials that are used to make the first and second dielectric layers include boron containing silicate glass, silicon-nitride, silicon-oxide, silicon-oxynitride, and carbon containing low-k dielectric material. On the other hand, the thicknesses of metal layers 140 are between 0.1 micrometers and 2 micrometers, and the materials used to make the metal layers comprise copper layer, aluminum-copper alloy, tantalum, tantalum nitride, tungsten, and tungsten alloy. Devices 110, 112, 114 are electrically connected to metal layers 140 through a metal contact 120 and metal via 130, which passes through first dielectric layer 150 and second dielectric layer 155. Metal contact 120 and via 130 can be a W-plug or Cu-plug. In addition, the metal layers 140 are formed by various methods including damascene process, electroplating, CVD, and sputtering. For example, the damascene process, electroplating, sputtering, and CVD can be used to form copper metal layers 140, or sputtering can be used to form aluminum metal layers 140. On the other hand, the first dielectric layer 150 and second dielectric layer 155 are usually formed by Chemical Vapor Deposition (CVD).

Passivation layer 160 is over the circuit structure comprising the first dielectric layer 150, metal layers 140, and second dielectric layer 155. This passivation layer 160 can protect devices 110, 112, 114 and the metal layers 140 described above from humidity and metal ion contamination. In other words, passivation layer 160 can prevent movable ions, such as sodium ions, moisture, transition metal ions, such as gold, silver, and copper, and other impurities from passing through and damaging devices 110, 112, 144, which could be MOS devices, transistors, voltage feedback devices, and switch controller, or all of metal layers 140 that are below passivation layer 160. In addition, passivation layer 160 usually consists of silicon-oxide (such as $SiO_2$), phosphosilicate glass (PSG), silicon-nitride (such as $Si_3N_4$) or silicon oxynitride. Passivation layer 160 typically has a thickness between 0.3 micrometers and 2 micrometers, and when it includes a silicon-nitride layer, this silicon-nitride layer usually has a thickness exceeding 0.3 micrometers and less than 2 micrometers.

There are currently ten methods of manufacturing passivation layer 160.

In a first method, the passivation layer 160 is formed by depositing a silicon oxide layer with a thickness of between 0.2 and 1.2 μm using a CVD method and on the silicon oxide layer depositing a silicon nitride layer with thickness between 0.3 and 1.2 μm by using a CVD method.

In a second method, the passivation layer 160 is formed by depositing a silicon oxide layer with a thickness of between 0.2 and 1.2 μm using a CVD method, next depositing a silicon oxynitride layer with a thickness of between 0.05 and 0.3 μm on the silicon oxide layer using a Plasma Enhanced CVD (PECVD) method, and then depositing a silicon nitride layer with a thickness of between 0.2 and 1.2 μm on the silicon oxynitride layer using a CVD method.

In a third method, the passivation layer 160 is formed by depositing a silicon oxynitride layer with a thickness of between 0.05 and 0.3 μm using a CVD method, next depositing a silicon oxide layer with a thickness of between 0.2 and 1.2 μm on the silicon oxynitride layer using a CVD method, and then depositing a silicon nitride layer with a thickness of between 0.2 and 1.2 μm on the silicon oxide layer using a CVD method.

In a fourth method, the passivation layer 160 is formed by depositing a first silicon oxide layer with a thickness of between 0.2 and 0.5 μm using a CVD method, next depositing a second silicon oxide layer with a thickness of between 0.5 and 1 μm on the first silicon oxide layer using a spin-coating method, next depositing a third silicon oxide layer with a thickness of between 0.2 and 0.5 μm on the second silicon oxide layer using a CVD method, and then depositing a silicon nitride layer with a thickness of 0.2 and 1.2 μm on the third silicon oxide using a CVD method.

In a fifth method, the passivation layer 160 is formed by depositing a silicon oxide layer with a thickness of between 0.5 and 2 μm using a High Density Plasma CVD (HDP—

CVD) method and then depositing a silicon nitride layer with a thickness of 0.2 and 1.2 µm on the silicon oxide layer using a CVD method.

In a sixth method, the passivation layer 160 is formed by depositing an Undoped Silicate Glass (USG) layer with a thickness of between 0.2 and 3 µm, next depositing an insulating layer of TEOS, PSG or BPSG (borophosphosilicate glass) with a thickness of between 0.5 and 3 µm on the USG layer, and then depositing a silicon nitride layer with a thickness of 0.2 and 1.2 µm on the insulating layer using a CVD method.

In a seventh method, the passivation layer 160 is formed by optionally depositing a first silicon oxynitride layer with a thickness of between 0.05 and 0.3 µm using a CVD method, next depositing a silicon oxide layer with a thickness of between 0.2 and 1.2 µm on the first silicon oxynitride layer using a CVD method, next optionally depositing a second silicon oxynitride layer with a thickness of between 0.05 and 0.3 µm on the silicon oxide layer using a CVD method, next depositing a silicon nitride layer with a thickness of between 0.2 and 1.2 µm on the second silicon oxynitride layer or on the silicon oxide using a CVD method, next optionally depositing a third silicon oxynitride layer with a thickness of between 0.05 and 0.3 µm on the silicon nitride layer using a CVD method, and then depositing a silicon oxide layer with a thickness of between 0.2 and 1.2 µm on the third silicon oxynitride layer or on the silicon nitride layer using a CVD method.

In a eighth method, the passivation layer 160 is formed by depositing a first silicon oxide layer with a thickness of between 0.2 and 1.2 µm using a CVD method, next depositing a second silicon oxide layer with a thickness of between 0.5 and 1 µm on the first silicon oxide layer using a spin-coating method, next depositing a third silicon oxide layer with a thickness of between 0.2 and 1.2 µm on the second silicon oxide layer using a CVD method, next depositing a silicon nitride layer with a thickness of between 0.2 and 1.2 µm on the third silicon oxide layer using a CVD method, and then depositing a fourth silicon oxide layer with a thickness of between 0.2 and 1.2 µm on the silicon nitride layer using a CVD method.

In a ninth method, the passivation layer 160 is formed by depositing a first silicon oxide layer with a thickness of between 0.5 and 2 µm using a HDP—CVD method, next depositing a silicon nitride layer with a thickness of between 0.2 and 1.2 µm on the first silicon oxide layer using a CVD method, and then depositing a second silicon oxide layer with a thickness of between 0.5 and 2 µm on the silicon nitride using a HDP—CVD method.

In a tenth method, the passivation layer 160 is formed by depositing a first silicon nitride layer with a thickness of between 0.2 and 1.2 µm using a CVD method, next depositing a silicon oxide layer with a thickness of between 0.2 and 1.2 µm on the first silicon nitride layer using a CVD method, and then depositing a second silicon nitride layer with a thickness of between 0.2 and 1.2 µm on the silicon oxide layer using a CVD method.

In passivation layer 160, there are more than one passivation layer openings 165, which therefore expose part of the metal layers 140 below. The passivation layer openings 165 can be in the shape of a circle, square, rectangle, or polygon with more than five edges. Corresponding to different shapes, there are different definitions for opening dimensions. For example, a circle opening has dimensions defined by its diameter, a square opening has dimensions defined by its side length, and a polygon with more than five edges has dimensions defined by the longest diagonal.

The portion of the metal layers 140 exposed by the passivation layer openings 165 in the passivation layer 160 is defined to be pad 166. On pad 166, there can be an optional metal cap (not shown in figure) to protect pad 166 from being damaged by oxidation. This metal cap can be an aluminum-copper alloy, a gold layer, a titanium tungsten alloy layer, a tantalum layer, a tantalum nitride layer, or a nickel layer. For example, when pad 166 is a copper pad, there needs to be a metal cap, such as an aluminum-copper alloy, to protect the copper pad exposed by the passivation layer openings 165 from oxidation, which could damage the copper pad. Also, when the metal cap is an aluminum-copper alloy, a barrier layer is formed between the copper pad and aluminum-copper alloy. This barrier layer includes titanium, titanium tungsten alloy, titanium nitride, tantalum, tantalum nitride, chromium, or nickel. The following method is under a condition where there is no metal cap, but those familiar with such technology should be able to deduce a similar method with the addition of a metal cap.

Next, an under bump metal structure 250 is constructed over passivation layer opening 165. The thickness of under bump metal structure 250 is between one micrometer and 15 micrometers. This under bump metal structure 250 is connected to external devices 310 and 320 through a solder layer 300. The solder layer 300 may include gold-tin alloy, tin-silver alloy, tin-silver-copper alloy, or other lead-free alloy. Using tin-silver alloy as an example, the tin to silver ratio can be adjusted according to needs, with the most common tin/silver ratio being 96.0~97/3.0~4. The thickness of said solder layer 300 is between 30 micrometers and 350 micrometers.

Under bump metal structure 250 can be a TiW/Cu/Ni metal layer structure, Ti/Cu/Ni metal structure, Ti/Cu metal structure, or Ti/Cu/Ni/Au metal structure.

Referring to FIG. 7a to FIG. 7e, a method for forming the TiW/Cu/Ni/Au under bump metal structure 250 is first using the sputtering process or evaporating process to form a TiW adhesion/barrier metal layer 168 with thickness between 0.05 and 0.5 micrometers on pad 166 and passivation layer 160, then using the sputtering process to form a copper seed layer 170 with thickness between 0.05 and 1 micrometer on TiW metal layer 168. Next, a patterned photoresist layer 172 is formed on seed layer 170. This patterned photoresist layer 172 has more than one opening 172a revealing seed layer 170. Next, using the electroplating or electroless plating process, copper metal layer 174 with thickness between 3 and 30 micrometers, nickel layer 176 with thickness between 0.5 and 5 micrometers, and gold layer 178 with thickness between 0.05 and 1.5 micrometer, preferred between 0.05 and 0.2 micrometers are formed respectively in opening 172a of patterned photoresist layer 172. Finally, photoresist layer 172, the portions of seed layer 170 and TiW metal layer 168 that are not under gold layer 178 are removed, completing the TiW/Cu/Ni/Au under bump metal structure 250. Here, Cu seed layer 170 removing process can be done by using wet etching solution containing H2SO4 or NH4OH, and TiW adhesion/barrier metal layer 168 removing process can be done by using wet etching solution containing 20~40% H2O2. It is preferred that the PH value of the etching solution for TiW removal is higher than 6 to prevent Cu corrosion during TiW removal.

Another ways to form seed layer 170 are an evaporating method, an electroplating method, or an electroless plating method, but preferred by a sputtering. Because seed layer 170 is important for the construction of electrical circuits thereon, the material used for seed layer 170 will vary according to material used for electrical circuits in following processes. For example, if the metal layer 174 made of copper material is formed on seed layer 170 by electroplating, then copper is also the optimal material to use for seed layer 170. Similarly, if the metal layer 174 made of gold material is formed on seed layer 170 by electroplating then gold is the optimal material to use for seed layer 170.

If the metal layer 174 made of palladium material is formed on seed layer 170 by electroplating, then palladium is also the optimal material to use for seed layer 170. If the metal layer 174 made of platinum material is formed on seed layer 170 by electroplating, then platinum is also the optimal material to use for seed layer 170. If the metal layer 174 made of rhodium material is formed on seed layer 170 by electroplating, then rhodium is also the optimal material to use for seed layer 170. If the metal layer 174 made of ruthenium material is formed on seed layer 170 by electroplating, then ruthenium is also the optimal material to use for seed layer 170. If the metal layer 174 made of rhenium material is formed on seed layer 170 by electroplating, then rhenium is also the optimal material to use for seed layer 170. If the metal layer 174 made of silver material is formed on seed layer 170 by electroplating, then silver is also the optimal material to use for seed layer 170.

The structure of under bump metal structure 250 will vary depending on the method use to form solder layer 300:

For example, if solder layer 300 is formed on under bump metal structure 250 by an electroplating method, the under bump metal structure 250 is preferred to be a TiW/Cu/Ni alloy structure or Ti/Cu/Ni alloy structure, with the solder structure 300 electroplated on the nickel layer, the TiW or Ti metal layer, formed by a sputtering method, on pad 166 and passivation layer 160, and Cu/Ni deposited by electroplating. In between the TiW or Ti metal layer and copper layer, there is a copper seed layer deposited by sputtering.

In another example, if the solder layer 300 is provided by external devices 300 and 320 or solder printing, then the under bump metal structure 250 is preferred to be a TiW/Cu/Ni/Au or Ti/Cu/Ni/Au structure.

Through solder layer 300, the under bump metal structure 250 on passivation layer opening 165 is electrically connected to external devices 310 and 320 (labeled as 310 in figure). External devices 310 and 320 are also electrically connected to the metal layer 140 below passivation layer 165, therefore external devices 310 and 320 to also be electrically connected to devices 110, 112, and 114.

External devices 310 and 320 are passive devices, which include inductors, capacitors, or integrated passive devices. In the present invention, external devices 310 and 320 are a capacitor and an inductor, respectively. For example, external device 310 may be a capacitor, while external device 320 may be an inductor, or external device 310 may be an integrated passive device, while external device 320 may be an inductor. The dimensions of external devices 310 and 320 may be chosen from industrial standard dimension 1210, dimension 0603, dimension 0402, or dimension 0201, wherein said dimension 0201 stands for 0.02 inches by 0.01 inches, and dimension 1210, dimension 0603, and dimension 0402 deduced by the same standard. In general, external devices 310 and 320 have a length between 0.2 mm and 5 mm and a width between 0.1 mm and 4 mm. External devices 310 and 320 are directly constructed on under bump metal structure 250 through the connection of solder layer 300.

Also, external devices 310 and 320 can be mounted either before or after a dice sawing procedure is performed on substrate 100.

Finally, the semiconductor chip after dice sawing procedures as disclosed in Embodiment 1 can be electrically connected to external circuits or power supplies through wires made by wire-bonding or through solder by flip chip techniques.

Embodiment 2

Figure 8:
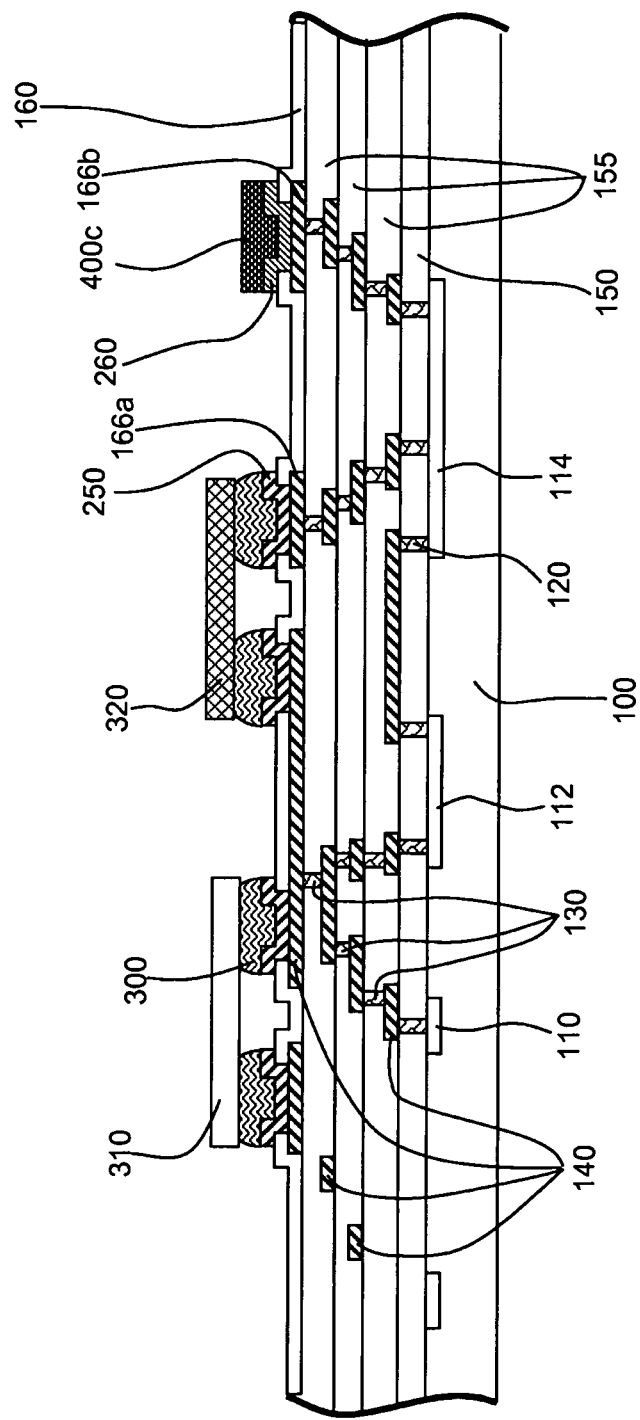
FIG. 8 shows the semiconductor chip of Embodiment 2.

Referring to FIG. 8, the structure of Embodiment 2 is similar to that of Embodiment 1, and therefore an explanation of some of the manufacturing process and properties will not be repeated. The difference between Embodiment 2 and Embodiment 1 lies in an under bump metal structure 260 and a bonding metal layer 400c that are constructed on or over pad 166b. Said bonding metal layer 400c can be used to connect electrically to external circuits through a wire formed by wire-bonding (not shown in figure).

Figure 8A:
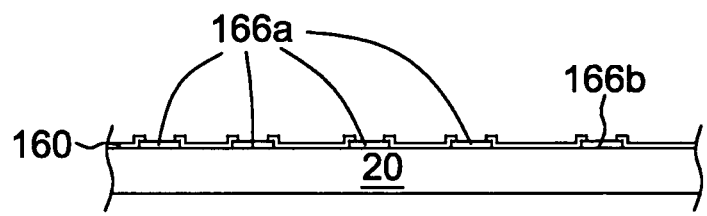
FIGS. 8a to 8u and FIGS. 8aa to 8am show the processes of the semiconductor chip of Embodiment 2.

The structure of Embodiment 2 can be manufactured with the following methods:

Manufacturing method 1 of Embodiment 2:

Referring to FIG. 8a, integrated circuit 20 represents all structures below passivation layer 160. Also included in integrated circuit 20 are substrate 100, devices 110, 112, 114, first dielectric layer 150, metal layers 140, second dielectric layer 155, metal contact 120, and via 130, wherein multiple passivation layer openings 165 reveal multiple pads 166a and 166b.

Figure 8B:
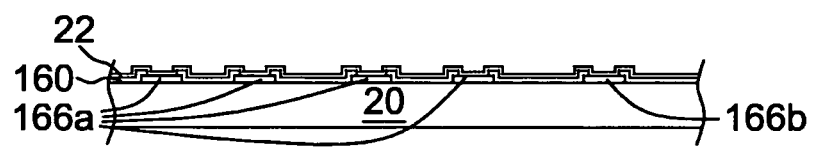

Referring to FIG. 8b, an adhesion/barrier layer 22 is formed on passivation layer 160 and pad 166a and 166b by using sputtering. The thickness of adhesion/barrier layer 22 is between 0.1 micrometers and 1 micrometer, with an optimal thickness between 0.3 micrometers and 0.8 micrometers. The adhesion/barrier can be selected from or composed of the following materials, Ti, TiW, TiN, Ta, TaN, Cr, and Mo. Ti and TiW are the two preferred materials for adhesion/barrier.

Figure 8C:
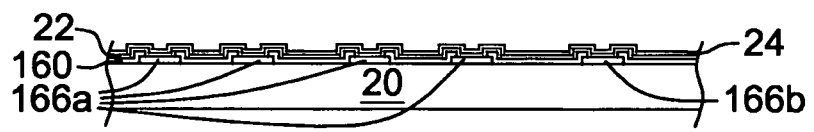

Referring to FIG. 8c, a seed layer 24 with a thickness between 0.05 micrometers and 1 micrometer (and an optimal thickness between 0.1 micrometers and 0.7 micrometers) is then formed on adhesion/barrier layer 22. Similar to seed layer 170 described above, the material used for seed layer 24 will vary according to the material of metal layers formed later. The material of seed layer can be Cu, Au or Ag. Au is the preferred seed layer material in this embodiment.

Figure 8D:
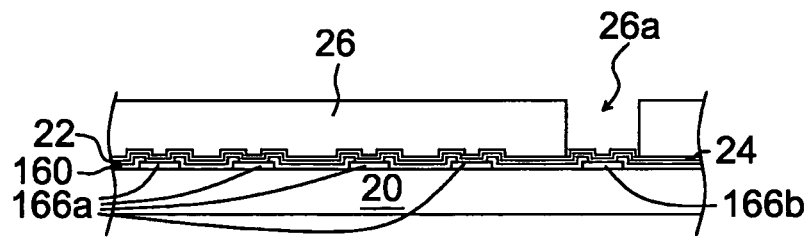

Referring to FIG. 8d, photoresist layer 26 is formed on seed layer 24, and through spin coating, exposure and development, photoresist layer 26 is patterned, forming multiple photoresist layer openings 26a in photoresist layer 26, which reveal portions of seed layer 24 that are over pad 166b.

Figure 8E:
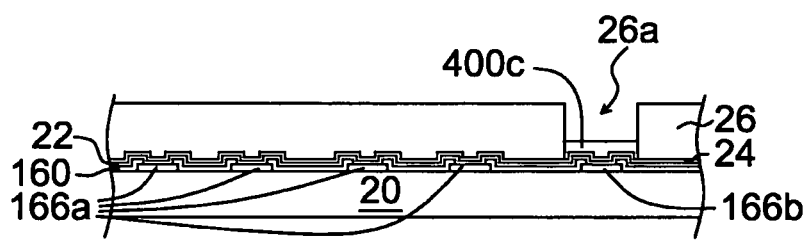

Referring to FIG. 8e, bonding metal layer 400c is formed by an electroplating method on seed layer 24, which is in photoresist layer opening 26a. The bonding metal layer 400c consists of materials such as gold, copper, silver, palladium, rhodium, ruthenium, rhenium, or nickel, and may have a single metal layer structure or multiple metal layer structure. The thickness of bonding metal layer 400c is between 1 micrometers and 100 micrometers, with optimal thickness between 1.5 micrometers and 15 micrometers. The bonding metal layer 400c may be composed with combinations of the multiple metal layer structure which comprise Cu/Ni/Au, Cu/Au, Cu/Ni/Pd, and Cu/Ni/Pt. In this embodiment, bonding metal layer 400c is preferred to be a single layer made of gold.

Figure 8F:
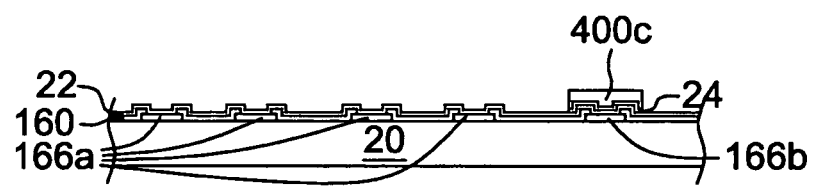

Referring to FIG. 8f, remove patterned photoresist 26 and portions of seed layer 24 that are not below metal layer 400c. If seed layer 24 is made of gold, seed layer 24 is removed by using solution containing $I_2$ and KI.

Figure 8G:
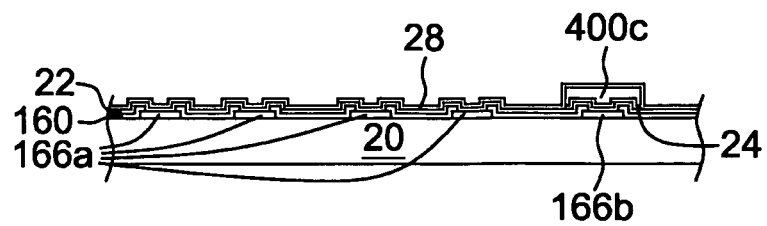

Referring to FIG. 8g, a seed layer 28 with a thickness between 0.05 micrometers and 1 micrometer (and an optimal thickness between 0.1 micrometers and 0.7 micrometers) is formed on adhesive/barrier layer 22 and metal layer 400*c*. In this embodiment, the material of said seed layer 28 is preferred to be copper (Cu). Similar to seed layer 170 described above, the material used for seed layer 28 will vary according to the material of metal layers formed later.

Figure 8H:
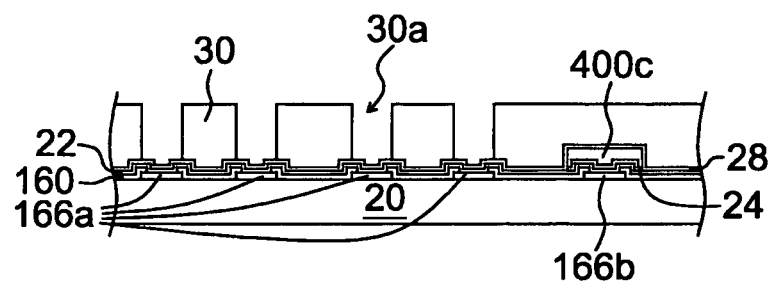

Referring to FIG. 8*h*, a photoresist layer 30 is formed on seed layer 28, and through spin coating, exposure and development, photoresist layer 30 is patterned, forming multiple photoresist layer openings 30*a* in photoresist layer 30, which reveal portions of seed layer 28 that are over pad 166*a*.

Figure 8I:
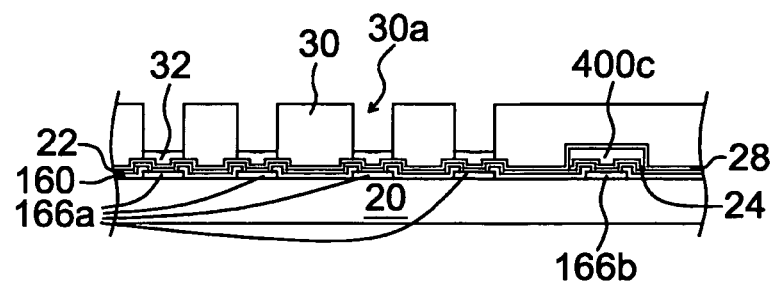

Referring to FIG. 8*i*, a metal layer 32 is formed by an electroplating method on seed layer 28, which is in photoresist layer opening 30*a*. The metal layer 32 is made of copper, and has a thickness between 1 micrometer and 100 micrometers, with optimal thickness between 1.5 micrometers and 15 micrometers.

Figure 8J:
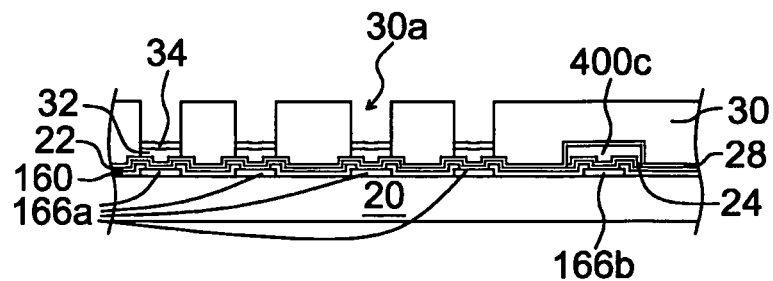

Referring to FIG. 8*j*, a metal layer 34 is formed by an electroplating method on metal layer 32, which is in photoresist layer opening 30*a*. The metal layer 34 is made of nickel, and has a thickness between 0.1 micrometers and 20 micrometers, with optimal thickness between 1 micrometer and 5 micrometers.

Figure 8K:
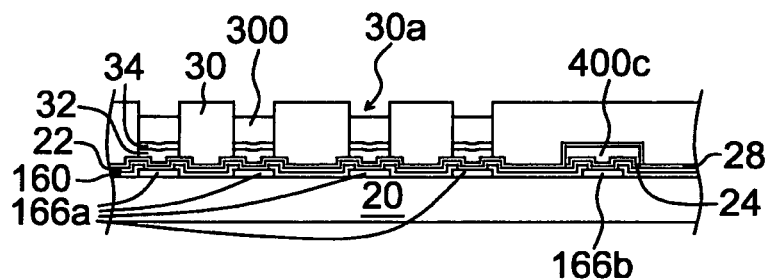

Referring to FIG. 8*k*, a metal layer 300 is formed by an electroplating method on metal layer 34, which is in photoresist layer opening 30*a*. The metal layer 300 consists of material such as tin, Sn/Ag alloy, Sn/In alloy, Sn/Ag/Cu alloy, and any other lead free soldering material, and has a thickness between 5 micrometers and 300 micrometers, with optimal thickness between 20 micrometers and 150 micrometers.

Figure 8L:
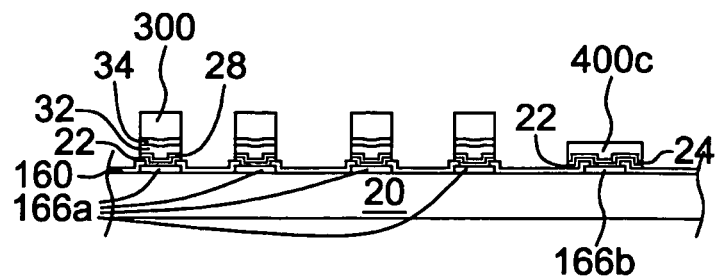

Referring to FIG. 8*l*, remove patterned photoresist layer 30 and the portions of seed layer 28 and adhesive/barrier layer 22 that are not below metal layer 300. To remove seed layer 28 made of copper, $NH_3^+$ or $SO_4^{2+}$ is used to etch the copper. And to remove adhesive/barrier layer 22, dry etching or wet etching can be used. Dry etching involves using reactive ion etching or Argon sputter etching. On the other hand, when using wet etching, if adhesive/barrier layer 22 is made of Ti/W alloy, hydrogen peroxide can be used to remove the layer, and if adhesion/barrier layer 22 is made of Ti, HF containing solution can be used to remove the layer. Meanwhile, the multiple metal layers, such as metal layer 34, metal layer 32, seed layer 28, and adhesive/barrier layer 22, below metal layer 300 are the under bump metal structure 250 shown in FIG. 8 and the seed layer 28 and adhesion/barrier layer 24 below metal layer 400*c* are the under bump metal structure 260 show in FIG. 8 respectively. In the manufacturing of this embodiment, under bump metal structure 250 is a TiW/Cu/Ni structure, and under bump metal structure 260 is a TiW/Au seed layer.

Figure 8M:
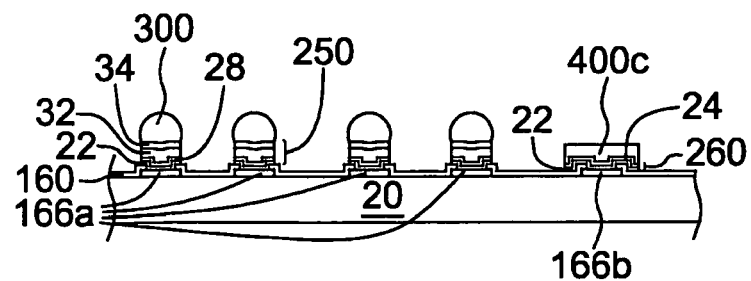

Referring to FIG. 8*m*, solder layer 300 collates into a semisphere through the process of reflow in an environment containing oxygen less than 20 ppm.

Figure 8N:
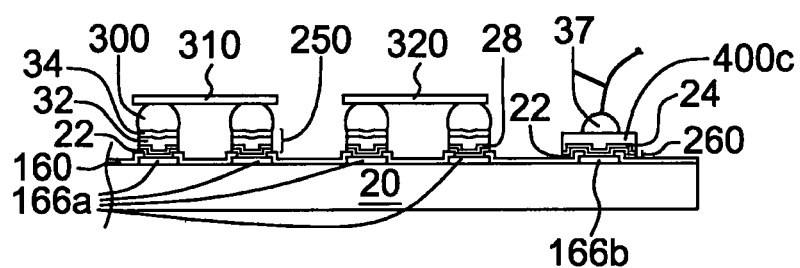

Referring to FIG. 8*n*, mount external device 310 and external device 320 separately on solder layer 300. In this embodiment, external devices 310 and 320 are passive devices, which include inductors, capacitors, or integrated passive devices. In the present invention, external devices 310 and 320 are two different passive devices. For example, external device 310 may be a capacitor, while external device 320 may be an inductor, or external device 310 may be an integrated passive device, while external device 320 may be an inductor. External devices 310 and 320 each have multiple contact points (not shown in figure). On the surface of these multiple contact points, there are metals suited for mounting on metal layer 300. For example, the surface of contact points may have a soldering material layer such as tin containing layer or a solder wetting layer such as gold layer.

The dimensions of external devices 310 and 320 may be chosen from industrial standard dimension 1210, dimension 0603, dimension 0402, or dimension 0201, wherein said dimension 0201 stands for 0.02 inches by 0.01 inches, and dimension 1210, dimension 0603, and dimension 0402 deduced with the same standard. In general, external devices 310 and 320 have a length between 0.2 mm and 5 mm, a width between 0.1 mm and 4 mm, and a height between 0.01 mm and 2 mm.

The next steps will be a dicing procedure, where substrate 100 is first i sawed into multiple chips. Next, a wire 37 is formed by wire-bonding on metal layer 400*c*, which is on pad 166*b*, and said wire 37 is used to connect to external circuits or power supplies.

Also, external devices 310 and 320 can be mounted after dicing procedures are performed on substrate 100.

Manufacturing method 2 of Embodiment 2:

Manufacturing method 2 differs from manufacturing method 1 in that solder layer 300 is provided by external devices 310 and 320 or external adding during mounting process of device 310 and 320. In other words, before mounting with external devices 310 and 320, the structure does not have a solder layer 300 on the under bump metal structure 250. The following is a detailed description of the manufacturing process.

Figure 8O:
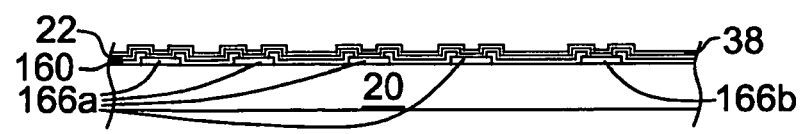

Continuing from FIG. 8*b* and referring to also FIG. 8*o*, a seed layer 38 is formed on adhesive/barrier layer 22 with a thickness between 0.05 micrometers and 1 micrometers (and an optimal thickness between 0.1 micrometers and 0.7 micrometers. In this embodiments, seed layer 38 is made of Cu. Similar to seed layer 170 described above, the material used for seed layer 38 will vary according to the material of metal layers formed later.

Figure 8P:
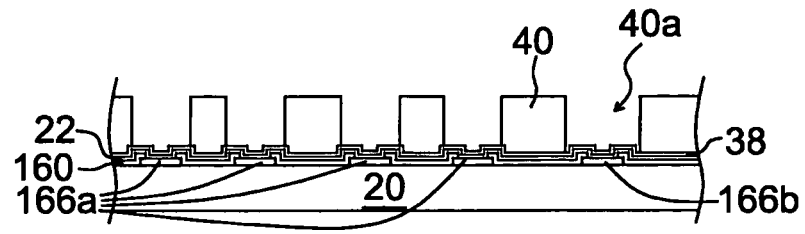

Referring to FIG. 8*p*, photoresist layer 40 is formed on seed layer 38, and through spin coating, exposure and development, photoresist layer 40 is patterned, forming multiple photoresist layer openings 40*a* in photoresist layer 40, which separately reveal portions of seed layer 24 that are over pad 166*b* and pad 166*a*.

Figure 8Q:
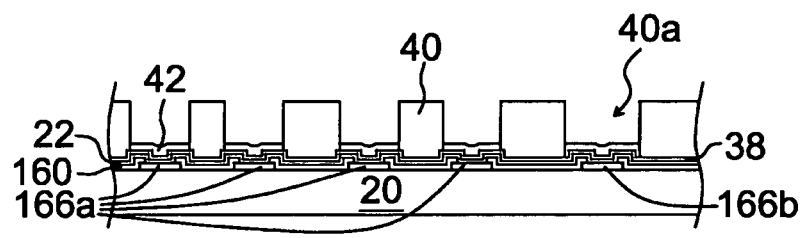

Referring to FIG. 8*q*, metal layer 42 is formed by an electroplating method on seed layer 38, which is in photoresist layer opening 40*a*. The metal layer 42 consists of materials such as gold, copper, silver, palladium, rhodium, ruthenium, rhenium, or nickel, and may have a single metal layer structure or multiple metal layer structure. The thickness of metal layer 42 is between 1 micrometers and 100 micrometers, with optimal thickness between 1.5 micrometers and 15 micrometers. In this embodiment, metal layer 42 is made of copper.

Figure 8R:
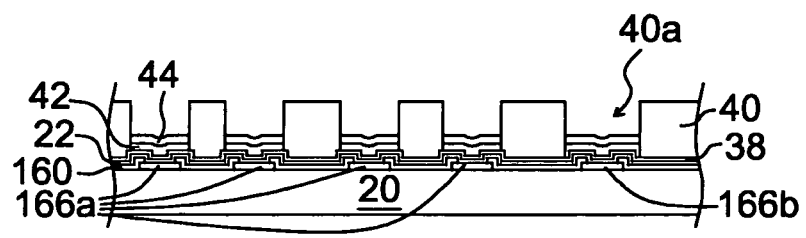

Referring to FIG. 8*r*, a metal layer 44 is formed by an electroplating method on metal layer 42, which is in photoresist layer opening 40*a*. The metal layer 44 is made of nickel, and has a thickness between 0.5 micrometers and 100 micrometers, with optimal thickness between 1 micrometer and 5 micrometers.

Figure 8S:
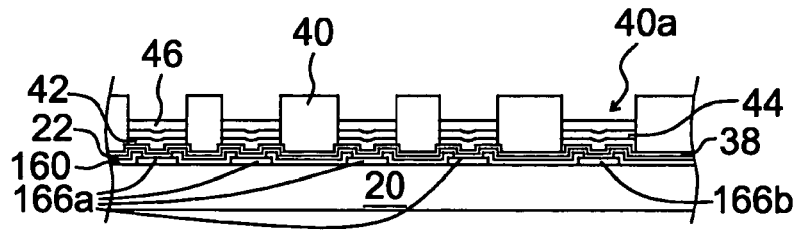

Referring to FIG. 8*s*, a metal layer 46 is formed by an electroplating or electroless-plating method on metal layer 44, which is in photoresist layer opening 40*a*. The metal layer 46 consists of materials such as gold, silver, palladium, rhodium, ruthenium, or rhenium, and has a thickness between 0.03 micrometers and 2 micrometers, with optimal thickness between 0.05 micrometer and 0.5 micrometers. In this embodiment, the material of metal layer 46 is gold (Au).

Figure 8T:
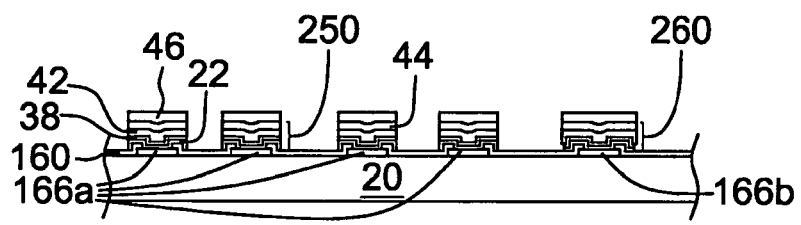

Referring to FIG. 8*t*, remove patterned photoresist layer 40 and the portions of seed layer 44 and adhesive/barrier layer 22 that are not below metal layer 46. To remove seed layer 24 made of copper, a $NH_3^+$ or $SI_4^{2+}$ containing solution is used to etch the copper. To remove adhesive/barrier layer 22, dry etching or wet etching can be used. Dry etching involves using reactive ion etching or Argon sputter etching. On the other hand, when using wet etching, if adhesive/barrier layer 22 is made of Ti/W alloy, hydrogen peroxide can be used to remove the layer, and if adhesion/barrier layer 22 is made of Ti, HF containing solution can be used to remove the layer.

Figure 8U:
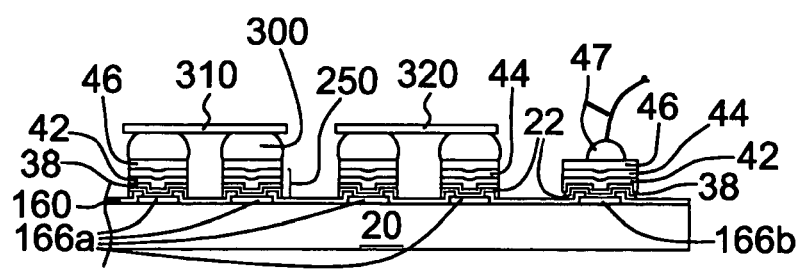
Figure 8A:
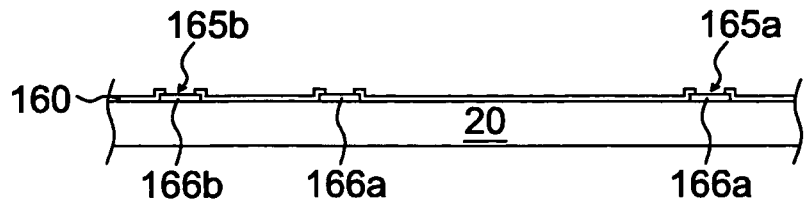
Figure 8A:
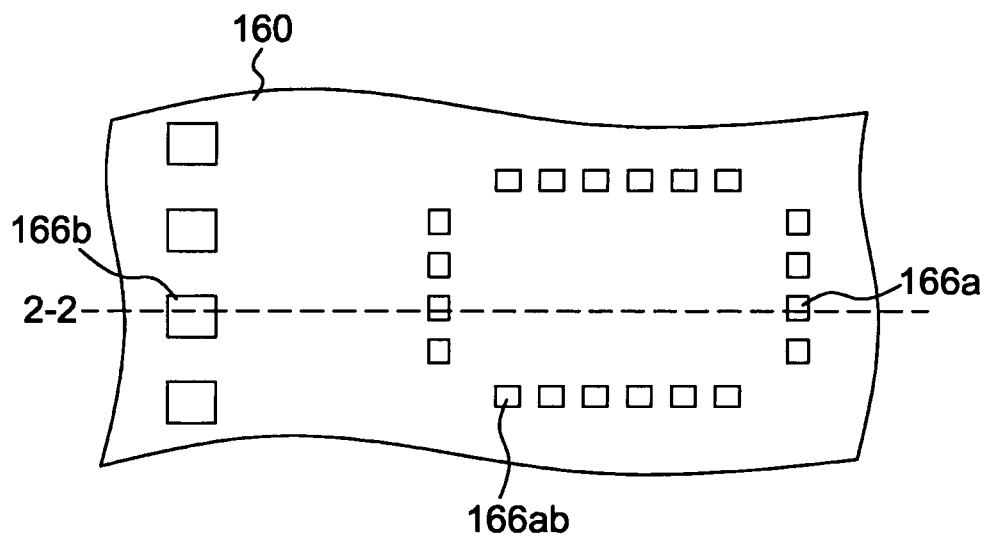
Figure 8A:
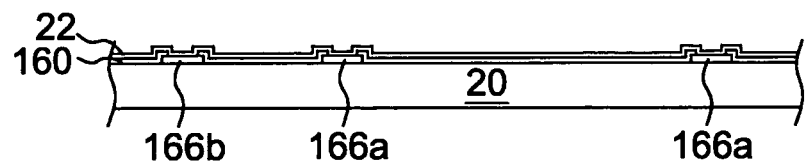
Figure 8A:
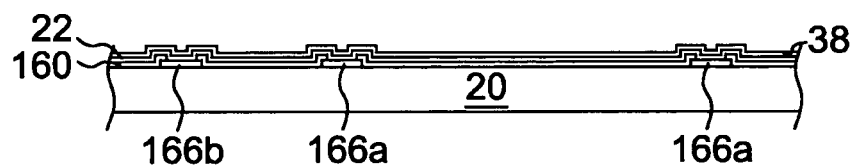
Figure 8A:
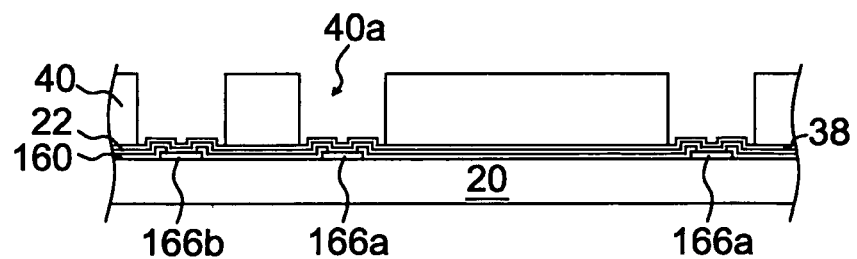
Figure 8A:
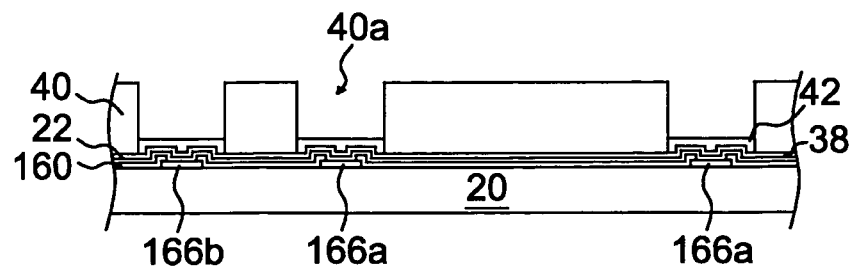
Figure 8A:
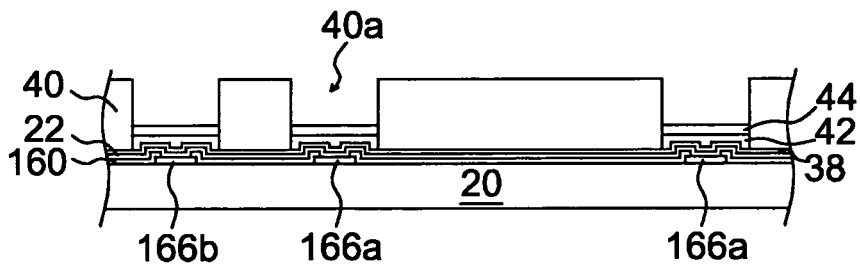
Figure 8A:
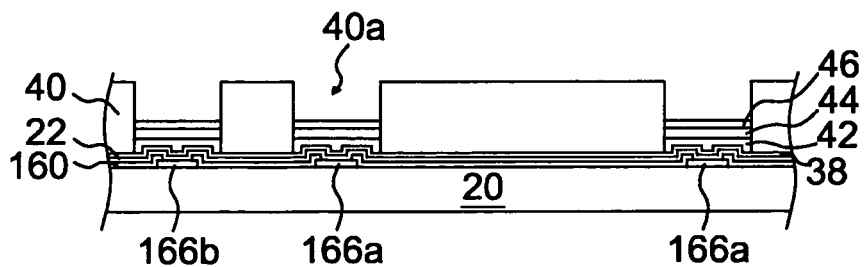
Figure 8A:
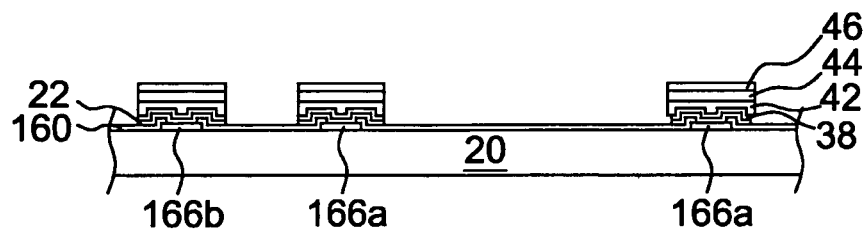
Figure 8A:
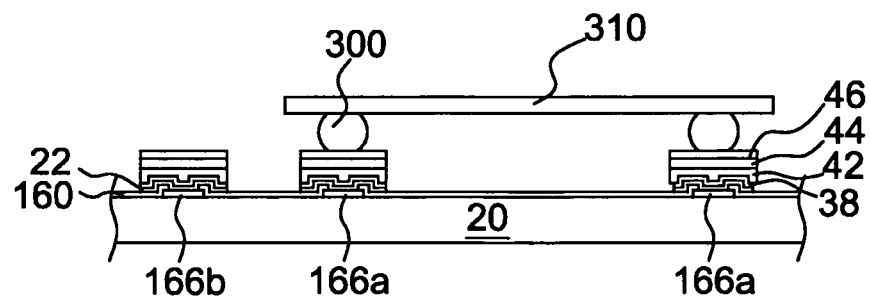
Figure 8A:
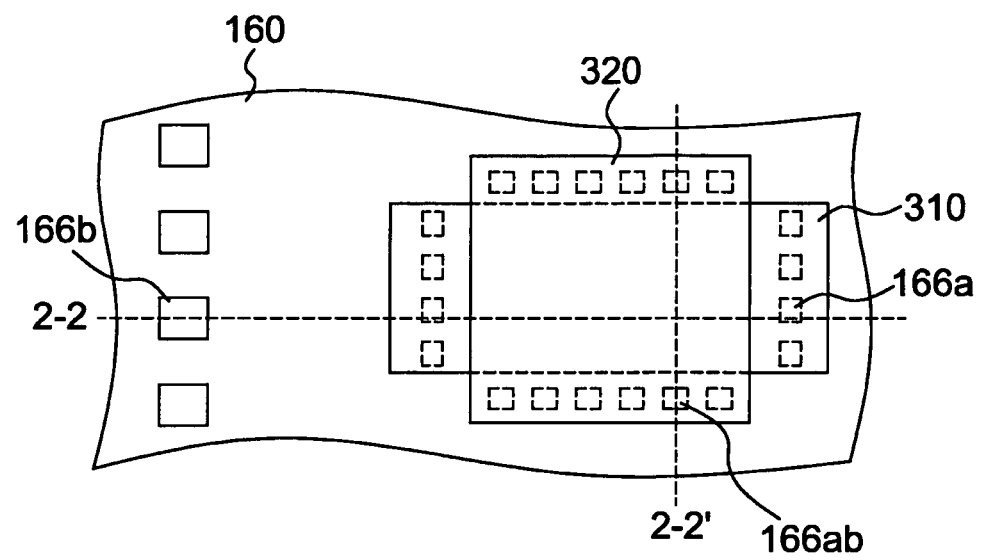
Figure 8A:
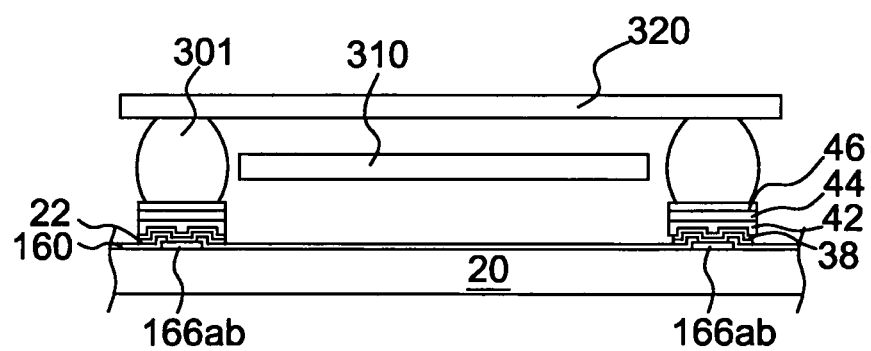
Figure 8A:
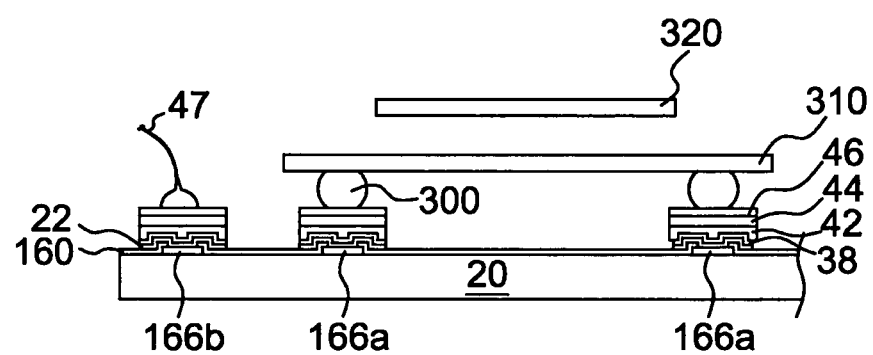

Referring to FIG. 8u, connect external device 310 and external device 320 separately on solder layer 300. The external devices 310 and 320 contain a solder layer 300, or forming a solder layer 300 on metal layer 46 by screen printing method, and through this solder layer 300, external devices 310 and 320 are mounted to metal layer 46.

In this embodiment, external devices 310 and 320 are passive devices, which include inductors, capacitors, or integrated passive devices. In the present invention, external devices 310 and 320 are two different passive devices. For example, external device 310 may be a capacitor, while external device 320 may be an inductor, or external device 310 may be an integrated passive device, while external device 320 may be an inductor. External devices 310 and 320 each have multiple contact points (not shown in figure). On the surface of these multiple contact points, there are metals suited for mounting on metal layer 300. For example, the surface of contact points may have a soldering material layer or a solder wetting layer such as gold layer.

The dimensions of external devices 310 and 320 may be chosen from industrial standard dimension 1210, dimension 0603, dimension 0402, or dimension 0201, wherein said dimension 0201 stands for 0.02 inches by 0.01 inches, and dimension 1210, dimension 0603, and dimension 0402 deduced with the same standard. In general, external devices 310 and 320 have a length between 0.2 mm and 5 mm, a width between 0.1 mm and 4 mm, and a height between 0.01 mm and 2 mm.

The next step is a dicing procedure, where substrate 100 is sawed into multiple chips. Then, a wire 47 is conducted by wire-bonding on metal layer 46, which is on pad 166b, and said wire 47 is used to connect to outside circuits or power supplies.

Also, external devices 310 and 320 can be mounted after dicing procedures are performed on substrate 100.

Manufacturing method and structure 3 of Embodiment 2:

Referring to FIG. 8aa and FIG. 8ab, FIGS. 8aa is a cross-sectional view cut along the line 2-2 in FIG. 8ab. Integrated circuit 20 represents all structures below passivation layer 160. Also included in integrated circuit 20 is substrate 100, devices 110, 112, 114, first dielectric layer 150, metal layers 140, second dielectric layer 155, metal contact 120, and via 130, wherein multiple passivation layer openings 165a and openings 165b in passivation layer 160 reveal multiple pads 166a, pads 166b and 166ab. Multiple metal pads 166a and 166b are designed in a rectangle preferentially.

Referring to FIG. 8ac, an adhesion/barrier layer 22 is formed on passivation layer 160, pad 166a and 166b and 166b by using sputtering method. The thickness of adhesion/barrier layer 22 is between 0.1 micrometers and 1 micrometer, with an optimal thickness between 0.3 micrometers and 0.8 micrometers. The adhesion/barrier can be selected from or composed of the following materials, Ti, TiW, TiN, Ta, TaN, Cr, and Mo. Ti and/or TiW are the preferred material for adhesion/barrier.

Referring to FIG. 8ad, a seed layer 38 with a thickness between 0.05 micrometers and 1 micrometers (and an optimal thickness between 0.1 micrometers and 0.7 micrometers) is then formed on adhesion/barrier layer 22. Similar to seed layer 170 described above, the material used for seed layer 38 will vary according to the material of metal layers formed later. The material of seed layer 38 can be Cu, Au or Ag. Cu is the preferred seed layer material in this embodiment.

Referring to FIG. 8ae, photoresist layer 40 is formed on seed layer 38, and through spin coating, exposure and development, photoresist layer 40 is patterned, forming multiple photoresist layer openings 40a in photoresist layer 40, which separately reveal portions of seed layer 38 that are over pad 166a and pad 166b.

Referring to FIG. 8af, metal layer 42 is formed by an electroplating method on seed layer 38, which is in photoresist layer opening 40a. The metal layer 42 consists of materials such as gold, copper, silver, palladium, rhodium, ruthenium, or rhenium. The thickness of metal layer 42 is between 1 micrometers and 100 micrometers, with optimal thickness between 1.5 micrometers and 15 micrometers. In this embodiment, metal layer 42 is preferred to be a single layer made of copper.

Referring to FIG. 8ag, metal layer 44 is formed by an electroplating method on metal layer 42, which is in photoresist layer opening 40a. The metal layer 44 consists of nickel preferentially. The thickness of metal layer 44 is between 0.1 micrometers and 10 micrometers, with optimal thickness between 0.5 micrometers and 5 micrometers.

Referring to FIG. 8ah, metal layer 46 is formed by an electroplating method on metal layer 44, which is in photoresist layer opening 40a. The metal layer 46 consists of materials such as gold, copper, silver, palladium, rhodium, ruthenium, or rhenium. The thickness of metal layer 46 is between 0.03 micrometers and 5 micrometers, with optimal thickness between 0.05 micrometers and 1.5 micrometers. In this embodiment, metal layer 46 is preferred to be a single layer made of gold.

Referring to FIG. 8ai, remove patterned photoresist layer 40 and the portions of seed layer 38 and adhesive/barrier layer 22 that are not below metal layer 46. To remove seed layer 38 made of copper, $NH_3^+$ or $SO_4^{2+}$ containing solution is used to etch the copper. To remove adhesive/barrier layer 22, dry etching or wet etching can be used. Dry etching involves using reactive ion etching or Argon sputter etching. On the other hand, when using wet etching, if adhesive/barrier layer 22 is made of Ti/W alloy, hydrogen peroxide can be used to remove the layer, and if adhesion/barrier layer 22 is made of Ti, HF containing solution can be used to remove the layer.

Referring to FIG. 8aj, connect external device 310 on the metal layer 46, which is over the pads 166a. The external devices 310 have a solder layer 300, or forming a solder layer 300 on metal layer 46 by screen printing, and through this solder layer 300, external devices 310 are mounted on metal layer 46.

Referring to FIG. 8ak and FIG. 8al, FIGS. 8al is a cross-sectional view cut along the line 2-2' in FIG. 8ak. Connect external device 320 on the metal layer 46, which is over the pads 166ab and the external device 320 is also over the external device 310. The external devices 320 have a solder layer 301, or forming a solder layer 301 on metal layer 46 by screen printing, and through this solder layer 301, external devices 320 are mounted on metal layer 46.

Referring to FIG. 8am, perform a dicing process to singular each chip, where substrate 100 is sawed into multiple chips. Next, a wire 47 is formed by wire-bonding on metal layer 46, which is on pad 166b, and said wire 47 is used to connect to outside circuits or power supplies.

Also, external devices 310 and 320 can be mounted after dicing procedures are performed on substrate 100.

Embodiment 3

Figure 9:
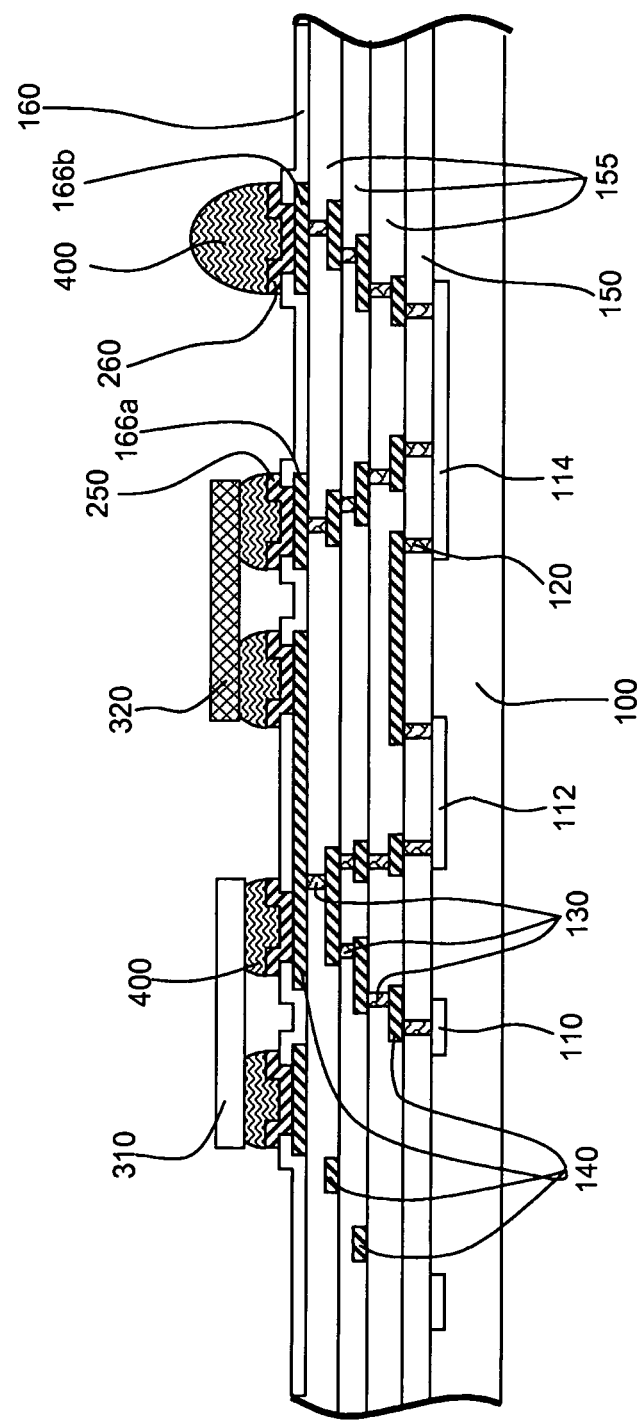
FIG. 9 shows the semiconductor chip of Embodiment 3.

Referring to FIG. 9, Embodiment 3 is similar to Embodiment 2, with the difference being the material and thickness of connecting metal layer 400. In Embodiment 3, solder layer 400 is constructed on pad 166a and 166b. The following is a description of the formation of the structure of Embodiment 3.

Figure 9A:
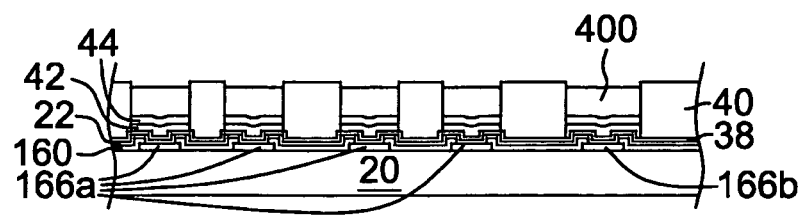
FIGS. 9a to 9d show the processes of the semiconductor chip of Embodiment 3.

Manufacturing method of Embodiment 3:

Embodiment 3 can continue from FIG. 8r of manufacturing method 2 of Embodiment 2. Referring to FIG. 9a, a solder layer 400 is formed on metal layer 44 in photoresist layer opening 40a by an electroplating method. The thickness of solder layer 400 is between 30 micrometers and 350 micrometers. Chosen materials of solder layer 400 include tin/silver, tin/copper/silver, and tin/lead alloy.

Figure 9B:
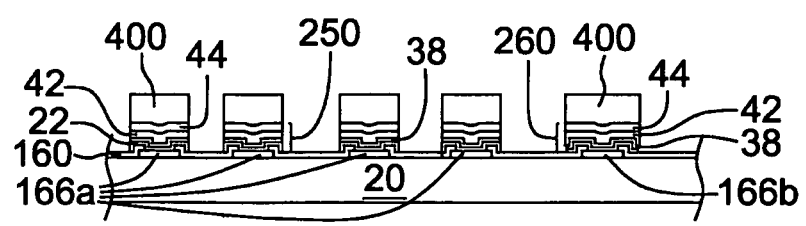

Referring to FIG. 9b, remove patterned photoresist layer 40 and the portions of seed layer 38 and adhesive/barrier layer 22 that are not below solder layer 400. To remove seed layer 38 made of copper, $NH_3^+$ or $SO_4^{2+}$ containing solution is used to etch the copper.

Figure 9C:
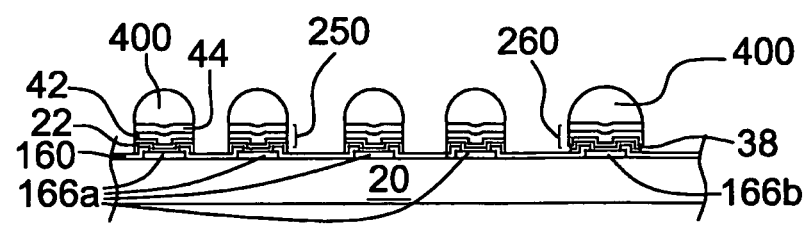

Referring to FIG. 9c, use a reflow process as previous description for FIG. 8m so that solder layer 400 will reach melting point and aggregate into a semi-spherical shape.

Figure 9D:
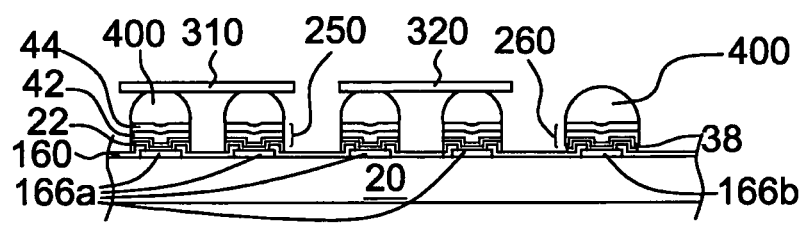

Referring to FIG. 9d, external device 310 and external device 320 are separately mounted to solder layer 400 over pad 166a. In this embodiment, external devices 310 and 320 are passive devices, which include inductors, capacitors, and integrated passive devices. In the present invention, external devices 310 and 320 are two different passive devices. For example, external device 310 may be a capacitor, while external device 320 may be an inductor, or external device 310 may be an integrated passive device, while external device 320 may be an inductor.

The dimensions of external devices 310 and 320 may be chosen from industrial standard dimension 1210, dimension 0603, dimension 0402, or dimension 0201, wherein said dimension 0201 stands for 0.02 inches by 0.01 inches, and dimension 1210, dimension 0603, and dimension 0402 deduced by the same standard. In general, external devices 310 and 320 have a length between 0.2 mm and 5 mm, a width between 0.1 mm and 4 mm, and a height between 0.01 mm and 2 mm.

Embodiment 4

Figure 10:
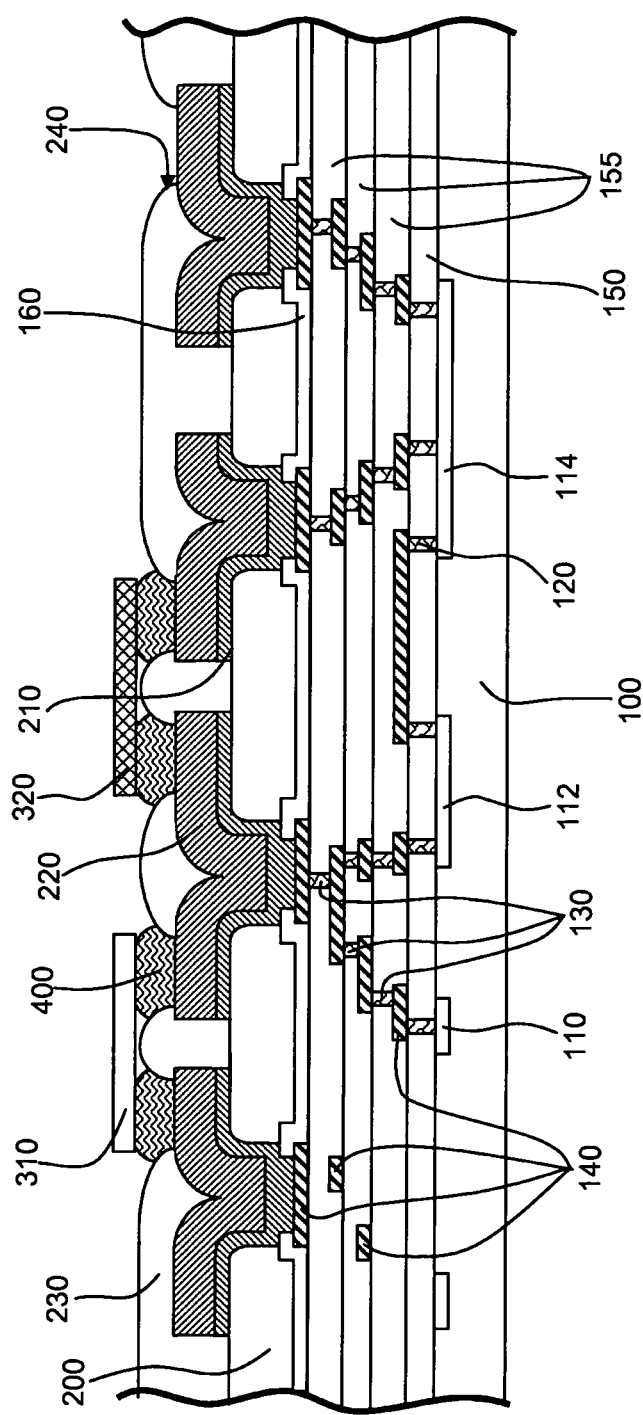
FIG. 10 shows the semiconductor chip of Embodiment 4.

Referring then to FIG. 10, in the semiconductor chip structure revealed by this embodiment, a first polymer layer 200 on passivation layer 160 can be optionally formed. Said first polymer layer 200 has a thickness between 3 micrometers and 25 micrometers and is made of materials such as polyimide (PI), benzocyclobutene (BCB), parylene, epoxy resins, elastomers, and porous dielectric material. The following is a description of the formation of the structure of Embodiment 3.

Figure 10A:
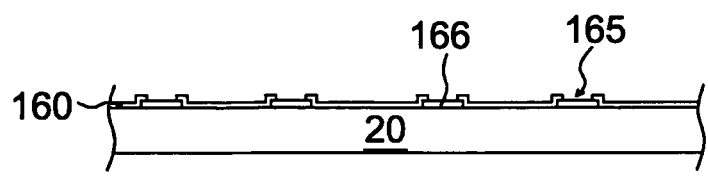
FIGS. 10a to 10i show the processes of the semiconductor chip of Embodiment 4.

Manufacturing method of Embodiment 4:

Referring to FIG. 10a, integrated circuit 20 is used to represent various structures below passivation layer 160. Integrated circuit 20 includes substrate 100, devices 110, 112, 114, first dielectric layer 150, metal layers 140, second dielectric layer 155, metal contact 120, and metal via 130, wherein passivation layer 160 has multiple openings 165 that reveal multiple pads 166.

Figure 10B:
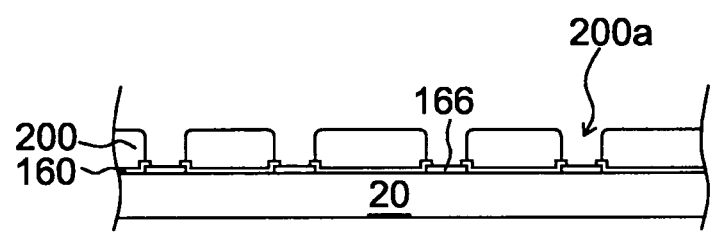

Referring to FIG. 10b, a photosensitive polymer layer 200 with a thickness between 3 micrometers and 25 micrometers is formed on passivation layer 160, and through spin coating, exposure and development, and O2 plasma ash or etching, polymer layer 200 is patterned, forming many openings 200a in polymer layer 200. These openings 200a reveal pad 166. Polymer layer 200 is then heated to a temperature between 150 and 390 degrees Celcius to cure polymer layer 200 so that said polymer layer 200 will harden. The material of polymer layer 200 can be chosen from polyimide (PI), benzocyclobutene (BCB), parylene, epoxy-based material, or ester type polymers, such as epoxy resins or photoepoxy SU-8 provided by Sotec Microsystems of Swiss Renens, or elastomers, such as silicone.

Figure 10C:
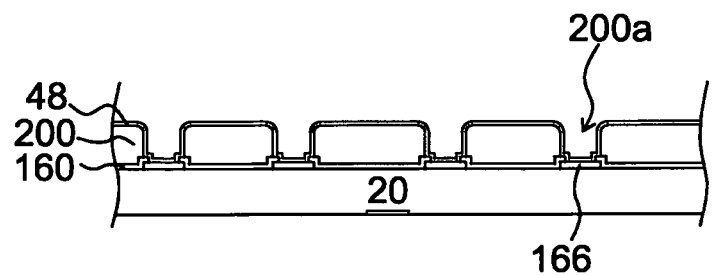

Referring to FIG. 10c, an adhesion/barrier layer 48 is formed on polymer layer 200 and pad 166 through a sputtering method. The thickness of the adhesion/barrier layer 48 is between 0.1 micrometer and 1 micrometer, with an optimal thickness between 0.2 micrometers and 0.5 micrometers. The material of adhesion/barrier layer 48 can be Ti, TiW, TiN, Ta, TaN or composite of the above metals.

Figure 10D:
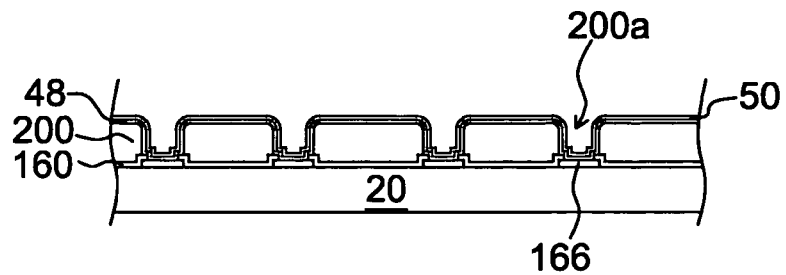

Referring to FIG. 10d, a seed layer 50 with a thickness between 0.05 micrometers and 1 micrometers (optimal thickness between 0.08 micrometers and 0.5 micrometers) is formed on the adhesion/barrier layer. The material of said seed layer 50 in this embodiment is gold (Au), but as in the description of seed layer 170 above, the material of seed layer 50 will vary depending on the material of the metal layer formed later on.

Figure 10E:
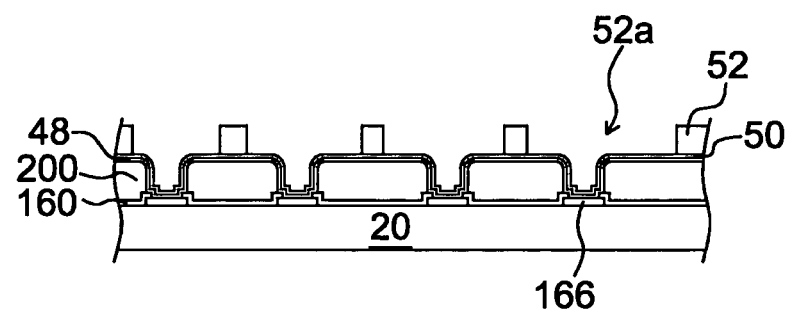

Referring to FIG. 10e, a photoresist layer 52 is formed on seed layer 50, and through spin coating, exposure and development a patterned photoresist layer 52 is formed, with multiple photoresist openings 52a on photoresist layer 52 that reveal seed layer 50 on pad 166.

Figure 10F:
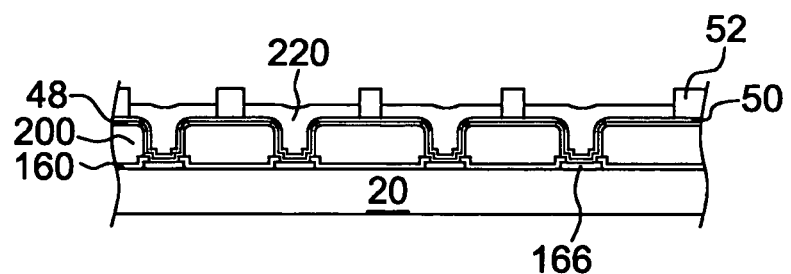

Referring to FIG. 10f, metal layer 220 is formed on seed layer 50 in photoresist layer opening 52a by an electroplating method. The material of metal layer 220 includes gold, copper, silver, palladium, platinum, rhodium, ruthenium, rhenium, or nickel, and may have a single metal layer structure or multiple metal layer structure. The thickness of metal layer 220 is between 2 micrometers and 25 micrometers, with optimal thickness between 3 micrometers and 10 micrometers. Furthermore, the structure of metal layer 220 with a multiple metal layer structure can include combinations such as Cu/Ni/Au, Cu/Au, Cu/Ni/Pd, and Cu/Ni/Pt. In this embodiment metal layer 220 is preferred a single gold layer.

Figure 10G:
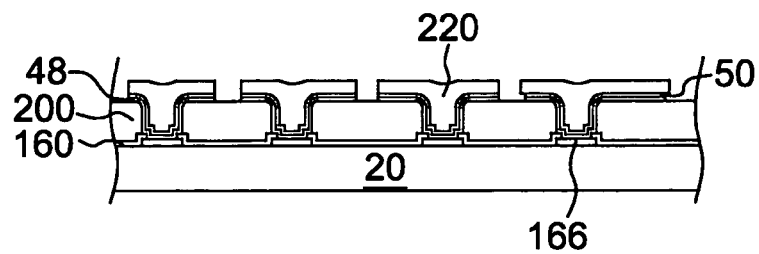

Referring to FIG. 10g, remove patterned photoresist layer 52 and portions of seed layer 50 and adhesive/barrier layer 48 that are not below metal layer 220. If seed layer 50 is made of gold, seed layer 50 is removed by using $I_2$ plus KI solution. On the other hand, hydrogen peroxide ($H_2O_2$) can be used to remove adhesive/barrier layer 48 if the material of the adhesion/barrier layer 48 is TiW. The portions of seed layer 50 and adhesive/barrier layer 48 under metal layer 220 correspond to label 210 in FIG. 10.

Figure 10H:
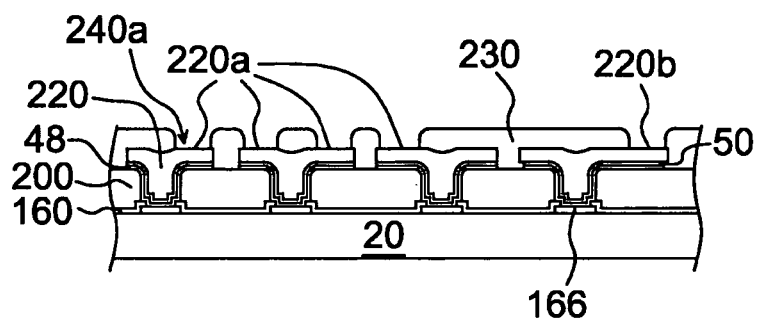

Referring to FIG. 10h, a photosensitive polymer layer 230 with a thickness between 3 micrometers and 25 micrometers is formed. Through spin coating, exposure, development, and O2 plasma ash or etching, to form many openings 240a in polymer layer 230, which expose metal layer 200. Next, polymer layer 230 is heated and cured. This curing process proceeds at a temperature between 150 degrees Celsius and 380 degrees Celsius. The material of polymer layer 230 can be chosen from polyimide (PI), benzocyclobutene (BCB), parylene, epoxy-based material, or ester type polymers, such as epoxy resins or photoepoxy SU-8 provided by Sotec Microsystems of Swiss Renens, or elastomers, such as silicone.

Metal layer 220 revealed by openings 240a is defined to be multiple pads 220a and one wire bonding pad 220b. Pad 220a can be used to connect to external devices 310 and external device 320, and wire binding pad 220b can be connected to external circuits or power supplies through wires formed by the wire bounding method. In this embodiment, external devices 310 and 320 are passive devices, which include, inductors, capacitors, and integrated passive devices. In the present invention, external devices 310 and 320 are two different passive devices. For example, external device 310 may be a capacitor, while external device 320 may be an inductor, or external device 310 may be an integrated passive device, while external device 320 may be an inductor.

The dimensions of external devices 310 and 320 may be chosen from industrial standard dimension 1210, dimension 0603, dimension 0402, or dimension 0201, wherein said dimension 0201 stands for 0.02 inches by 0.01 inches, and dimension 1210, dimension 0603, and dimension 0402 deduced by the same standard. In general, external devices 310 and 320 have a length between 0.2 mm and 5 mm, a width between 0.1 mm and 4 mm, and a height between 0.01 mm and 2 mm.

Figure 10I:
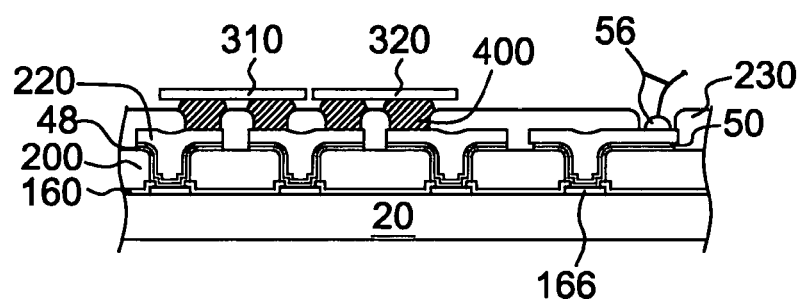

Referring to FIG. 10i, external device 310 and external device 320 are separately connected to pads 220a. External device 310 and external device 320 include a solder layer 400, with a thickness between 30 micrometers and 350 micrometers, and made of materials such as Sn/Ag, Sn/Cu/Ag, Sn/Au alloy, or other related materials. The said solder layer 400 may be provided by screen printing process instead of included in external devices. External device 310 and external device 320 are connected to pads 220a through solder layer 400 by using surface mount technology.

The next step is a dicing procedure, where substrate 100 is sawed into multiple chips. Then a wire 56 is formed by wire bounding on wire bonding pad 220b, and said wire 56 is used to connect wire bonding pad 220b to external circuits or power supplies.

Also, external devices 310 and 320 can be mounted after dicing procedures are performed on substrate 100 by using surface mount technology.

Embodiment 5

Figure 11A:
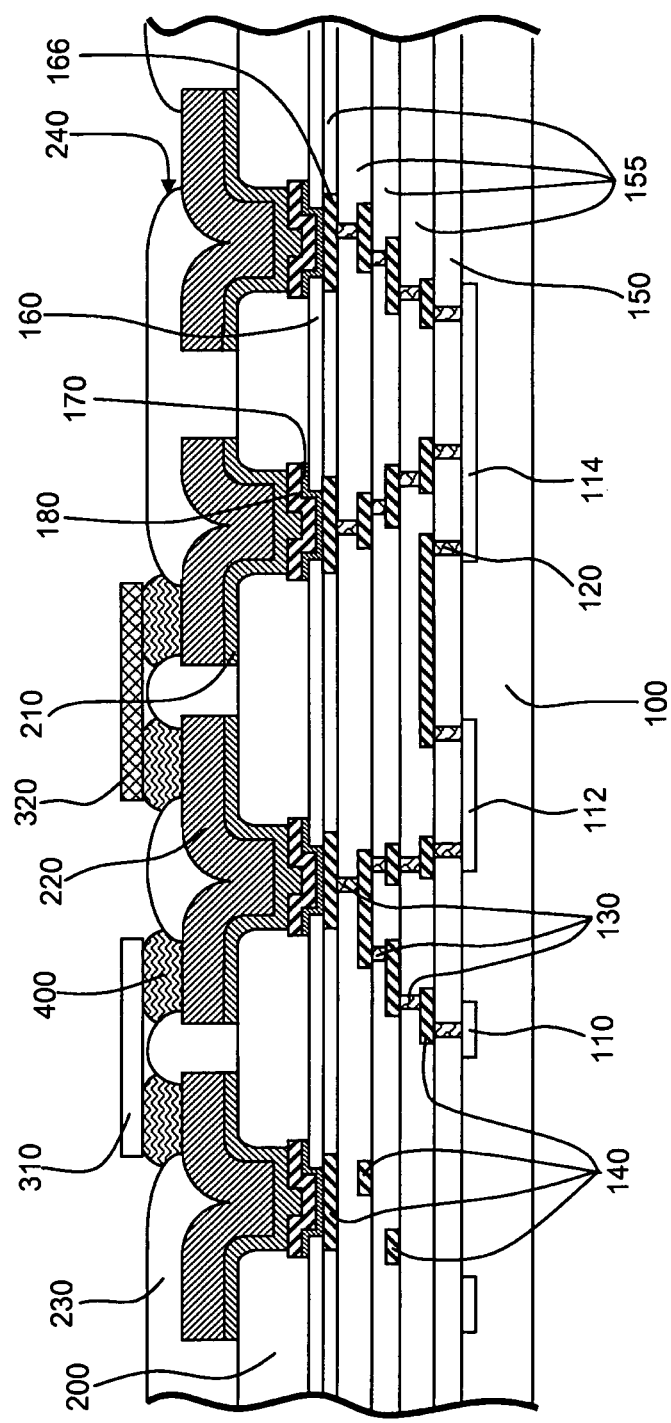
FIG. 11a shows the semiconductor chip of Embodiment 5.

Referring to FIG. 11a, the pad metal 166 of the circuit structure in above mentioned four embodiments is made of aluminum. However, in this fifth embodiment, the pad metal 166 is made of copper. When the pad metal 166 is made of copper, there needs to be a metal cap layer 170 to protect pad 166 revealed by passivation layer 160 openings, so that pad 166 will not be damaged by oxidation and can sustain later on processes such as wire bounding and flip-chip. The metal cap layer 170 is an aluminum-copper layer, a gold layer, a titanium (Ti) layer, a titanium tungsten alloy layer, a tantalum (Ta) layer, a tantalum nitride (TaN) layer, or a nickel (Ni) layer. When the metal cap is an aluminum-copper layer, a barrier layer (not shown in figure) is formed between the copper pad 166 and metal cap layer 170. This barrier layer can be titanium, titanium tungsten alloy, titanium nitride, tantalum, tantalum nitride, chromium, or nickel.

The manufacturing of under bump metal structure and mounting external devices in FIG. 11a is the same as that of the embodiment 4.

Embodiment 6

Figure 11B:
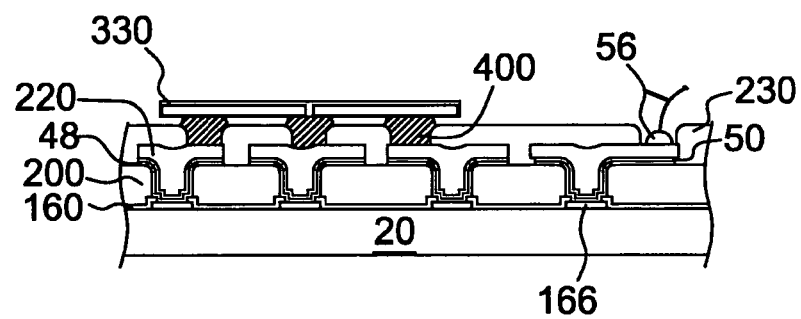
FIG. 11b shows the semiconductor chip of Embodiment 6.

Referring to FIG. 11b, the difference between Embodiment 6 and the first to fifth embodiments is that external devices are integrated into a single external device 330. For example, external device 330 can be an integrated passive device of a capacitor and an inductor. Except for external device 330, the manufacturing process and materials are all identical to those of the first to fifth embodiments. Therefore, the manufacturing process and materials of identical devices will not be repeated.

Figure 12:
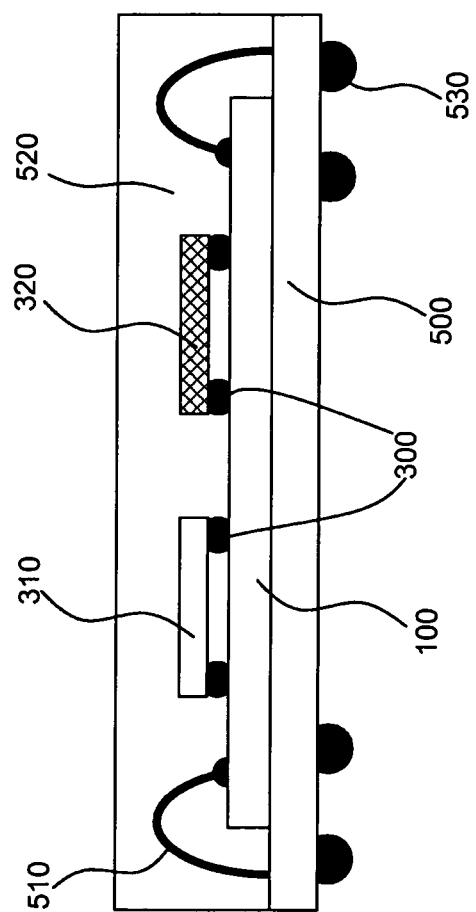
FIGS. 12 to 15 show the ball grid array (BGA) packaging structure of Embodiment 4.

All the semiconductor chip structures described in the above six embodiments can be packaged in the Ball Grid Array (BGA) as shown in FIGS. 12 to 15. FIGS. 12 to 15 reveal the packaging structure of a semiconductor chip package structure with only one semiconductor device. FIG. 12 explains one of the packaging structure of FIG. 7 of the Embodiment 1, FIG. 8 of Embodiment 2, FIG. 10 of Embodiment 4, and FIG. 11a of the Embodiment 5. The packaging structure of FIG. 12 includes electrically connecting the integrated circuit 20 to the BGA substrate 500 through wire 510, and sealing the above mentioned devices with molding compound 520. BGA substrate 500 has multiple solder balls 530 is electrically connected to outside circuits through these solder balls 530.

Figure 13:
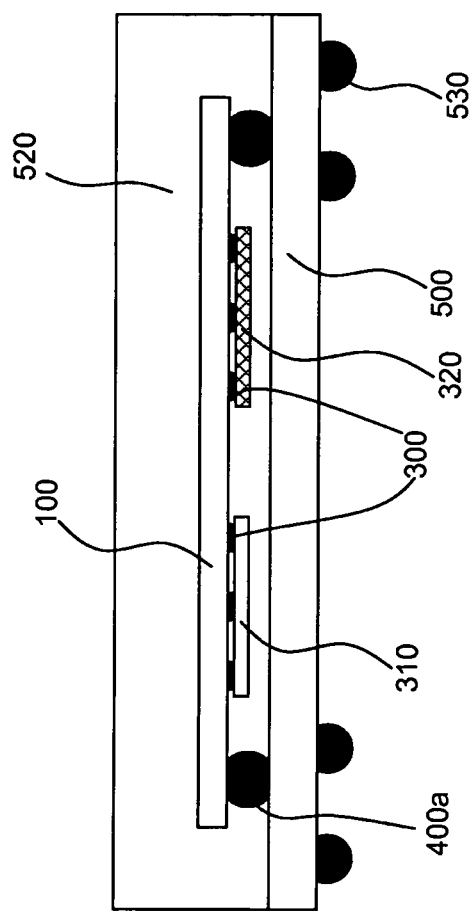

On the other hand, FIG. 13 describes one of the packaging structures of FIG. 9 in Embodiment 3. The integrated circuit 20 is electrically connected to BGA substrate 500 through solder layer 400. Then, the above mentioned devices are sealed with a molding compound 520, and the BGA substrate 500 is electrically connected to outside circuits through solder balls 530. Said molding compound 520 is a polymer such as epoxy resin or polyimide compound.

Figure 14:
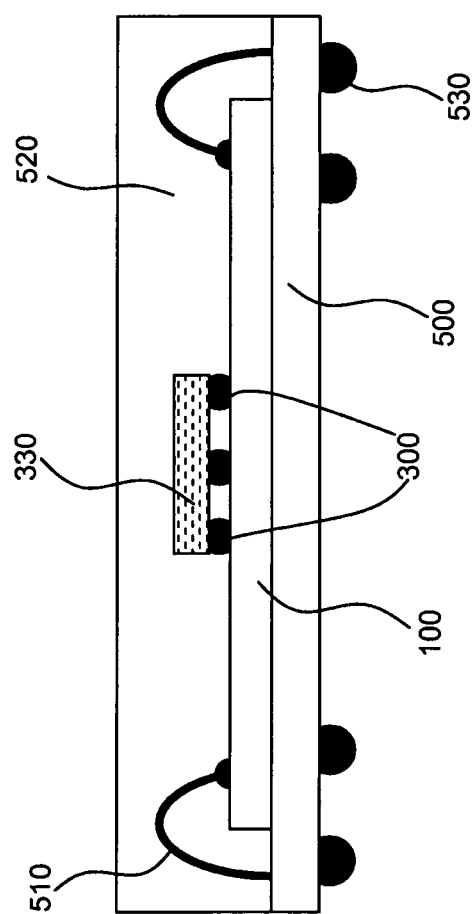
Figure 15:
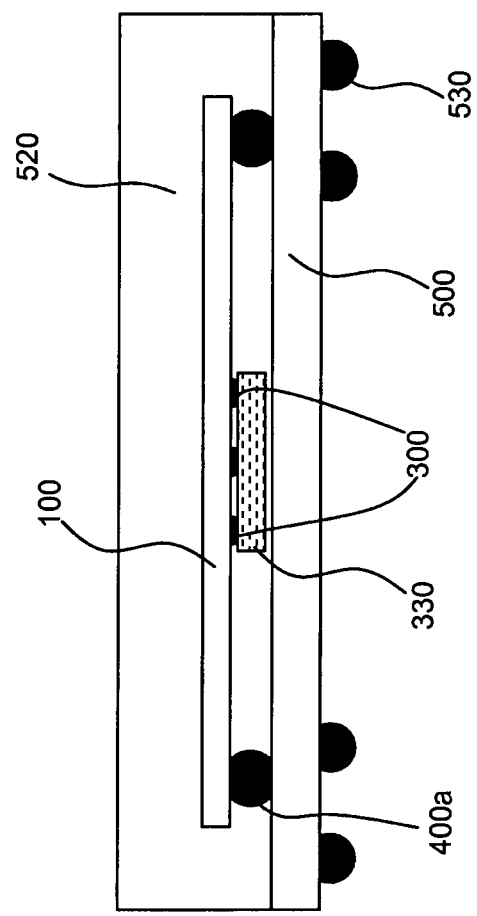

In FIG. 14 and FIG. 15, the external device 310 and 320 in FIGS. 12 and 13 are replaced by an integrated passive device 330 (such as in embodiment 6). In FIG. 14, the integrated circuit 20 is electrically connected to the BGA substrate 500 through wire 510, and in FIG. 15, it is electrically connected to the BGA substrate 500 through solder layer 400a.

Aside from above mentioned BGA packaging structure, the present invention can use common packaging form such as the Thin Small Outline Package (TSOP), Small Outline J-Lead (SOJ), s Quad Flat Package (QFP), Think Quad Flat Package (TQFP), or other common lead frame packaging form. As shown in FIG. 16a to 16f and FIG. 17a and 17f, the integrated circuit 20 is constructed on lead frame 600, which is made of copper or copper alloy and has a thickness between 100 micrometers and 2000 micrometers.

Figure 16A:
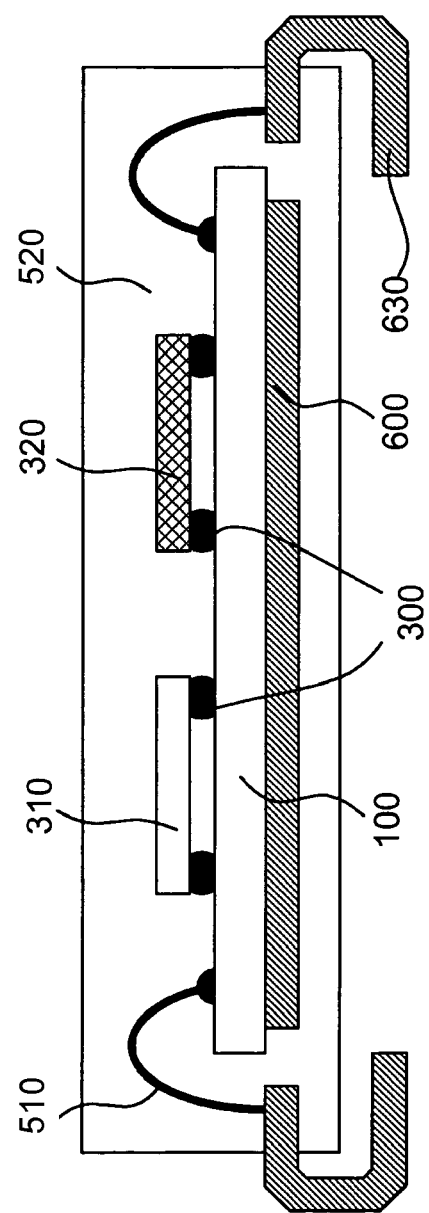
FIGS. 16a to 16c show the packaging structure of the semiconductor chip of Embodiment 1, Embodiment 2, Embodiment 4, and Embodiment 5 in the present invention.
Figure 16B:
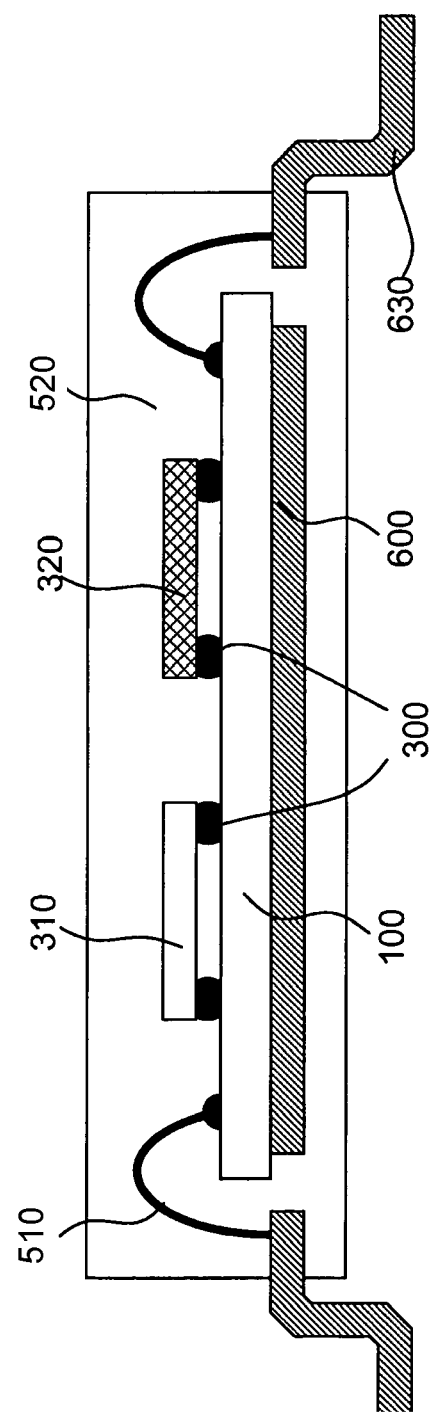
Figure 16C:
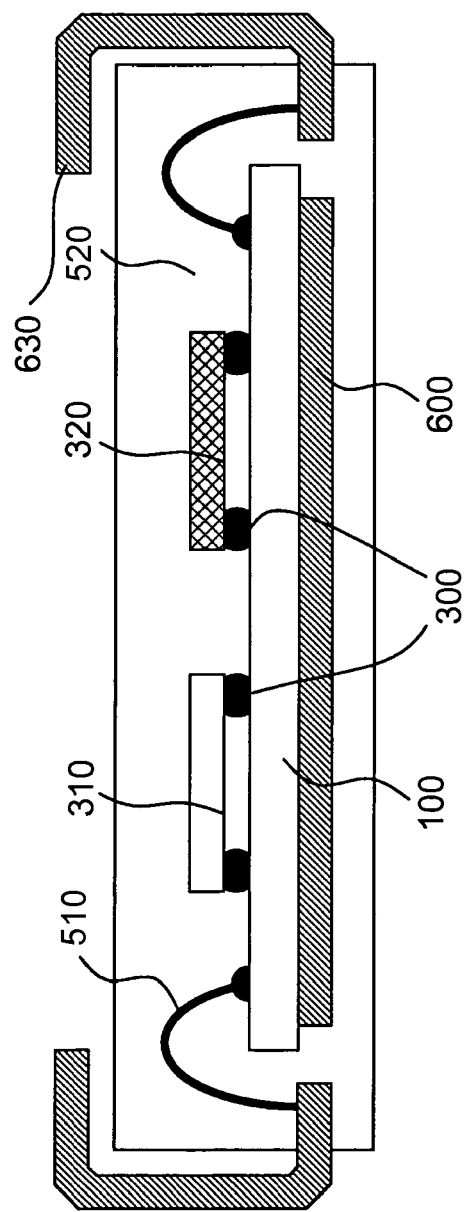

FIG. 16a to 16c describe the packaging structure of FIG. 7 of Embodiment 1, FIG. 8 of Embodiment 2, FIG. 10 of Embodiment 4, and FIG. 11a of Embodiment 5. Integrated circuit 20 is electrically connected to lead frame 600 through wire 510. The above mentioned devices are then sealed with a molding compound 520, but exposing the leads of lead frame 600. These leads are then connected to an outside circuit.

Figure 16D:
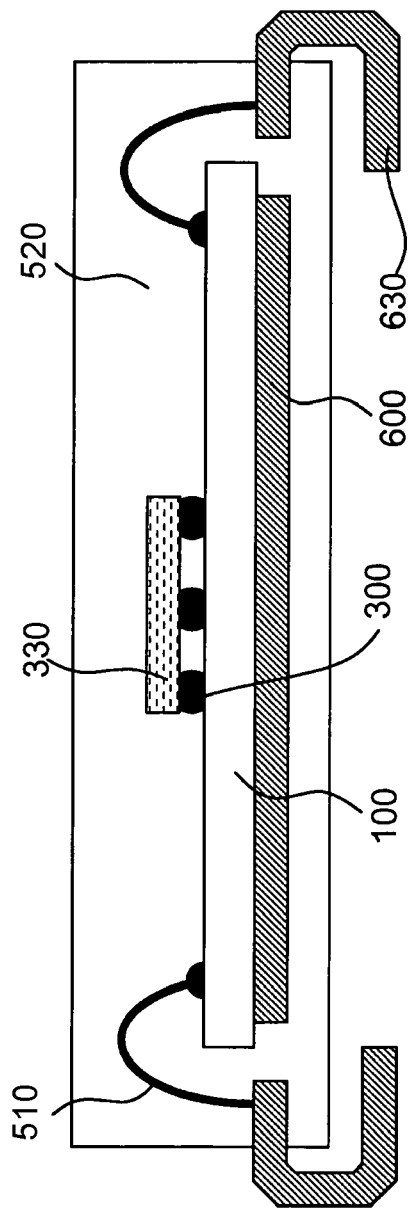
FIGS. 16d to 16f show the packaging structure of the semiconductor chip of Embodiment 6 in the present invention.
Figure 16E:
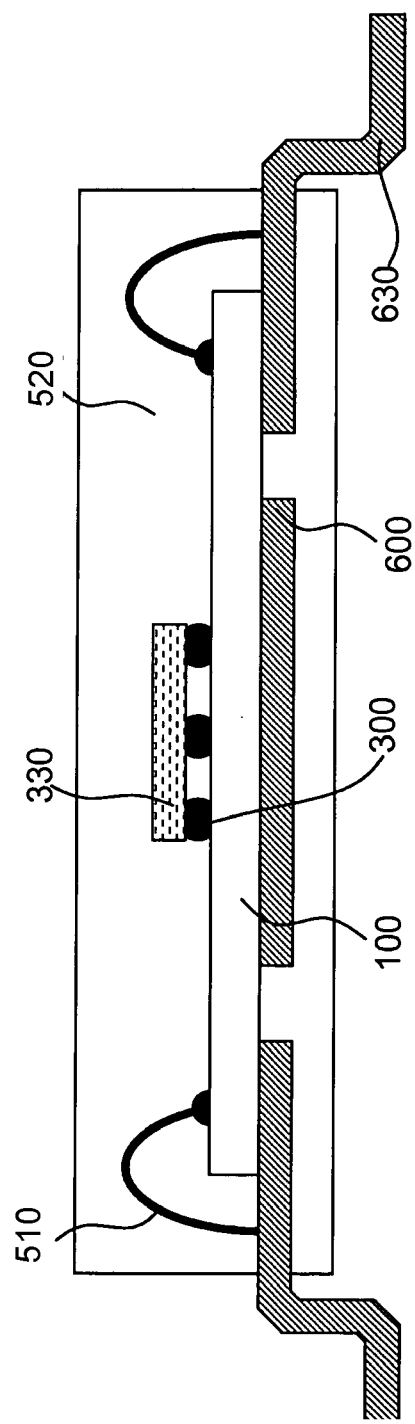
Figure 16F:
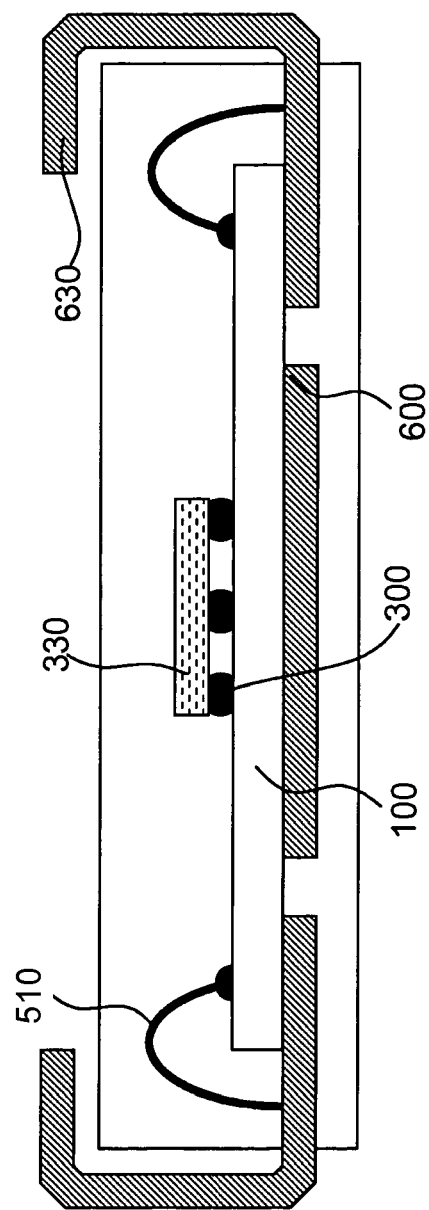

In FIGS. 16d to 16f, the external devices 310 and 320 in FIGS. 16a to 16c are replaced by an integrated device 330 (as in Embodiment 6).

Figure 17A:
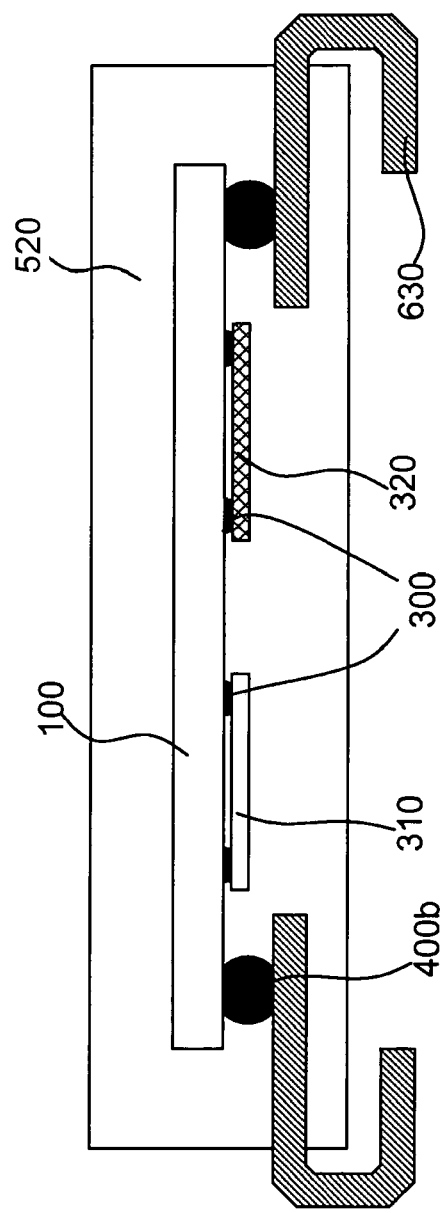
FIGS. 17a to 17c show the packaging structure of the semiconductor chip of Embodiment 3 in the present invention.
Figure 17B:
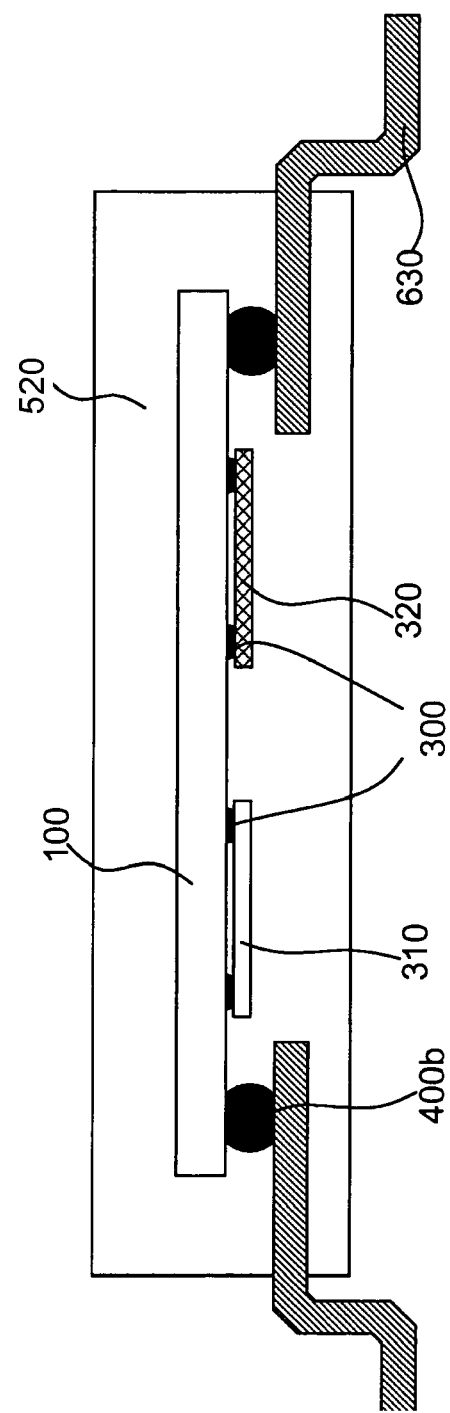
Figure 17C:
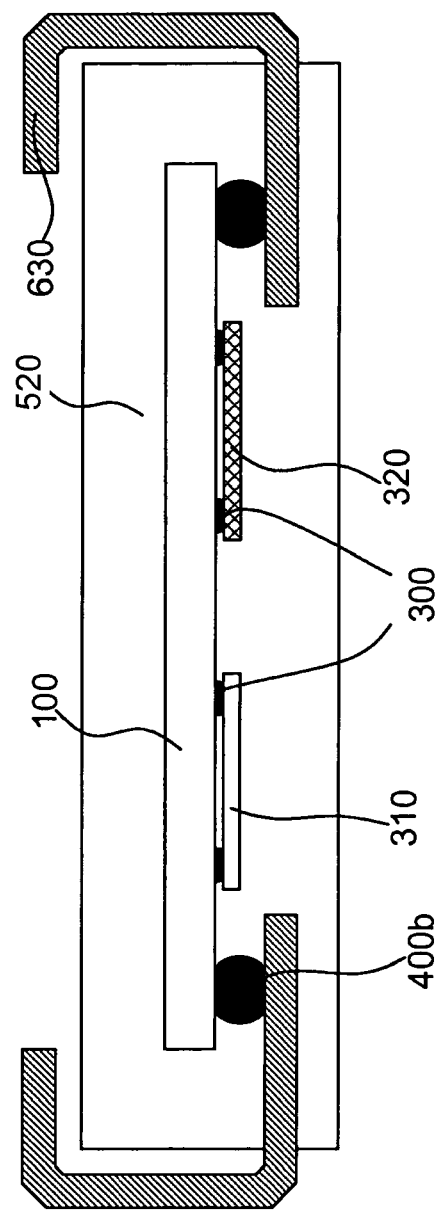

In FIGS. 17a to 17c another packaging structure of FIG. 9 in Embodiment 3 is shown. Integrated circuit 20 is electrically connected to lead frame 600 through solder layer 400b, and the above-mentioned devices are then sealed with molding compound 520, but exposing the leads of lead frame 600. These leads are then connected to other outside circuits. Said molding compound 520 is a polymer such as epoxy resin or polyimide compound.

Figure 17D:
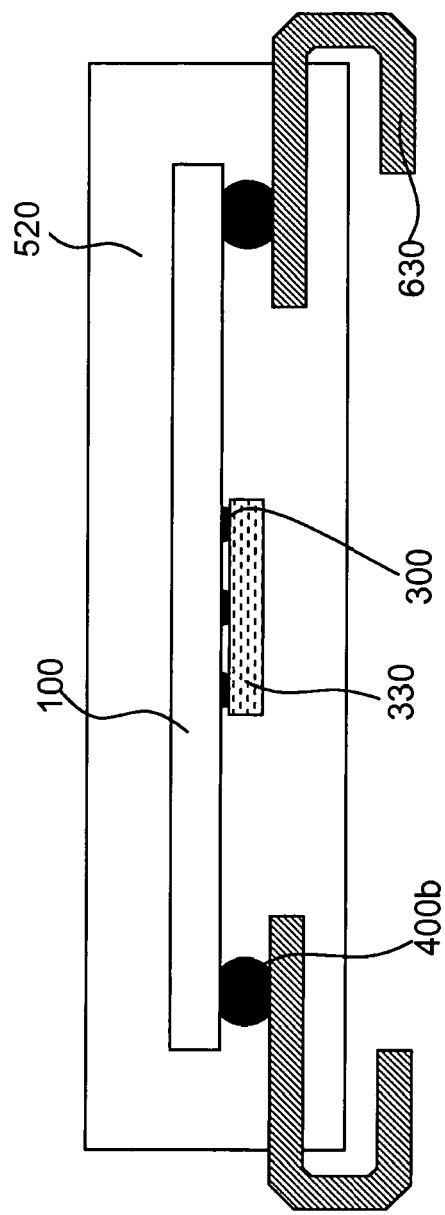
FIGS. 17d to 17f show the packaging structure of the semiconductor chip of Embodiment 6 in the present invention.
Figure 17E:
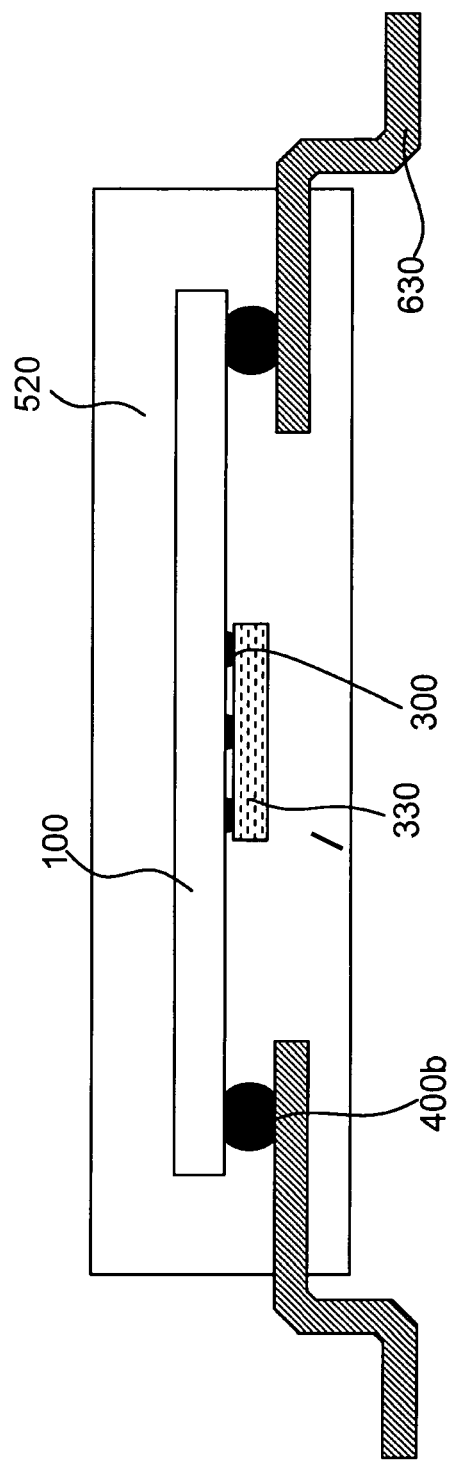
Figure 17F:
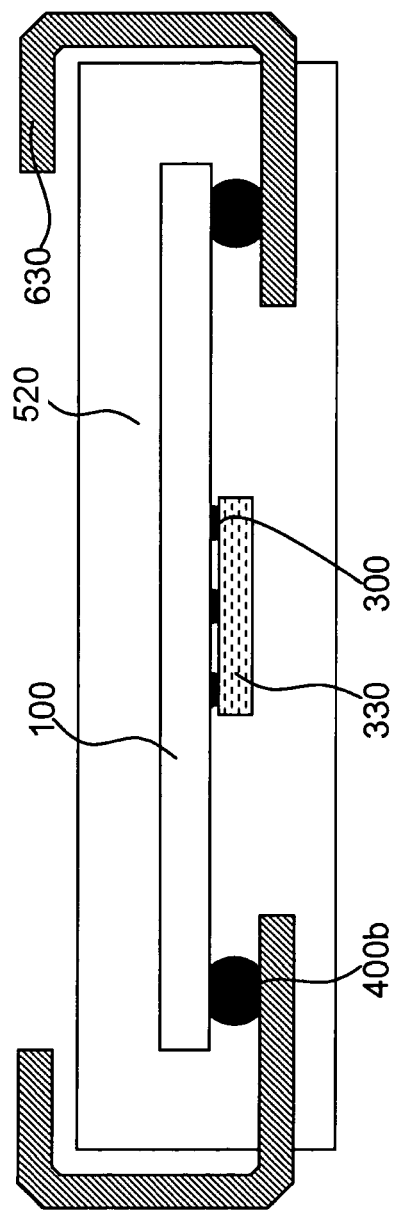

In FIGS. 17d to 17f, the external devices 310 and 320 in FIGS. 17a to 17c are replaced by an integrated device 330 (as in Embodiment 6).

The description up until this point has been of semiconductor chip structures. Following is the description and explanation of application circuits corresponding to the semiconductor chip structures. The application circuits include an internal circuit, an external circuit, and a metal connection which are all integrated on a single semiconductor chip.

Figure 18:
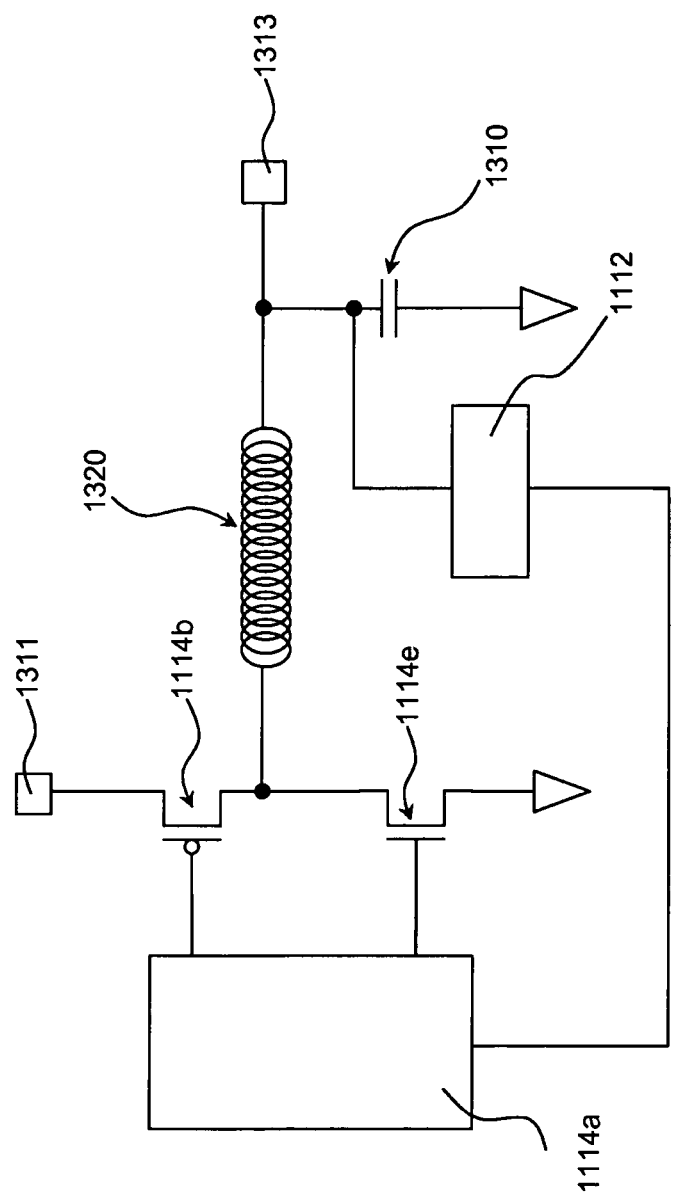
FIG. 18 is a view illustrating the equivalent circuit of the semiconductor chip of Embodiment 1 in the present invention.

In FIG. 18, the simplified equivalent circuit shown is similar to the application circuit shown in FIG. 7. Devices 112, and 114 in FIG. 7 correspond respectively to, and voltage feedback device 1112, and switch circuit including switch controller 1114*a* and switch MOS 1114*b*, 1114*e* in FIG. 18, and external devices 320 and 310 in FIG. 7 correspond respectively to inductor 1320 and capacitor 1310 in FIG. 18, wherein inductor 1320 and capacitor 1310 are connected and voltage feedback device 1112 is electrical connected between inductor 1320 and capacitor 1310. This voltage feedback device 1112 can feedback the voltage signal between inductor 1320 and capacitor 1310. In the circuit revealed by FIG. 18, a power supply input 1311 uses wire-bonded leads or solder layers on contact pads of the semiconductor chip to input power to MOS 1114*b*, which is below the passivation layer of the semiconductor chip. Feedback device 1112 then takes the voltage signal passing between inductor 1320 and capacitor 1310, and the voltage signal is transmitted back to switch controller 1114*a*. Switch controller 1114*a* then uses the signal to decide the on and off timing of the two MOS 1114*b* and 1114*e* located on the semiconductor chip, which allows switch controller 1114*a* to regulate the duty cycle of MOS 1114*b* and 1114*e* and therefore to regulate the voltage at output 1313. In the present invention, inductor 1320, capacitor 1310, switch controller 1114*a*, and voltage feedback device 1112 form the voltage regulator or converter. Therefore, according to different working voltage ranges of semiconductor chips, voltage regulator integrated with the semiconductor chip can use the described mechanism to regulate voltages immediately, using the shortest transfer path to transfer power supply to the semiconductor chip, allowing the voltage level of the semiconductor chip's power supply to be quickly regulated to a specific voltage range.

Figure 19:
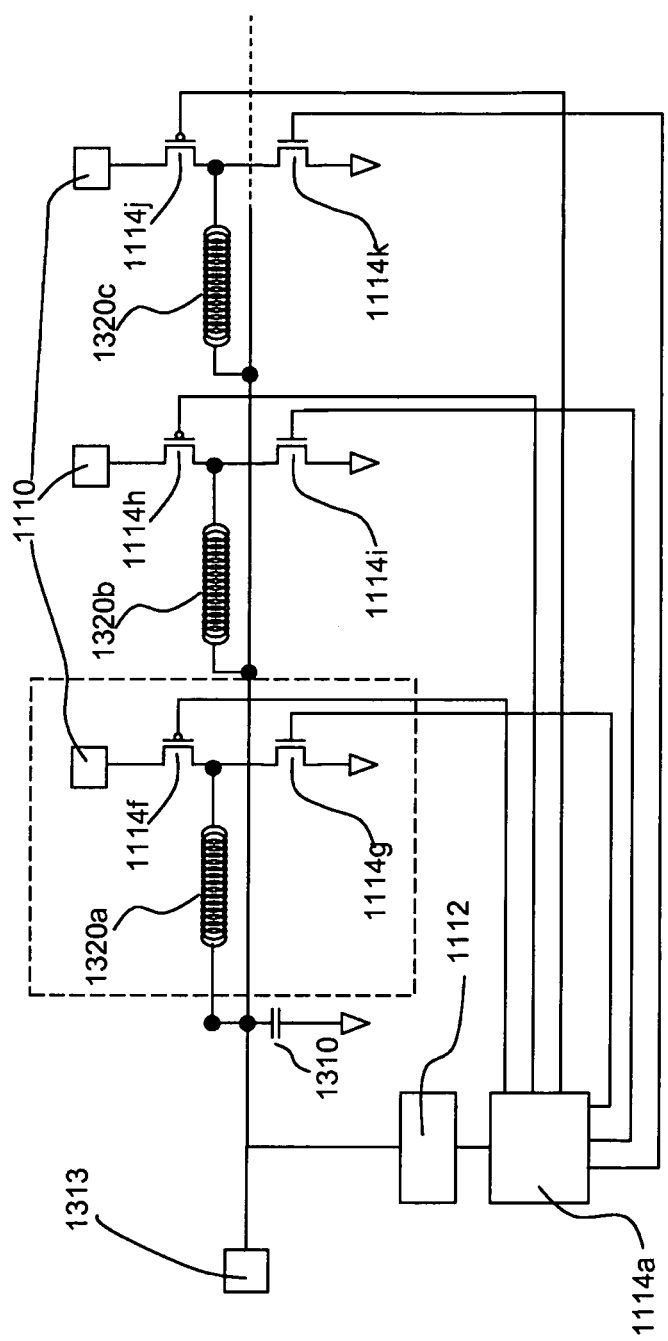
FIG. 19 shows the equivalent circuit of the semiconductor chip of Embodiment 2 in the present invention.
Figure 20:
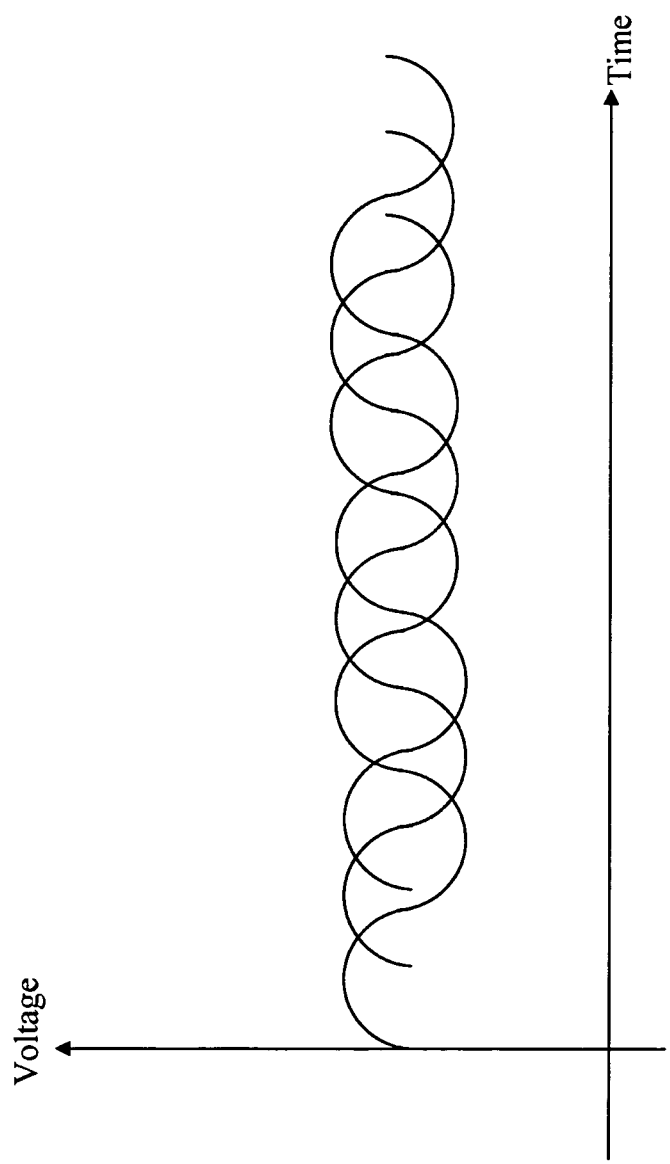
FIG. 20 is a graph showing the relationship between voltage and time of the circuit in FIG. 19.

Also, according to the electrical circuit structure shown in FIG. 18 and the semiconductor chip structure disclosed by the present invention, since the passive components in the present invention are all integrated over semiconductor substrates with active devices, therefore, multiple electronic devices could easily be connected to each other. FIG. 19 shows an equivalent circuit of multiple passive devices and a semiconductor chip connected together, wherein all switch MOS 1114*f*, 1114*h*, 1114*j*, 1114*g*, 1114*i*, 1114*k* and inductor 1320*a*, 1320*b*, and 1320*c* connect to a capacitor 1310, voltage feedback device 1112, and a switch controller 1114*a*. Therefore, when input pad 1110 inputs a power supply, voltage feedback device 1112 takes a voltage signal between inductors 1320*a*, 1320*b*, 1320*c* and capacitor 1310 and sends a voltage feedback signal to switch controller 1114*a*. Switch controller 1114*a* then decides when MOS 1114*f*, 1114*g*, 1114*h*, 1114*i*, 1114*j*, 1114*k* will be switched on or off separately. The switch controller 1114*a* controls the duty cycles and on-off phases of switch MOS 1114*f*, 1114*g*, 1114*h*, 1114*i*, 1114*j*, 1114*k* to fine-tune the voltage level at output 1313. When switch controller 1114*a* controls MOS 1114*f*, 1114*g*, 1114*h*, 1114*i*, 1114*j*, 1114*k*, at least two different on-off phases are generated. As shown in FIG. 20, a result of output of FIG. 19's circuit when each switch MOS set with different switching phase, the voltage ripple of output is minimized by different on-off phases of switching MOS. Therefore, the present invention provides a semiconductor chip with a more stable power voltage.

Embodiment 7

FIG. 21*a* to FIG. 21*l* demonstrate a manufacturing process of a on-chip regulator or converter with inductor and capacitor, wherein the inductor is made by using post-passivation embossing process and the capacitor is attached by using surface mount technology.

Figure 21A:
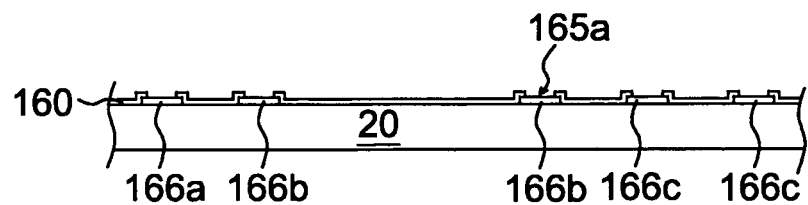

Referring to FIG. 21*a*, integrated circuit 20 represents all structures below passivation layer 160. Also included in integrated circuit 20 is substrate 100, devices 110, 112, 114, first dielectric layer 150, metal layers 140, second dielectric layer 155, metal contact 120, and metal via 130, wherein multiple passivation layer openings 165*a* in passivation layer 160 reveal multiple pads 166*a*, 166*b*, and 166*c*.

Figure 21B:
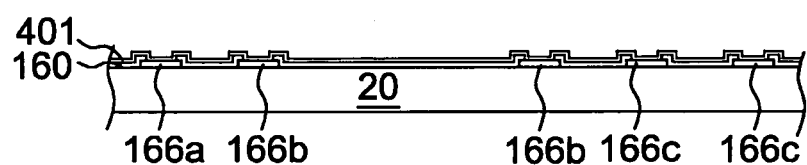

Referring to FIG. 21*b*, an adhesion/barrier layer 401 is formed by sputtering on passivation layer 160 and contact pads 166*a*, 166*b*, and 166*c*. The thickness of said adhesion/barrier layer 401 is between 0.1 micrometers and 1 micrometer, with an optimal thickness between 0.3 micrometers and 0.8 micrometers. The material of adhesion/barrier 401 is preferred to be a TiW or Ti or Ti/TiW.

Figure 21C:
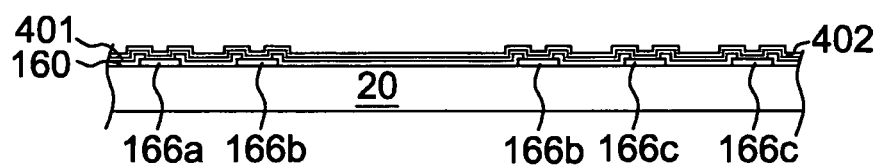

Referring to FIG. 21*c*, a seed layer 402 with a thickness between 0.05 micrometers and 1 micrometers (with an optimal thickness between 0.08 micrometers and 0.7 micrometers) is formed next on adhesion/barrier layer 401 by sputtering. In this embodiment, said seed layer 402 is made of gold preferentially. However, as described above, the material of seed layer 402 varies according to the material of metal layers formed afterwards.

Figure 21D:
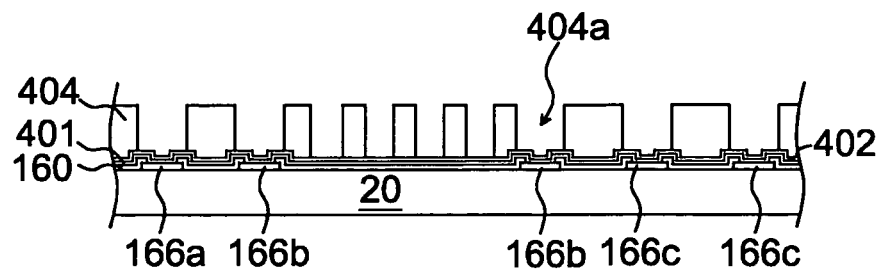

Referring to FIG. 21*d*, photoresist layer 404 is formed on seed layer 402, and through spin coating, exposure and development, photoresist layer 404 is patterned, forming multiple photoresist layer openings 404*a* in photoresist layer 404, which separately reveal portions of seed layer 402 that are over pad 166*a*, 166*b*, and 166*c*.

Figure 21E:
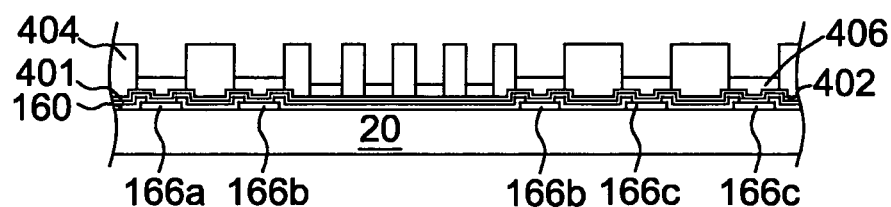

Referring to FIG. 21*e*, bonding metal layer 406 is formed by an electroplating method on seed layer 402, which is in photoresist layer opening 404*a*. The bonding metal layer 406 consists of materials such as gold, copper, silver, palladium, rhodium, ruthenium, rhenium, or nickel, and may have a single metal layer structure or multiple metal layer structure. The thickness of bonding metal layer 406 is between 1 micrometers and 100 micrometers, with optimal thickness between 1.5 micrometers and 15 micrometers. The combinations of the multiple metal layer structure comprise Cu/Ni/Au, Cu/Au, Cu/Ni/Pd, and Cu/Ni/Pt. In this embodiment, bonding metal layer 406 is preferred a single layer made of gold.

Figure 21F:
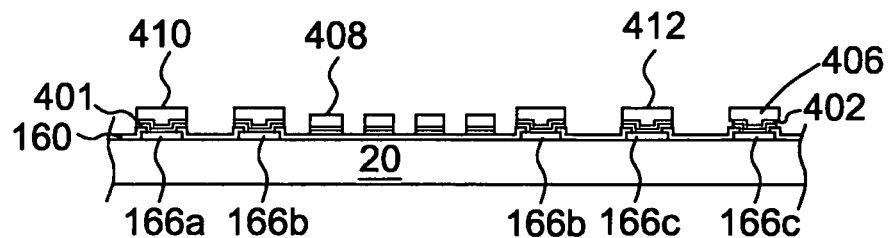

Referring to FIG. 21*f*, remove patterned photoresist layer 404 and portions of seed layer 402 and adhesive/barrier layer 401 that are not below metal layer 406. Portions of seed layer 402 that are made of gold are removed by using solvents containing KI plus $I_2$ solution, while adhesive/barrier layer 401 is removed by using solvents containing hydrogen peroxide ($H_2O_2$) if the material of layer 401 is TiW.

Figure 21G:
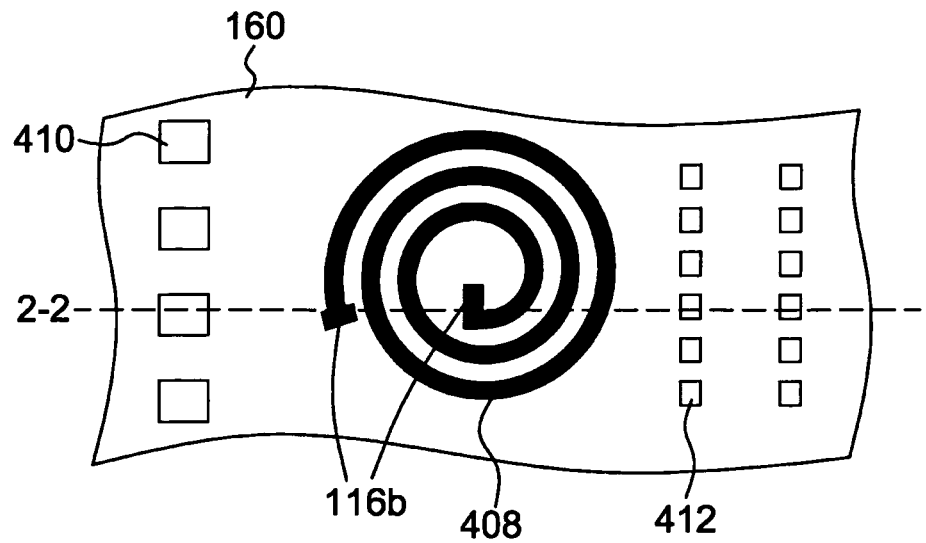
Figure 21H:
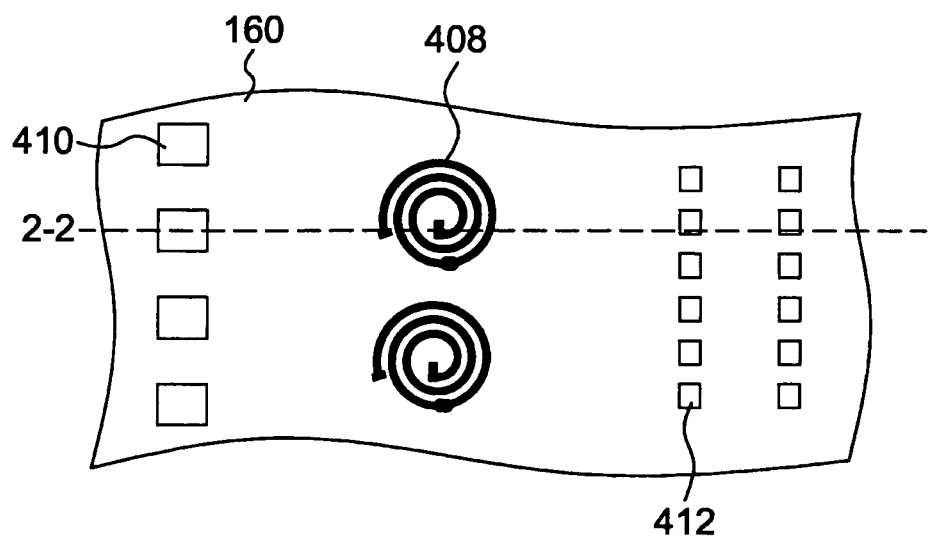

Referring to FIG. 21*g*, after removing patterned photoresist layer 404 and portions of seed layer 402 and adhesive/barrier layer 401 that are not under metal layer 406, said bonding metal layer 406 at least forms one inductor device 408, multiple wire-bonding pads 410, and multiple contact pads 412 on passivation layer 160. Said wire-bonding pads 410 are formed on pad 166*a*, while said contact pads 412 are formed on pad 166*c*, and said inductor device 408 is formed on passivation layer 160 and pads 166*b*. FIG. 21*f* is a signified cross section view of FIG. 21*g* across horizontal line 2-2. Multiple inductor devise 408 can also be formed on or over passivation layer 160, as shown in FIG. 21*h*, but in this embodiment, only one inductor device 408 is demonstrated mainly.

Figure 21I:
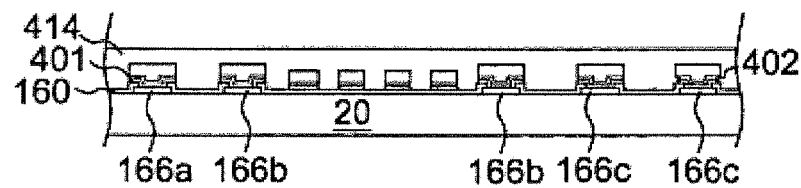

Referring to FIG. 21*i*, a polymer layer 414 is formed on multiple wire-bonding pads 410, multiple contact pads 412, and passivation layer 160.

Figure 21J:
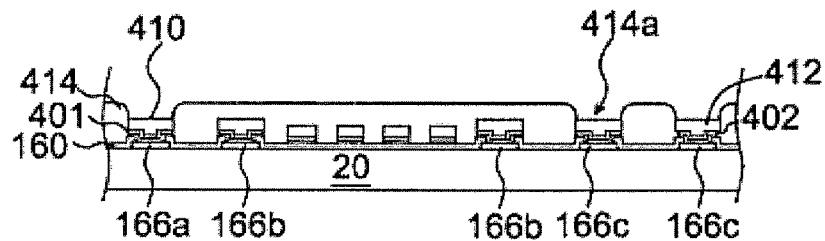

Referring to FIG. 21*j*, through spin coating, exposure and development, etching and O2 plasma ash, polymer layer 414 is formed and patterned with multiple openings 414a that reveal multiple wire-bonding pads 410, multiple contact pads, 412, and cover inductor device 408. Polymer layer 414 is then cured under a temperature between 150 and 380 degrees Celcius. The material of polymer layer 414 can be chosen from polyimide (PI), benzocyclobutene (BCB), parylene, epoxy-based material, such as epoxy resins or photoepoxy SU-8 provided by Sotec Microsystems of Swiss Renens, or elastomers, such as silicone. If polymer layer 414 is made of polyimide, it is preferred ester-type polyimide. The polymer layer 414 is preferred to be photosensitive, then lithography can be used to pattern said polymer layer 414. Polymer layer 414 has a thickness between 5 micrometers and 50 micrometers, with an optimal thickness between 10 micrometers and 20 micrometers.

Figure 21K:
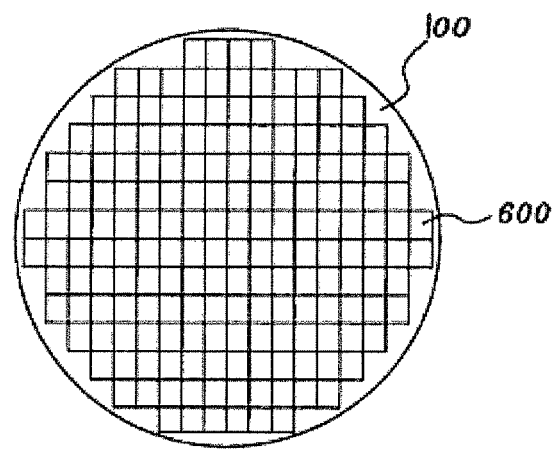
Figure 211:
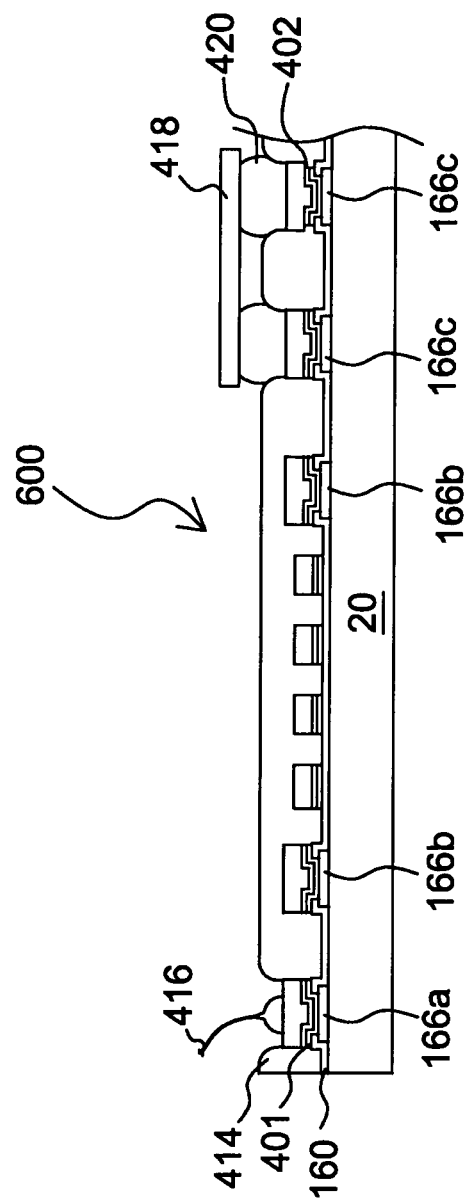

Referring to FIG. 21k and FIG. 21l, dicing procedures are used to cut substrate 100, passivation layer 160, and polymer layer 414 into multiple semiconductor chips 600. Said multiple wire-bonding pads 410 on semiconductor chips 600 can be connected to external circuits or power sources through a wire 416 formed by a wire-bonding process. Contact pad 412 can then be connected to a capacitor device 418 with a solder layer 420, through surface mount technique (SMT), wherein said capacitor device 418 is connected to inductor device 408 through metal layers 140 in integrated circuit 20. Of course the dicing procedures can be performed after capacitor mounting.

Manufacturing Method and Structure 1 of Embodiment 8:

FIG. 22a to FIG. 22m demonstrate a manufacturing process of another on-chip regulator or converter with inductor and capacitor, wherein the inductor is made by using post-passivation embossing process and the capacitor is attached by using surface mount technology.

Figure 22A:
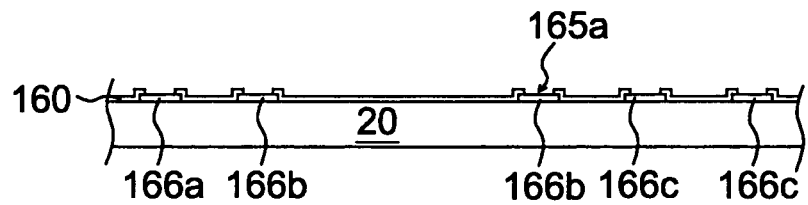
FIGS. 22a to 22q shows the manufacturing of the structure of Embodiment 8.

Referring to FIG. 22a, integrated circuit 20 represents all structures below passivation layer 160. Also included in integrated circuit 20 is substrate 100, devices 110, 112, 114, first dielectric layer 150, metal layers 140, second dielectric layer 155, metal contact 120, and via 130, wherein multiple passivation layer openings 165a in passivation layer 160 reveal multiple pads 166a, 166b, and 166c.

Figure 22B:
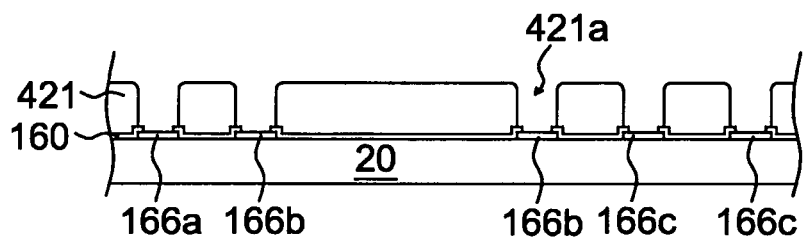

Referring to FIG. 22b, a polymer layer 421 is formed on passivation layer 160 and pads 166a, 166b, and 166c. Through spin coating, exposure and development, etching and O2 plasma ash, polymer layer 421 is formed and patterned with multiple openings 421a that reveal multiple pads 166a, 166b, and 166c. Polymer layer 421 is then cured under a temperature between 150 and 380 degrees Celcius. The material of polymer layer 421 can be chosen from polyimide (PI), benzocyclobutene (BCB), parylene, epoxy-based material, such as epoxy resins or photoepoxy SU-8 provided by Sotec Microsystems of Swiss Renens, or elastomers, such as silicone. If polymer layer 421 is made of polyimide, it is preferred ester-type polyimide. The polymer layer 421 is preferred to be photosensitive, then lithography can be used to pattern said polymer layer 421. Polymer layer 421 has a thickness between 5 micrometers and 50 micrometers, with an optimal thickness between 10 micrometers and 25 micrometers.

Figure 22C:
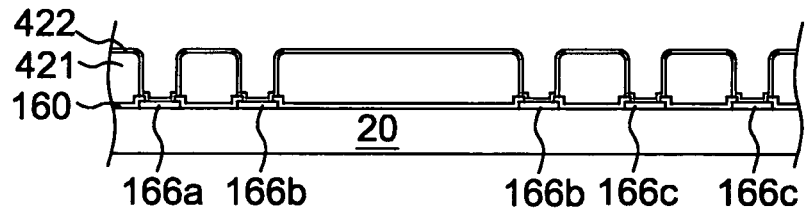

Referring to FIG. 22c, an adhesion/barrier layer 422 is formed by sputtering on polymer layer 421 and pads 166a, 166b, and 166c. Said adhesion/barrier layer 422 has a thickness between 0.1 micrometers and 1 micrometer, with an optimal thickness between 0.3 micrometers and 0.8 micrometers. The material of adhesion/barrier 401 is preferred to be a TiW or Ti or Ti/TiW.

Figure 22D:
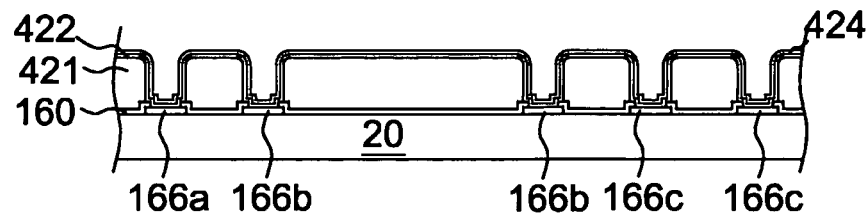

Referring to FIG. 22d, a seed layer 424 with a thickness between 0.05 micrometers and 1 micrometers (with an optimal thickness between 0.08 micrometers and 0.7 micrometers) is formed next on adhesion/barrier layer 422 by sputtering. In this embodiment, said seed layer 424 is made of gold preferentially. However, as described above, the material of seed layer 424 varies according to the material of metal layers formed afterwards.

Figure 22E:
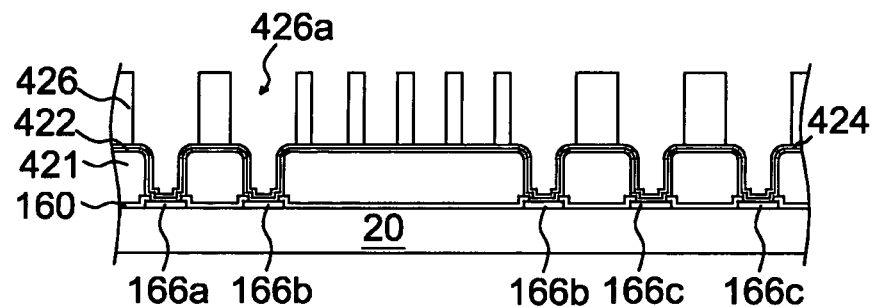

Referring to FIG. 22e, photoresist layer 426 is formed on seed layer 424, and through spin coating, exposure and development, photoresist layer 426 is patterned, forming multiple photoresist layer openings 426a in photoresist layer 426, which separately reveal portions of seed layer 426 that are over pad 166a, 166b, and 166c.

Figure 22F:
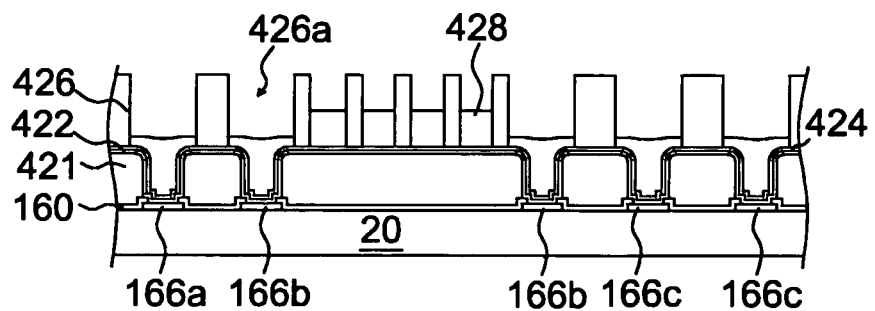

Referring to FIG. 22f, bonding metal layer 428 is formed by an electroplating method on seed layer 424, which is in photoresist layer opening 426a. The bonding metal layer 428 consists of materials such as gold, copper, silver, palladium, rhodium, ruthenium, rhenium, or nickel, and may have a single metal layer structure or multiple metal layer structure. The thickness of bonding metal layer 428 is between 1 micrometer and 100 micrometers, with optimal thickness between 1.5 micrometers and 15 micrometers. Layer 428 may be combinations of multiple metal layer structure comprising Cu/Ni/Au, Cu/Au, Cu/Ni/Pd, and Cu/Ni/Pt. In this embodiment, bonding metal layer 428 is a single layer made of gold preferentially.

Figure 22G:
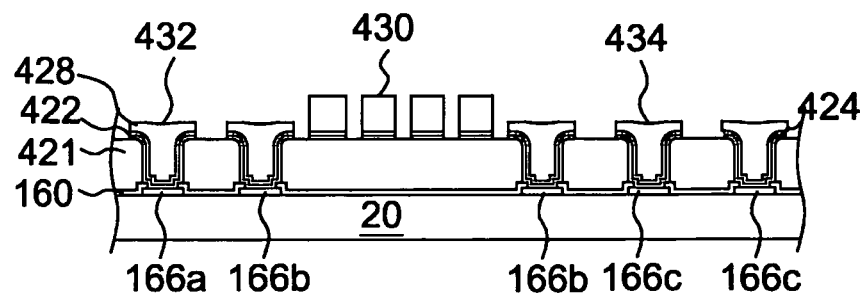

Referring to FIG. 22g, remove patterned photoresist layer 426 and portions of seed layer 424 and adhesive/barrier layer 422 that are not below metal layer 428. Seed layer 424 that are made of gold are removed by using solvents containing KI plus $I_2$ solution, while adhesive/barrier layer 422 is removed by using solvents containing hydrogen peroxide ($H_2O_2$) if the material of layer 422 is TiW.

Figure 22H:
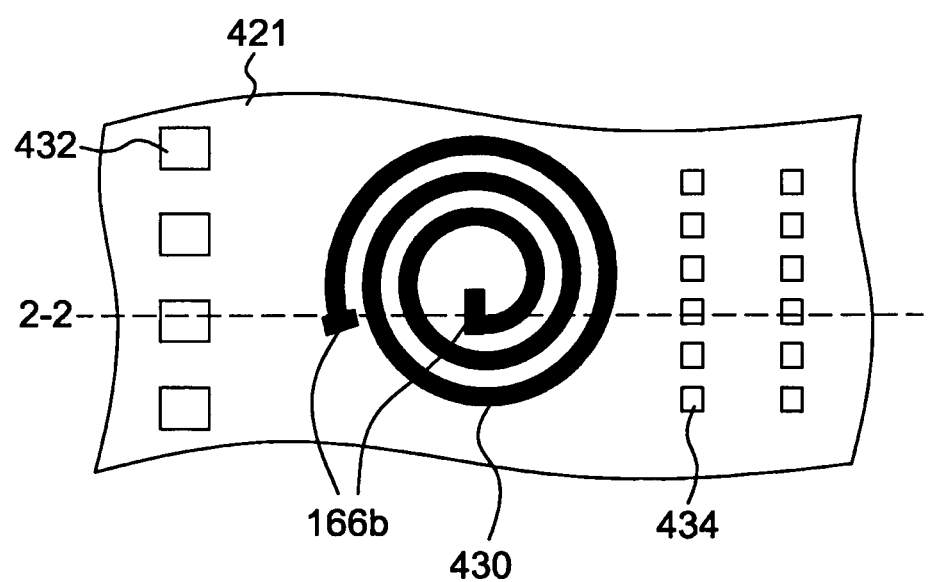
Figure 22I:
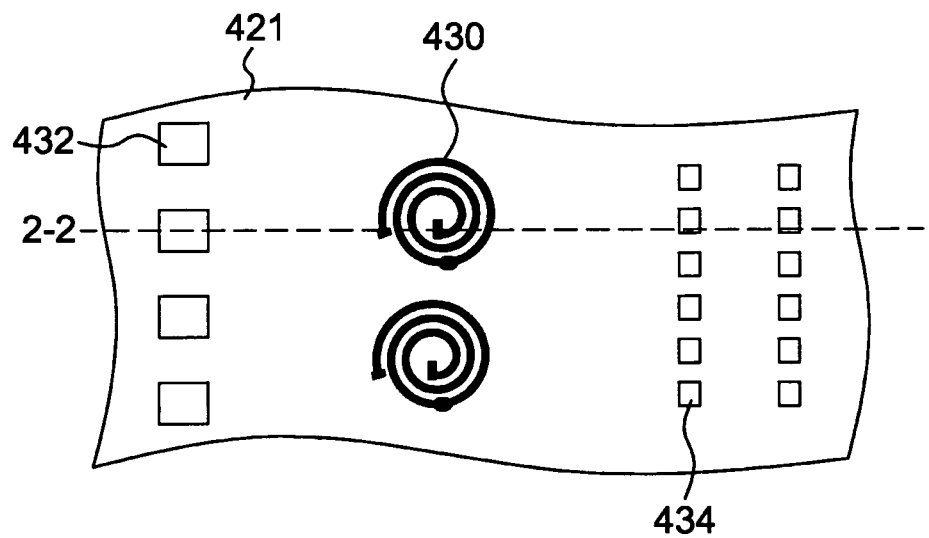

Referring to FIG. 22h, after removing patterned photoresist layer 426 and portions of seed layer 424 and adhesive/barrier layer 422 that are not under metal layer 428, said bonding metal layer 428 at least forms one inductor device 430, multiple wire-bonding pads 432, and multiple contact pads 434 on polymer layer 421. Said wire-bonding pads 432 are formed on pad 166a, while said contact pads 434 are formed on pad 166c, and said inductor device 430 is formed on or over passivation layer 160 and pads 166b. FIG. 21f is a signified cross section view of FIG. 21g cut across horizontal line 2-2. Multiple inductor devices 430 can also be formed on polymer 421, as shown in FIG. 22i, but in this embodiment, only one inductor device 408 is demonstrated mainly.

Figure 22J:
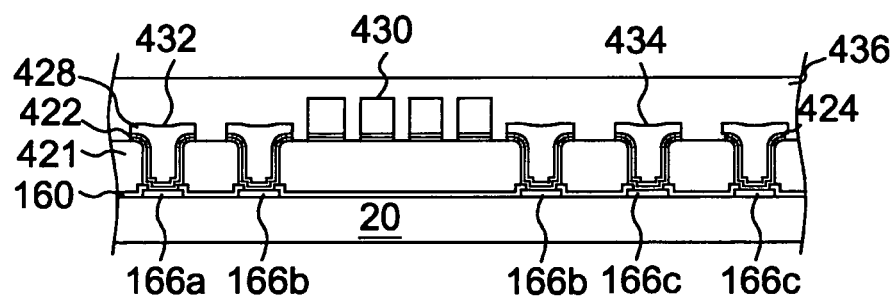

Referring to FIG. 22j, a polymer layer 436 is formed by using spin coating on inductor device 430, multiple wire-bonding pads 432, multiple contact pads 434, and polymer layer 421.

Figure 22K:
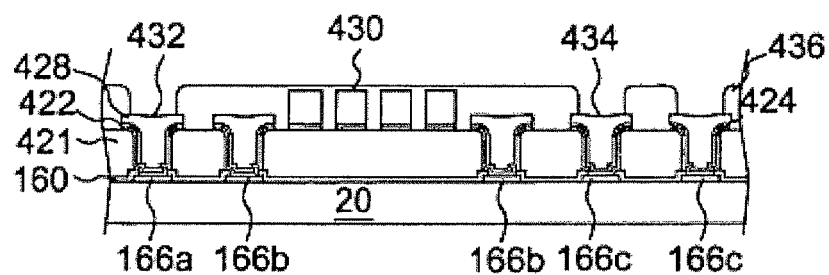

Referring to FIG. 22k, through exposure and development, etching, and O2 plasma ash polymer layer 436 form multiple openings 436a that reveal multiple wire-bonding pads 432, multiple contact pads 434, and conceal inductor device 430. Polymer layer 436 is then cured under a temperature between 150 and 380 degrees Celcius. The material of polymer layer 436 can be chosen from polyimide (PI), benzocyclobutene (BCB), parylene, or ester type polymers, such as epoxy resins or photoepoxy SU-8 provided by Sotec Microsystems of Swiss Renens, or elastomers, such as silicone. If polymer layer 436 is made of polyimide, it is preferred ester-type polyimide. The polymer layer 436 is photosensitive preferentially, then lithography can be used to pattern said polymer layer 436. Polymer layer 436 has a thickness between 5 micrometers and 50 micrometers, with an optimal thickness between 10 micrometers and 20 micrometers.

Figure 22L:
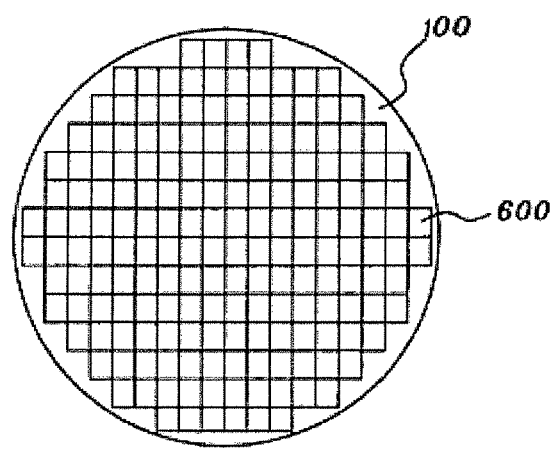
Figure 22M:
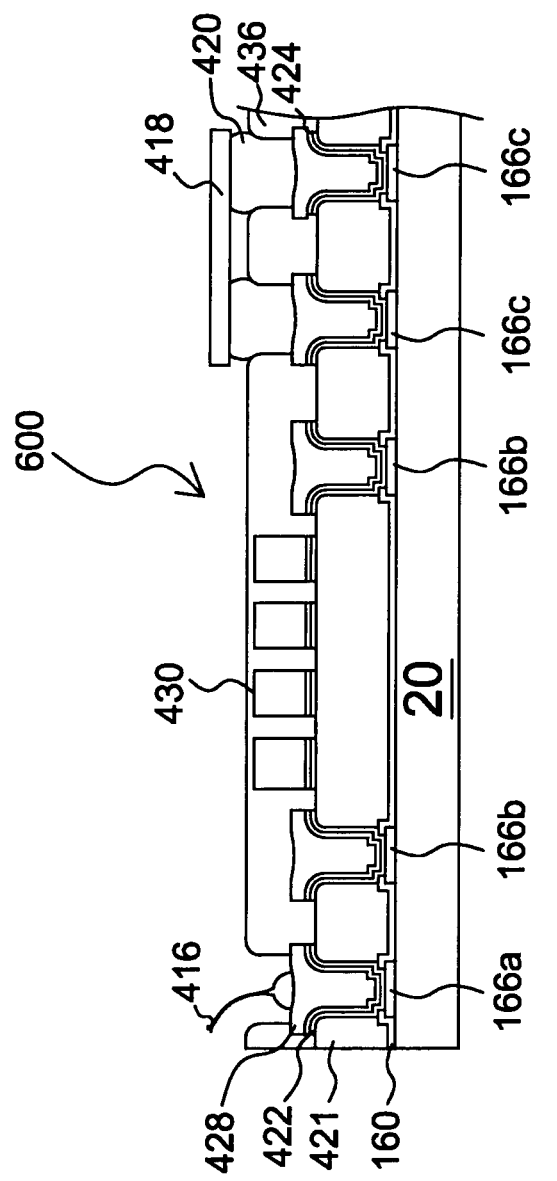

Referring to FIG. 22l and FIG. 22m, dicing procedures are used to cut substrate 100, passivation layer 160, polymer layer 421, and polymer layer 436 into multiple semiconductor chips 600. Said multiple wire-bonding pads 432 on semiconductor chips 600 can be connected to external circuits or power sources through a wire 416 formed by a wire-bonding process. Contact pad 434 can then be connected to a capacitor device 418 with a solder layer 420, through surface mount technique (SMT), wherein said capacitor device 418 is connected to inductor device 430 through metal layers 140 in integrated circuit 20. Of course the dicing procedures may be performed after capacitor mounting.

Figure 22N:
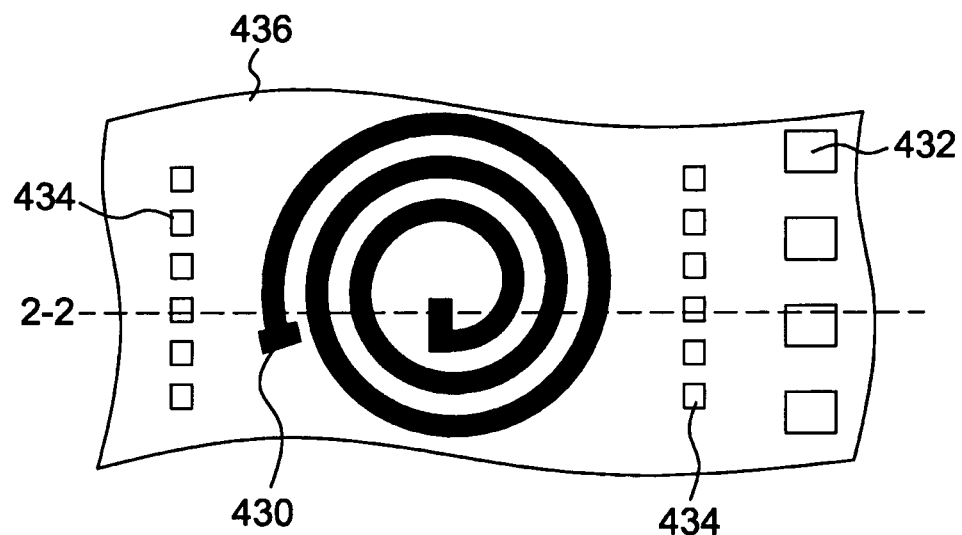
Figure 22O:
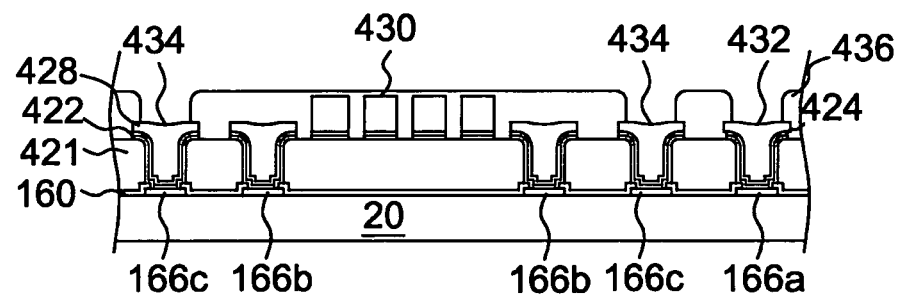

Manufacturing method and structure 2 of Embodiment 8:

Continuing from FIG. 22k and referring to also FIG. 22n and FIG. 22o, the inductor 430 and the pads 166b are between the contact pads 434 and the pads 166c.

Figure 22P:
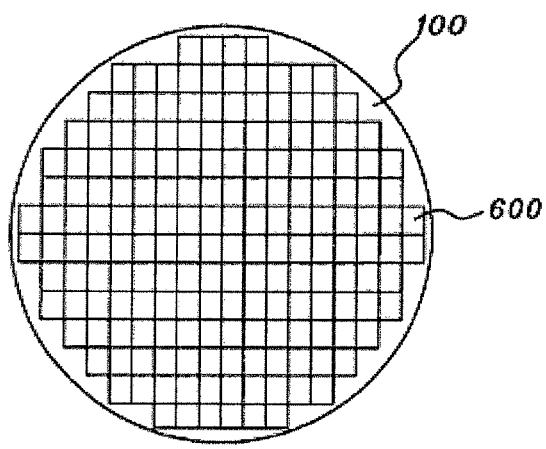
Figure 22Q:
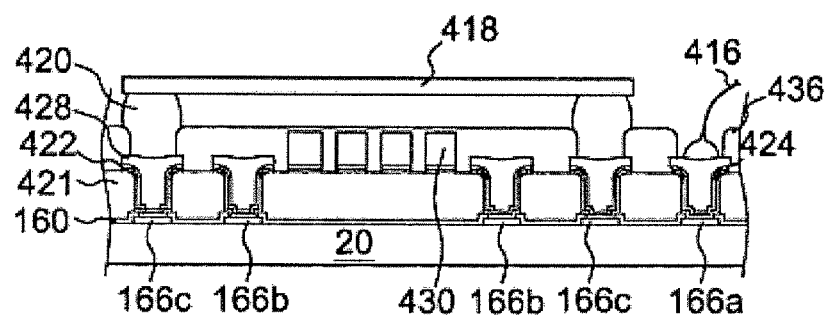

Referring to FIG. 22p and FIG. 22q, dicing procedures are used to cut substrate 100, passivation layer 160, polymer layer 421, and polymer layer 436 into multiple semiconductor chips 600. Said multiple wire-bonding pads 432 on semiconductor chips 600 can be connected to external circuits or power sources through a wire 416 formed by a wire-bonding process. Contact pad 434 can then be connected to a capacitor device 418 with a solder layer 420, through surface mount technique (SMT), wherein said capacitor device 418 is connected to inductor device 430 through metal layer 428 or metal layers 140 in integrated circuit 20. Of course the dicing procedures may be performed after capacitor mounting.

Embodiment 9

Figure 23A:
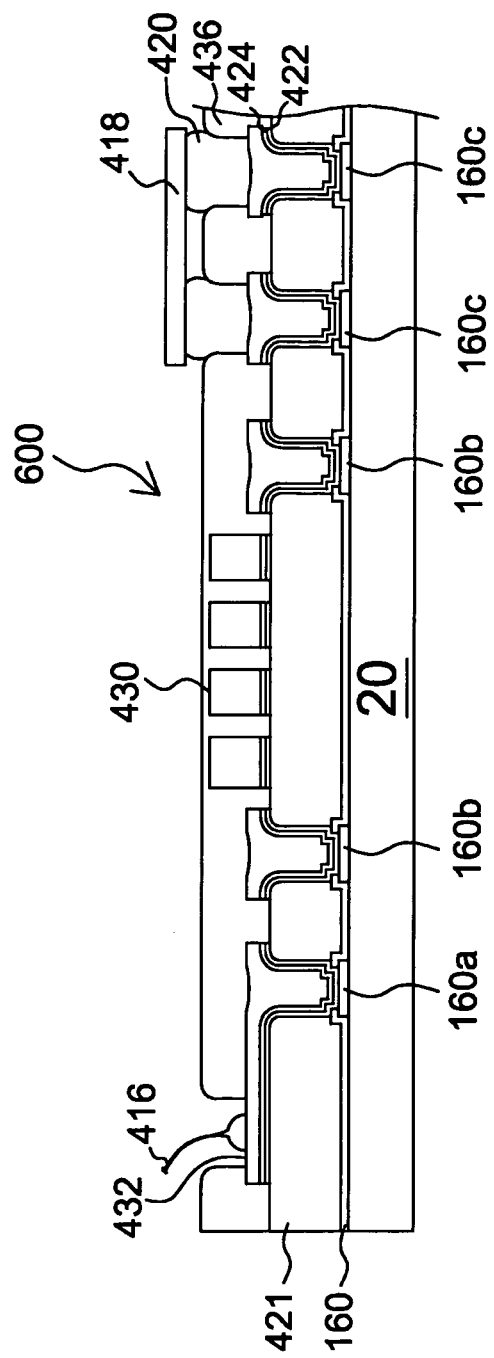
FIG. 23a to 23b shows the manufacturing of the structure of Embodiment 9 as seen from above.
Figure 23B:
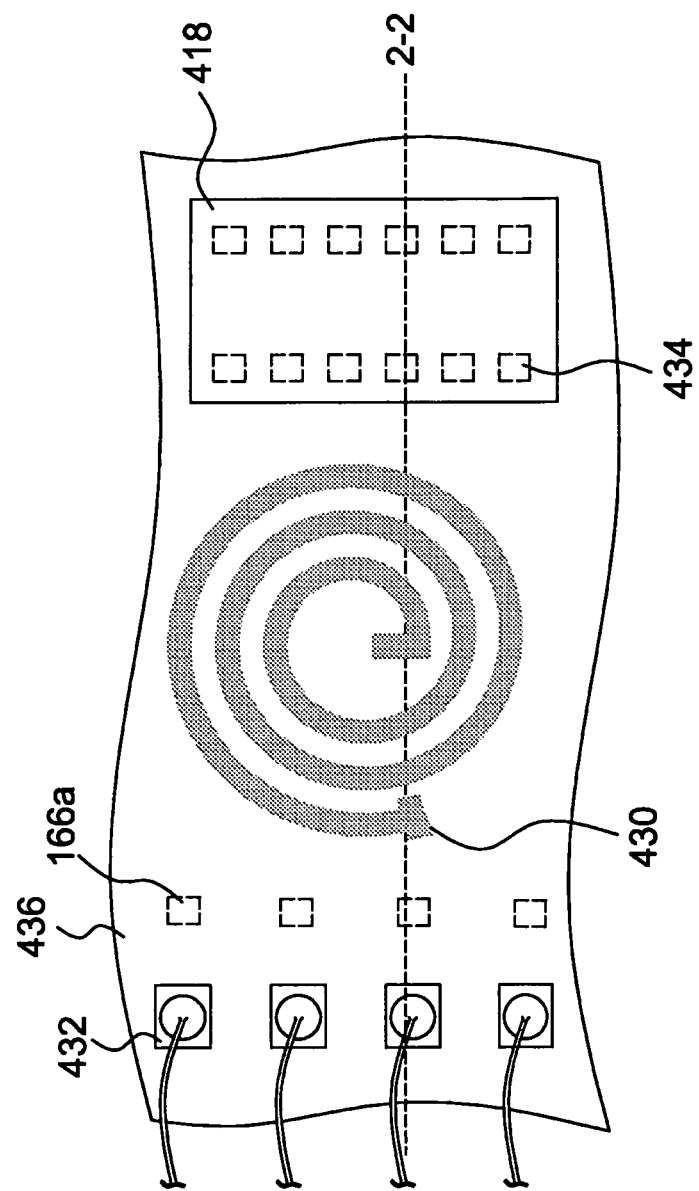

Referring to FIG. 23a and FIG. 23b, this embodiment is similar to Embodiment 8, with the only difference being the location of wire-bonding pad 432 and pad 166a. In Embodiment 8, wire-bonding bad 432 is directly above pad 166a, but in this embodiment, wire-bonding pad 432 is not directly above pad 166a. Therefore, the location of wire-bonding pad 432 can be adjusted according to requirement and not limited to the area directly above pad 166a.

Embodiment 10

Figure 24A:
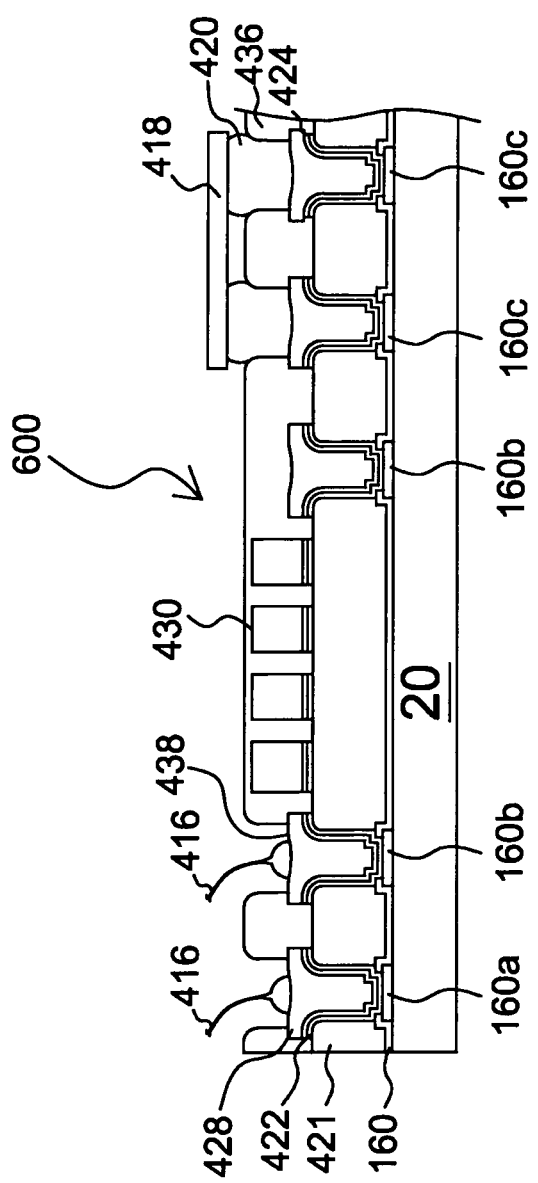
FIG. 24a to 24b shows the structure of Embodiment 10.
Figure 24B:
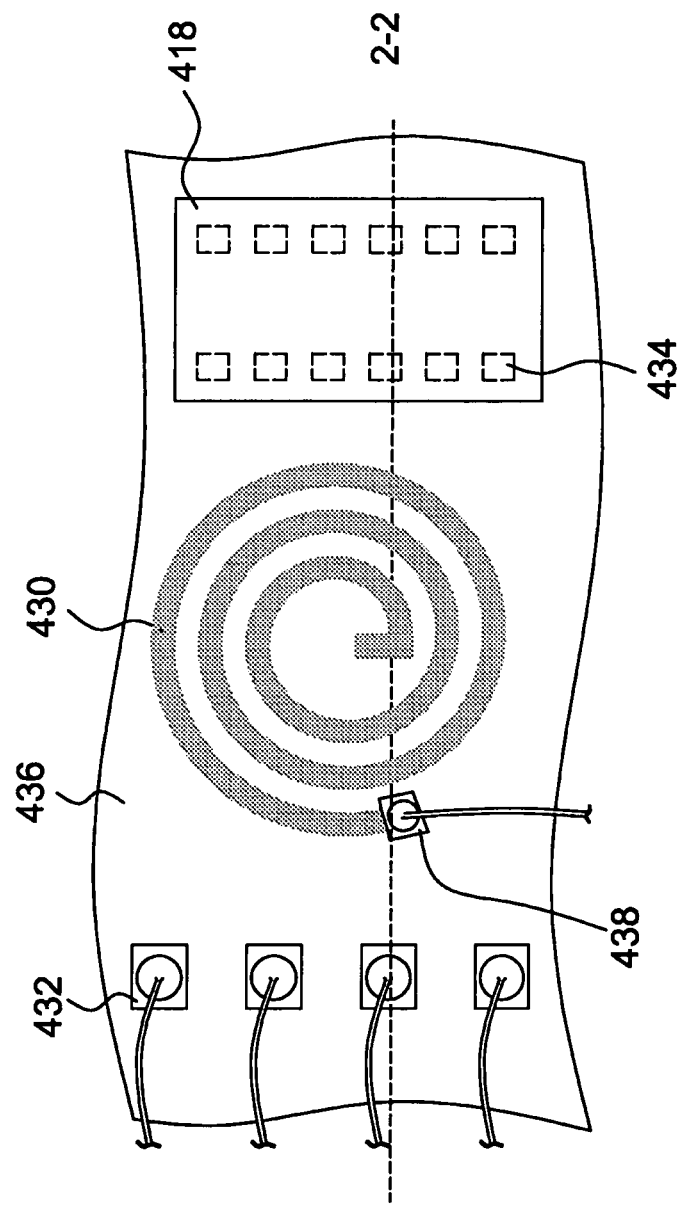

Referring to FIG. 24a and FIG. 24b, this embodiment is similar to Embodiment 8, with the difference being a connecting point 438 of inductor devices revealed by multiple openings 436a in polymer layer 436. Connecting point 438 can be connected to external circuits or power sources using a wire 416 made by a wire-bonding process.

Embodiment 11

Figure 25A:
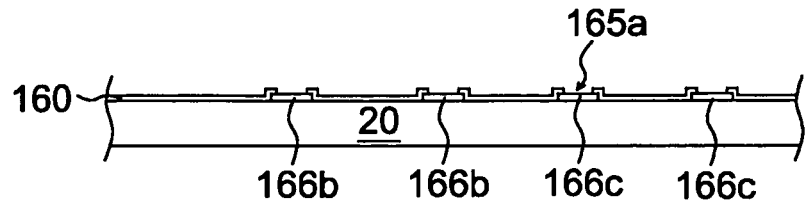

Referring to FIG. 25a, integrated circuit 20 represents all structures below passivation layer 160. Also included in integrated circuit 20 is substrate 100, devices 110, 112, 114, first dielectric layer 150, metal layers 140, second dielectric layer 155, metal contact 120, and metal via 130, wherein multiple passivation layer openings 165a in passivation layer 160 reveal multiple pads 166a, 166b, and 166c (Pad 166a is not labeled in FIG. 25a, but is in FIG. 25b).

Figure 25B:
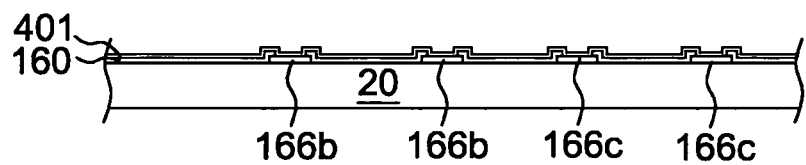

Referring to FIG. 25b, an adhesion/barrier layer 401 is formed by sputtering on passivation layer 160 and contact pads 166a, 166b, and 166c. The thickness of said adhesion/barrier layer 401 is between 0.1 micrometers and 1 micrometer, with an optimal thickness between 0.3 micrometers and 0.8 micrometers. The material of adhesion/barrier 401 is preferred to be a TiW or Ti or Ti/TiW.

Figure 25C:
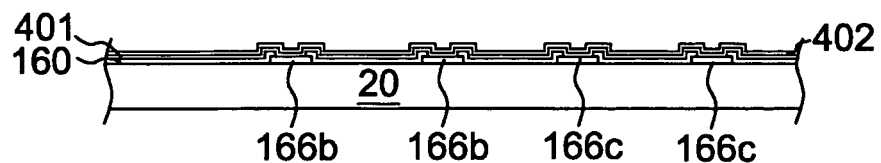

Referring to FIG. 25c, a seed layer 402 with a thickness between 0.05 micrometers and 1 micrometers (with an optimal thickness between 0.08 micrometers and 0.7 micrometers) is formed next on adhesion/barrier layer 401 by sputtering. In this embodiment, said seed layer 402 is made of gold preferentially. However, as described above, the material of seed layer 402 varies according to the material of metal layers formed afterwards.

Figure 25D:
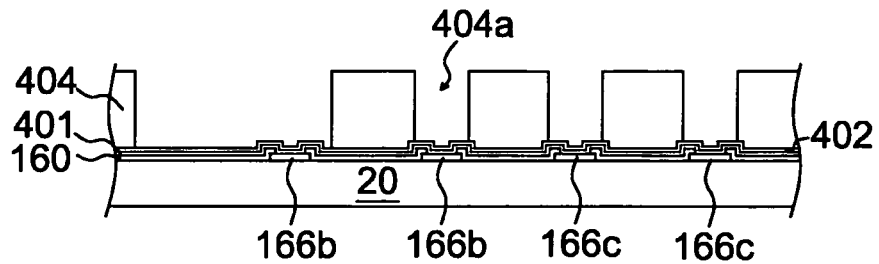

Referring to FIG. 25d, photoresist layer 404 is formed on seed layer 402, through spin coating, exposure and development, photoresist layer 404 is patterned, forming multiple photoresist layer openings 404a in photoresist layer 404, which separately reveal portions of seed layer 402 that are over pad 166a, 166b, and 166c.

Figure 25E:
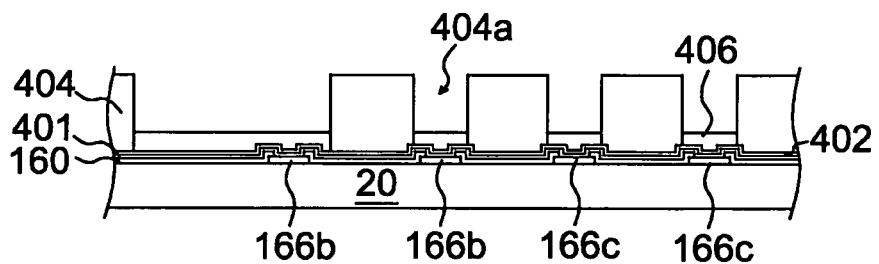

Referring to FIG. 25e, bonding metal layer 406 is formed by an electroplating method on seed layer 402, which is in photoresist layer opening 404a. The bonding metal layer 406 consists of materials such as gold, copper, silver, palladium, rhodium, ruthenium, rhenium, or nickel, and may have a single metal layer structure or multiple metal layer structure. The thickness of bonding metal layer 406 is between 1 micrometer and 100 micrometers, with optimal thickness between 1.5 micrometers and 15 micrometers. Layer 406 may be combinations of multiple metal layer structure comprising Cu/Ni/Au, Cu/Au, Cu/Ni/Pd, and Cu/Ni/Pt. In this embodiment, bonding metal layer 406 is preferred to be a single layer made of gold.

Figure 25F:
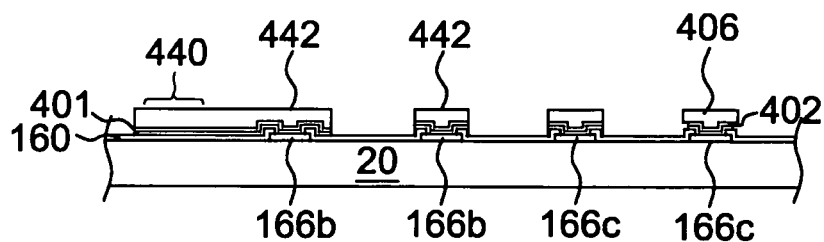

Referring to FIG. 25f, remove patterned photoresist layer 404 and portions of seed layer 402 and adhesive/barrier layer 401 that are not below metal layer 406. Seed layer 402 that are made of gold are removed by using solvents containing $I_2$, while adhesive/barrier layer 401 is removed by using solvents containing hydrogen peroxide ($H_2O_2$) if the material of layer 401 is TiW. After removing patterned photoresist layer 404 and portions of seed layer 402 and adhesion/barrier layer 401 that is not under bonding metal layer 406, said bonding metal layer 406 includes multiple wire-bonding pads 440 and multiple contact pads 442, wherein a wire-bonding pad 440 and a contact pad 442 are connected through bonding metal layer 406.

Figure 25G:
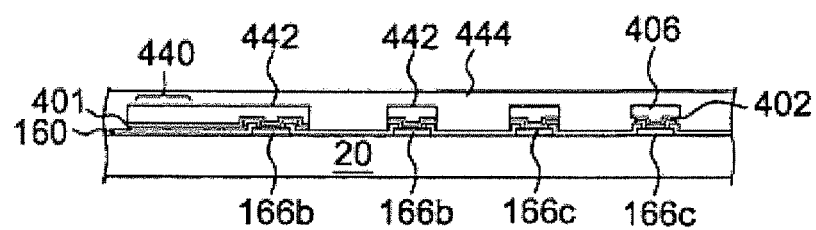

Referring to FIG. 25g, a polymer layer 414 is formed by using spin coating on multiple wire-bonding pads 440, multiple contact pads 442, and passivation layer 160.

Figure 25H:
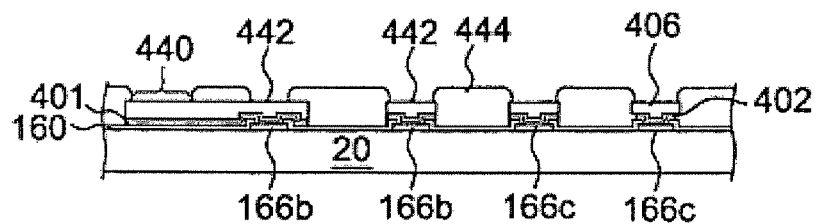

Referring to FIG. 25h, through exposure and development, and O2 plasma ash, polymer layer 444 is patterned with multiple openings 444a that reveal multiple wire-bonding pads 440 and multiple contact pads 442. Polymer layer 444 is then cured under a temperature between 150 and 380 degrees Celcius. The material of polymer layer 444 can be chosen from polyimide (PI), benzocyclobutene (BCB), parylene, epoxy-based material, such as epoxy resins or photoepoxy SU-8 provided by Sotec Microsystems of Swiss Renens, or elastomers, such as silicone. If polymer layer 444 is made of polyimide, it is preferred ester-type polyimide. The polymer layer 444 is photosensitive preferentially, then lithography can be used to pattern said polymer layer 444, and the etching process will be unnecessary. Polymer layer 444 has a thickness between 5 micrometers and 50 micrometers, with an optimal thickness between 10 micrometers and 25 micrometers.

Figure 25I:
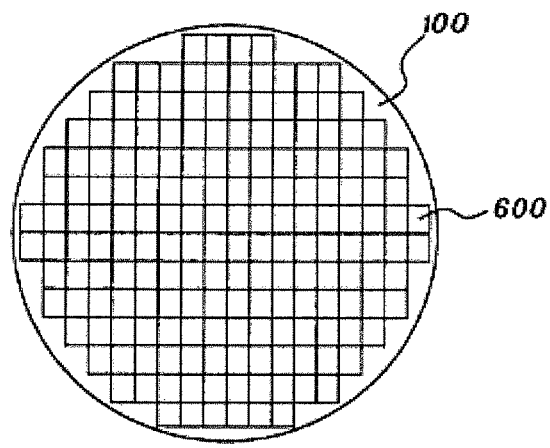
Figure 25J:
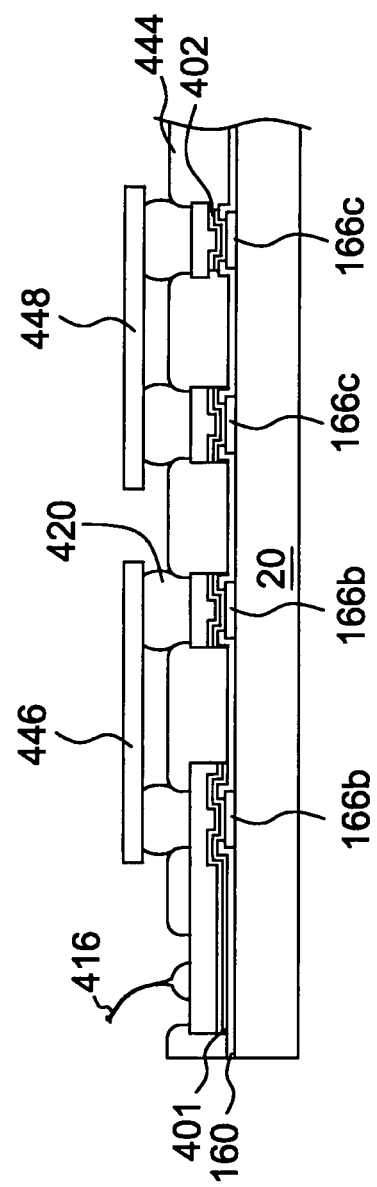

Referring to FIG. 25i and FIG. 25j, dicing procedures are used to cut substrate 100, passivation layer 160, and polymer layer 444 into multiple semiconductor chips 600. Said multiple wire-bonding pads 440 on semiconductor chips 600 can be connected to external circuits or power sources through a wire 416 formed by a wire-bonding process. Contact pad 442 can then be connected to a capacitor device 448 with a solder layer 420, through surface mount technique (SMT), wherein said capacitor device 448 is connected to inductor device 448 through metal layers 140 in integrated circuit 20. FIG. 25j is a cross section view of FIG. 25k from horizontal line 2-2. Of course the dicing procedures may be performed after capacitor mounting.

Figure 26:
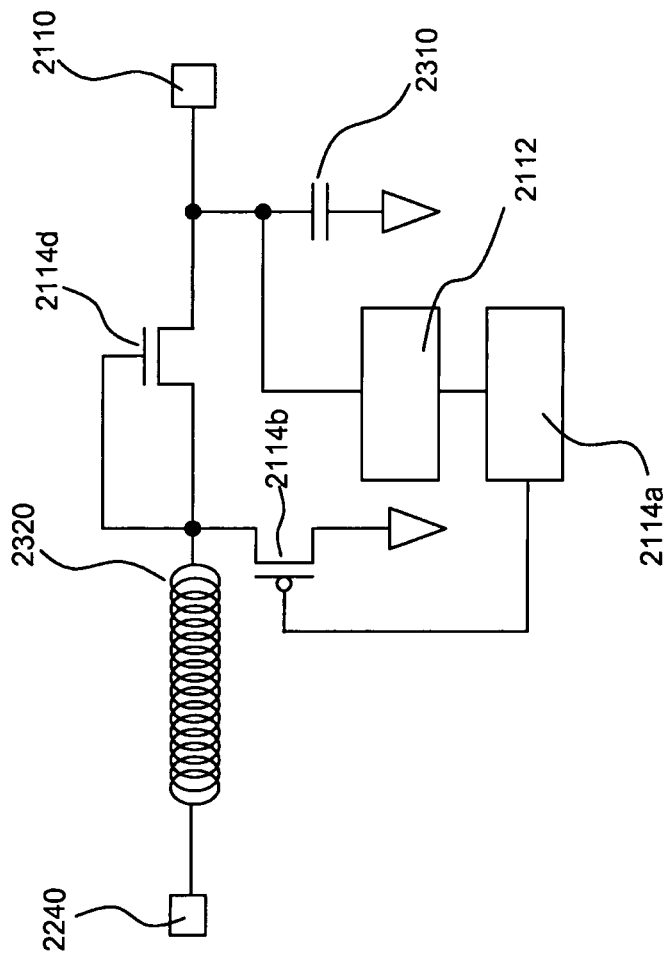
FIGS. 26 and 27 shows the circuit diagram of the present invention used as a voltage amplifying device.
Figure 27:
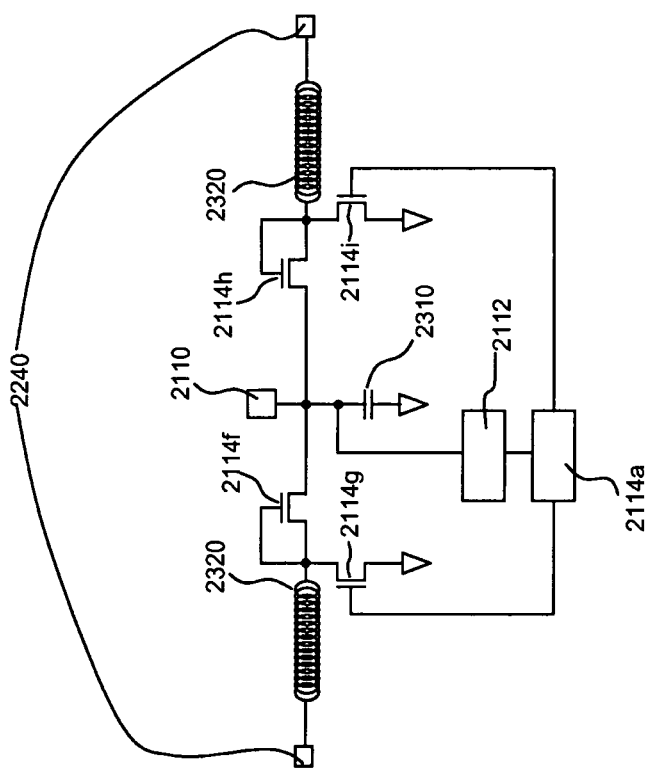

Embodiment 10 and Embodiment 11 can be used in devices that step-up voltage as shown in circuit diagrams of FIG. 26 and FIG. 27. In FIG. 26, power source input 2240 is connected to inductor 2320, inductor 2320 is connected to capacitor 2310 through transistor 2114d, voltage feedback device 2112 is connected to power output 2110, and switch controller 2114a is connected to voltage feedback device 2112 and a switch transistor 2114b. When power enters through power input 2240, switch controller 2114a receives the voltage signal of voltage feedback device 2112 and controls the on and off timing of switch transistor 2114b, pumping up the voltage level of power source output 2110. Inductor 2320 together with capacitor 2310, voltage feedback device 2112, switch transistor 2114b and transistor 2114d form an on-chip voltage regulator or converter with the previous described manufacture processes.

The difference between FIG. 27 and FIG. 26 is that the circuit diagram of FIG. 27 is made of multiple inductors 2320, capacitor 2310, switch transistor 2114g, switch transistor 2114i, transistor 2114h and transistor 2114f. Switch controller 2114a is used to receive the voltage signal of voltage feedback device 2112 and control the duty cycle and phase of switch transistor 2114g, and switch transistor 2114i and therefore pumping up the voltage level of power output 2110. In comparison to the circuit diagram of FIG. 26, the circuit diagram of FIG. 27 can be more accurately and efficiently to regulate the output voltage.

From the description above, it can be known that the present invention discloses a semiconductor chip and its application circuit, wherein in the passive and active devices are integrated with the semiconductor chip, so that the signal path between the two types of devices has minimal distance, therefore enabling fast and effective voltage regulation and also decreasing circuit routing area on the PCB. Most importantly, the reaction time of each device is decreased, increasing the performance of electronic device without increasing cost.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

What is claimed is:

1. A semiconductor chip comprising:
a semiconductor substrate;
multiple active devices in said semiconductor substrate;
a first dielectric layer coupled to said semiconductor substrate;
a conductive structure coupled to said first dielectric layer and said semiconductor substrate, wherein said conductive structure comprises a first conductive layer and a second conductive layer coupled to said first conductive layer, wherein said first conductive layer and said second conductive layer comprise an inductor within the semiconductor chip;
a second dielectric layer between said first and second conductive layers;
a passivation layer coupled to said first and second conductive layers and said first and second dielectric layers, wherein said passivation layer comprises a nitride;
a discrete capacitor coupled to said passivation layer; and
a solder between said discrete capacitor and a contact point of said conductive structure.

2. The semiconductor chip of claim 1, wherein said first conductive layer comprises a copper layer having a thickness between 0.05 and 2 micrometers.

3. The semiconductor chip of claim 1, wherein said nitride has a thickness between 0.3 and 2 micrometers.

4. The semiconductor chip of claim 1, wherein said conductive structure comprises a gold-containing layer coupled to said solder.

5. The semiconductor chip of claim 1, wherein said conductive structure comprises a nickel layer coupled to said solder.

6. The semiconductor chip of claim 1, wherein said conductive structure comprises a copper layer coupled to said solder.

7. The semiconductor chip of claim 1, further comprising a polymer layer coupled to said passivation layer, wherein said inductor and said discrete capacitor are coupled to said polymer layer.

8. The semiconductor chip of claim 1, further comprising a polymer layer coupled to said inductor and said passivation layer, wherein said discrete capacitor is further coupled to said polymer layer.

9. The semiconductor chip of claim 1, wherein said conductive structure has a region configured to be wirebonded thereto.

10. The semiconductor chip of claim 1, wherein said inductor is coupled to said passivation layer.

11. A circuit component comprising:
a semiconductor substrate;
multiple active devices in said semiconductor substrate;
a first dielectric layer coupled to said semiconductor substrate;
a conductive structure coupled to said first dielectric layer, wherein said conductive structure comprises a first conductive layer and a second conductive layer coupled to said first conductive layer, wherein said first conductive layer and said second conductive layer comprise an inductor within said circuit component;
a second dielectric layer between said first and second conductive layers;
a passivation layer coupled to said first and second conductive layers and said first and second dielectric layers, wherein said passivation layer comprises a nitride;
a discrete capacitor coupled to said passivation layer; and
a solder coupled to said discrete capacitor.

12. The circuit component of claim 11, wherein said first conductive layer comprises a copper layer having a thickness between 0.05 and 2 micrometers.

13. The circuit component of claim 11, wherein said nitride has a thickness between 0.3 and 2 micrometers.

14. The circuit component of claim 11, wherein said conductive structure comprises a gold-containing layer coupled to said solder.

15. The circuit component of claim 11, wherein said conductive structure comprises a nickel layer coupled to said solder.

16. The circuit component of claim 11, wherein said conductive structure comprises a copper layer coupled to said solder.

17. The circuit component of claim 11, further comprising a polymer layer coupled to said passivation layer, wherein said inductor and said discrete capacitor are coupled to said polymer layer.

18. The circuit component of claim 11, further comprising a polymer layer coupled to said inductor and said passivation layer, wherein said discrete capacitor is further coupled to said polymer layer.

19. The circuit component of claim 11, wherein said second conductive layer comprises aluminum.

20. The circuit component of claim 11, wherein said inductor is coupled to said passivation layer.

* * * * *